US011991463B2

(12) United States Patent
Asatsuma et al.

(10) Patent No.: US 11,991,463 B2
(45) Date of Patent: May 21, 2024

(54) IMAGING ELEMENT, IMAGING ELEMENT DRIVING METHOD, AND ELECTRONIC DEVICE

(71) Applicant: SONY SEMICONDUCTOR SOLUTIONS CORPORATION, Kanagawa (JP)

(72) Inventors: Tomohiko Asatsuma, Kanagawa (JP); Ryosuke Nakamura, Kanagawa (JP); Satoko Iida, Kanagawa (JP); Koshi Okita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/134,355

(22) Filed: Apr. 13, 2023

(65) Prior Publication Data

US 2023/0254602 A1 Aug. 10, 2023

Related U.S. Application Data

(63) Continuation of application No. 17/782,872, filed as application No. PCT/JP2020/045556 on Dec. 8, 2020.

(30) Foreign Application Priority Data

Dec. 17, 2019 (JP) ................. 2019-227660
Jun. 29, 2020 (JP) ................. 2020-112161

(51) Int. Cl.
*H04N 25/621* (2023.01)
*H01L 27/146* (2006.01)
(Continued)

(52) U.S. Cl.
CPC ......... *H04N 25/621* (2023.01); *H04N 25/702* (2023.01); *H04N 25/77* (2023.01)

(58) Field of Classification Search
CPC .... H04N 25/778; H04N 25/585; H04N 25/59; H04N 25/621; H04N 25/702;
(Continued)

(56) References Cited

U.S. PATENT DOCUMENTS 10,483,307 B2    11/2019   Sekine
11,360,121 B2 *  6/2022    Zhang ............... H01L 27/14689
(Continued)

FOREIGN PATENT DOCUMENTS

CN    108140661 A    6/2018
CN    110137190 A    8/2019
(Continued)

OTHER PUBLICATIONS

International Search Report and Written Opinion for International (PCT) Patent Application No. PCT/JP2020/045556, dated Mar. 9, 2021, 6 pages.
(Continued)

*Primary Examiner* — Marly S Camargo
(74) *Attorney, Agent, or Firm* — Sheridan Ross PC

(57) ABSTRACT

An imaging element according to an embodiment includes: a unit pixel including a first pixel having a first photoelectric conversion element and including a second pixel having a second photoelectric conversion element, the second pixel being arranged adjacent to the first pixel; and an accumulation portion that accumulates a charge generated by the second photoelectric conversion element and converts the accumulated charge into a voltage. The accumulation portion is disposed at a boundary between the unit pixel and another unit pixel adjacent to the unit pixel.

20 Claims, 40 Drawing Sheets

(51) Int. Cl.
*H04N 25/702* (2023.01)
*H04N 25/77* (2023.01)

(58) Field of Classification Search
CPC ............. H04N 25/77; H01L 27/14605; H01L 27/14623; H01L 27/1463; H01L 27/14603
See application file for complete search history.

(56) References Cited

U.S. PATENT DOCUMENTS

| | | | |
|---|---|---|---|
| 11,527,560 B2* | 12/2022 | Tomekawa | |
| 2015/0311245 A1 | 10/2015 | Yamazaki et al. | |
| 2017/0359539 A1 | 12/2017 | Kawabata et al. | |
| 2019/0019820 A1* | 1/2019 | Takizawa | H04N 25/771 |
| 2019/0288018 A1 | 9/2019 | Tomekawa et al. | |
| 2021/0202554 A1* | 7/2021 | Liu | H01L 27/1462 |
| 2023/0018370 A1 | 1/2023 | Asatsuma et al. | |

FOREIGN PATENT DOCUMENTS

| | | |
|---|---|---|
| CN | 110278396 A | 9/2019 |
| JP | 2012-178457 | 9/2012 |
| JP | 2015-216369 | 12/2015 |
| JP | 2017-163010 | 9/2017 |
| JP | 2017-175345 | 9/2017 |
| JP | 2017-191950 | 10/2017 |
| JP | 2017-220877 | 12/2017 |
| JP | 2019-165212 | 9/2019 |
| KR | 20150122589 A | 11/2015 |

OTHER PUBLICATIONS

Official Action for U.S. Appl. No. 17/782,872, dated Apr. 27, 2023, 14 pages.

* cited by examiner

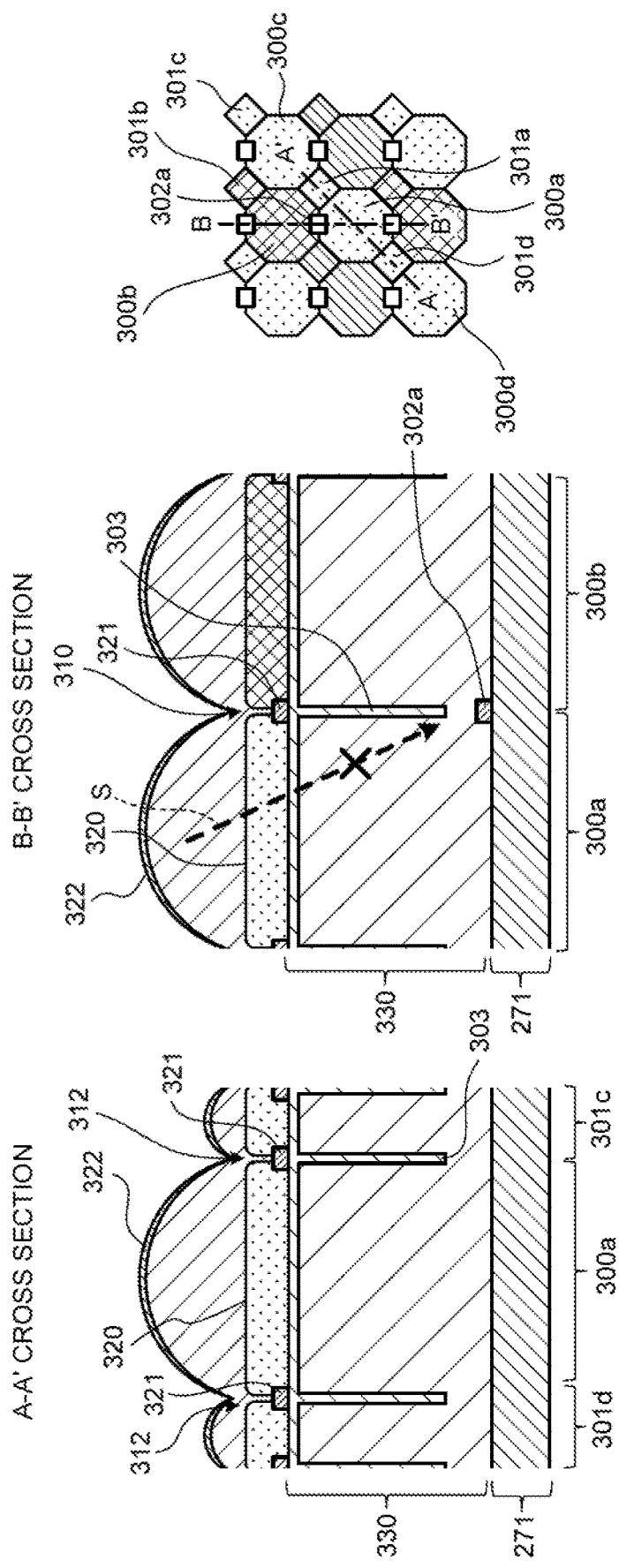

FIG.18B
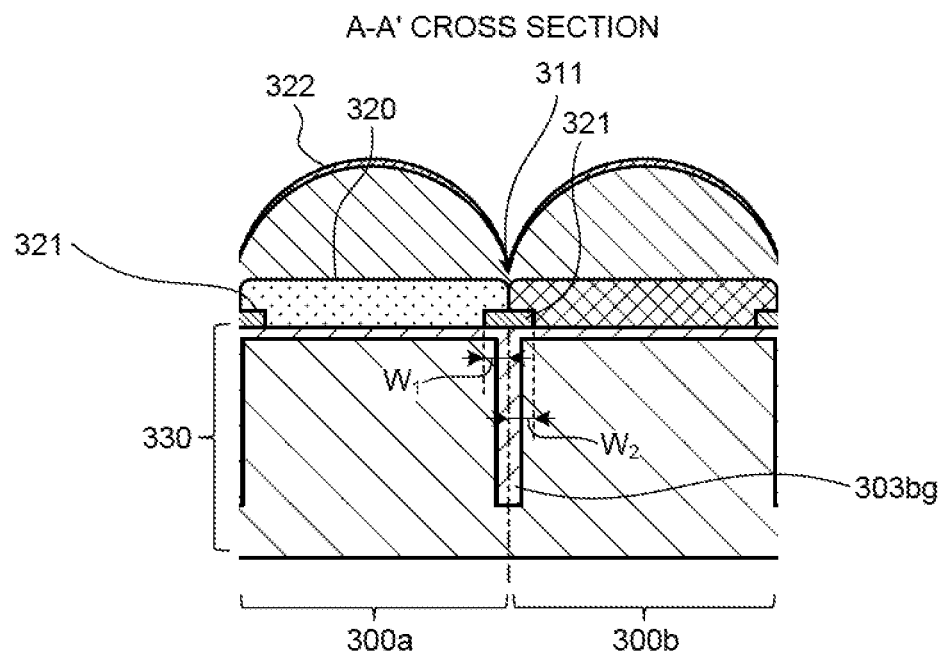
A-A' CROSS SECTION
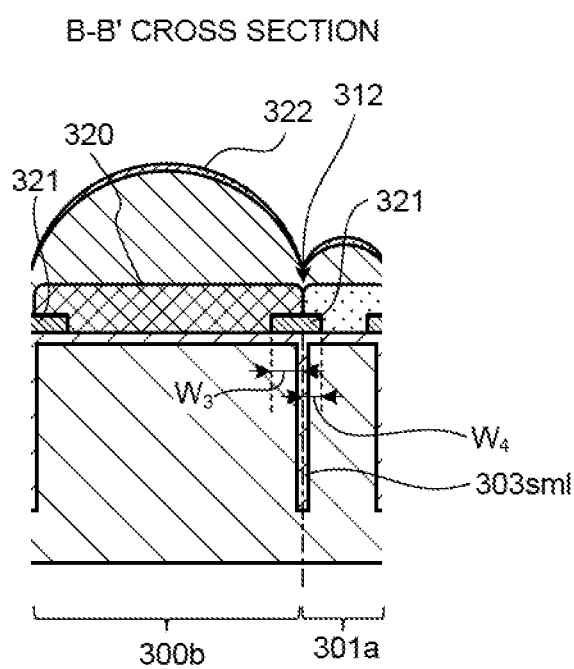
B-B' CROSS SECTION

FIG.19B
A-A' CROSS SECTION
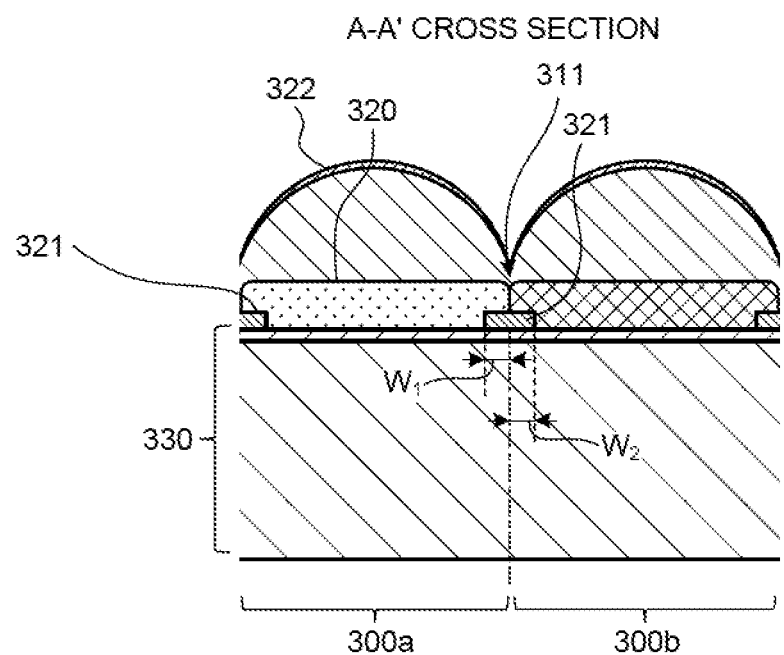
B-B' CROSS SECTION
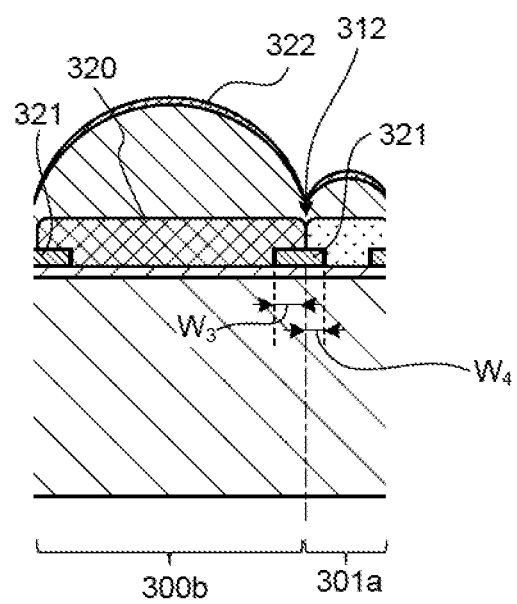

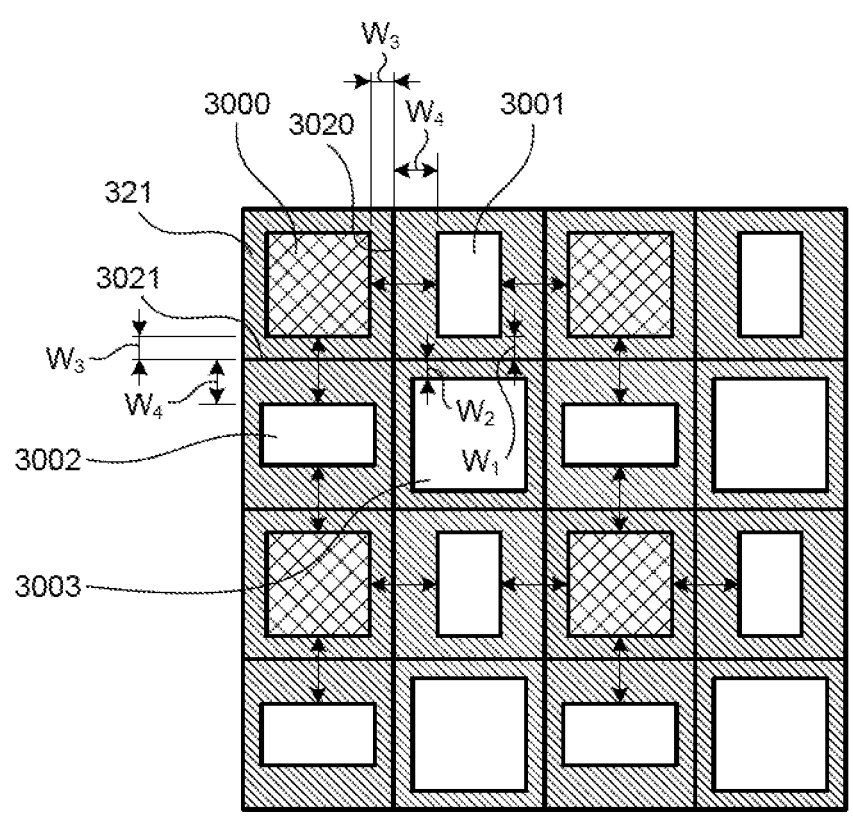

FIG.30
(a)
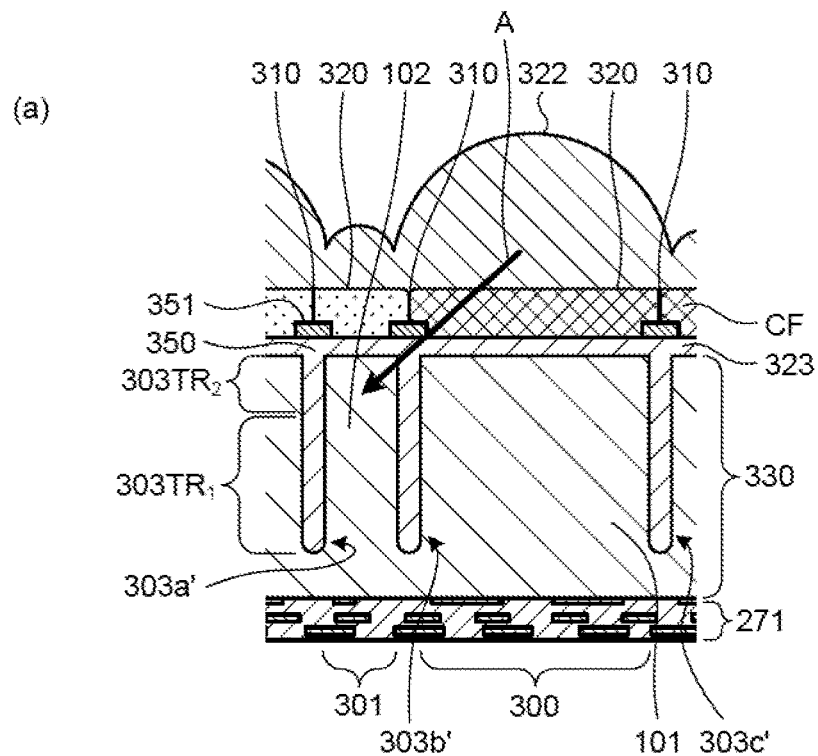
(b)
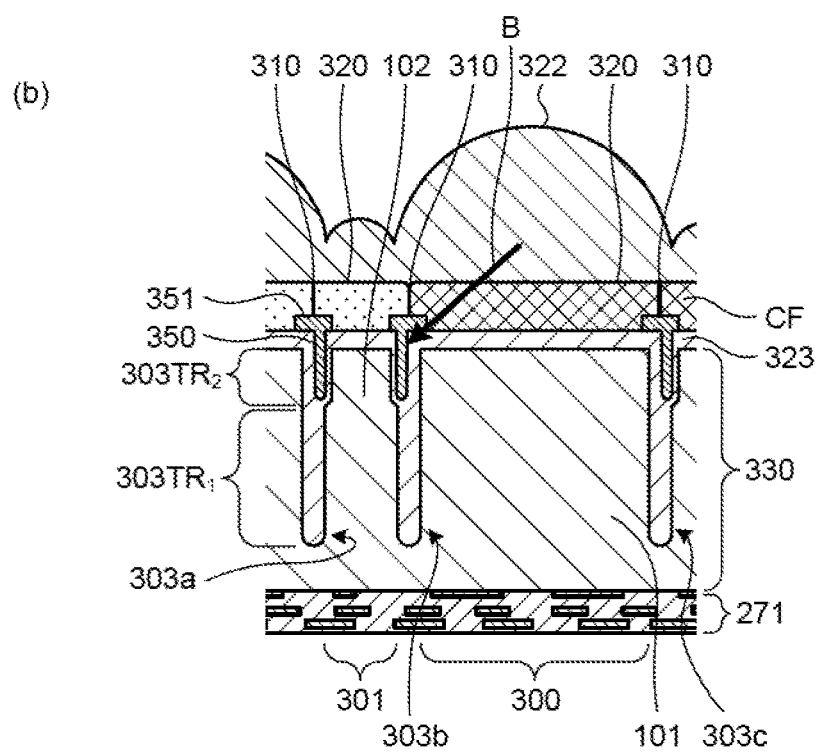

IMAGING ELEMENT, IMAGING ELEMENT DRIVING METHOD, AND ELECTRONIC DEVICE

CROSS REFERENCE TO RELATED APPLICATIONS

This application is a continuation application of U.S. patent application Ser. No. 17/782,872, filed Jun. 6, 2022, which is a national stage application under 35 U.S.C. 371 and claims the benefit of PCT Application No. PCT/JP2020/045556, having an international filing date of Dec. 8, 2020, which designated the United States, which PCT application claimed the benefit of Japanese Patent Application Nos. 2019-227660, filed Dec. 17, 2019, and 2020-0112161, filed Jun. 29, 2020, the entire disclosures of each of which are incorporated herein by reference.

FIELD

The present disclosure relates to an imaging element, an imaging element driving method, and an electronic device.

BACKGROUND

In an imaging device including a photoelectric conversion element, it is desirable that the photoelectric conversion element has high sensitivity when the illuminance is low, while it is desirable to have the photoelectric conversion element less likely to be saturated when the illuminance is high, for example. Therefore, for example, Patent Literature 1 discloses a technique of arranging, in a unit pixel, two elements, namely large and small photoelectric conversion elements having different areas and using a large-area photoelectric conversion element as a high-sensitivity pixel for the case of low illuminance and using a small-area photoelectric conversion element as a low-sensitivity pixel.

CITATION LIST

Patent Literature

Patent Literature 1: JP 2017-163010 A
Patent Literature 2: JP 2017-175345 A
Patent Literature 3: JP 2017-191950 A
Patent Literature 4: JP 2012-178457 A

SUMMARY

Technical Problem

In the case of the above-described configuration in which the high-sensitivity pixel and the low-sensitivity pixel are arranged in the unit pixel, the sensitivity greatly differs between the high-sensitivity pixel and the low-sensitivity pixel. This leads to the possibility of occurrence of leakage (crosstalk) of incident light from the high-sensitivity pixel to the low-sensitivity pixel, and this might cause degradation of image quality in the captured image.

An object of the present disclosure is to provide an imaging element, an imaging element driving method, and an electronic device, capable of suppressing crosstalk between pixels.

Solution to Problem

For solving the problem described above, an imaging element according to one aspect of the present disclosure has a unit pixel including a first pixel having a first photoelectric conversion element and a second pixel having a second photoelectric conversion element, the second pixel being arranged adjacent to the first pixel; and an accumulation portion that accumulates a charge generated by the second photoelectric conversion element and converts the accumulated charge into a voltage, in which the accumulation portion is disposed at a boundary between the unit pixel and another unit pixel adjacent to the unit pixel.

For solving the problem described above, an imaging element according to one aspect of the present disclosure has a pixel array including a plurality of pixels; and a light-shielding portion provided between each of the plurality of pixels included in the pixel array, in which the light-shielding portion is formed to have a width of a portion narrowest between two pixels arranged adjacent to each other among the plurality of pixels such that the width is defined according to a difference in sensitivity between the two pixels.

For solving the problem described above, an imaging element according to one aspect of the present disclosure has a pixel array including a plurality of pixels; and a trench light-shielding portion provided around each of the plurality of pixels included in the pixel array, in which the trench light-shielding portion is provided without a gap around a first pixel among the plurality of pixels, and the trench light-shielding portion is provided around a second pixel adjacent to the first pixel such that the trench light-shielding portion provided around the second pixel is spaced apart from the trench light-shielding portion provided around the first pixel.

For solving the problem described above, an imaging element according to one aspect of the present disclosure has: a first pixel; a second pixel arranged adjacent to the first pixel; a trench light-shielding portion provided around each of the first pixel and the second pixel; and a light-shielding wall embedded in a depth direction of a trench at least at a first boundary between the first pixel and the second pixel of the trench light-shielding portion, in which the light-shielding wall is formed to be embedded in the first boundary at a position closer to a direction of the second pixel

BRIEF DESCRIPTION OF DRAWINGS

FIG. 13 is a cross-sectional view schematically illustrating a structure of an example of a pixel in a case where an accumulation portion is disposed at an appropriate position according to the first embodiment.

FIG. 18B is a schematic diagram illustrating arrangement of an inter-pixel light-shielding portion according to a second embodiment.

FIG. 19B is a schematic diagram illustrating arrangement of an inter-pixel light-shielding portion according to the first modification of the second embodiment.

FIG. 20 is a schematic diagram illustrating an example of a pixel array by using an RCCC array applicable to a second modification of the second embodiment.

FIG. 30 is a schematic diagram illustrating a light-shielding effect by the pixel structure according to the fourth embodiment.

DESCRIPTION OF EMBODIMENTS

Figure 1:
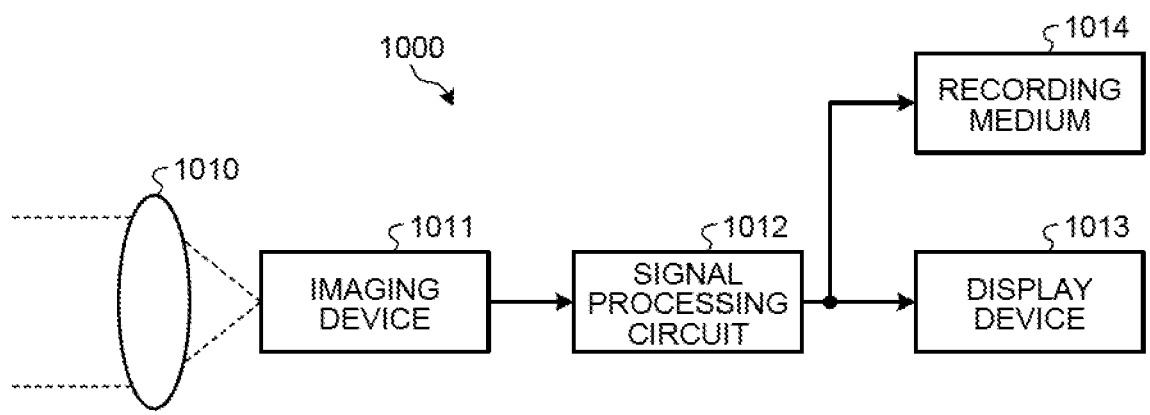
FIG. 1 is a block diagram illustrating a configuration of an example of an electronic device to which the technology according to each embodiment of the present disclosure is applicable.

Embodiments of the present disclosure will be described below in detail with reference to the drawings. In each of the following embodiments, the same parts are denoted by the same reference symbols, and a repetitive description thereof will be omitted.

Hereinafter, embodiments of the present disclosure will be described in the following order.

1. Technology applicable to each embodiment
    1-1. Electronic device
    1-2. Schematic configuration of CMOS image sensor
    1-3. Unit pixel
        1-3-1. Circuit configuration example
        1-3-2. Planar layout example
            1-3-2-1. Planar layout example of second surface
            1-3-2-2. Planar layout of first surface and second surface
            1-3-2-3. Planar layout of color filter
        1-3-3. Structural example
        1-3-4. Operation example
2. First Embodiment
    2-1. First modification
    2-2. Second modification
3. Second Embodiment
    3-1. First modification
    3-2. Second modification
4. Third Embodiment
    4-1. First modification
    4-2. Second modification
5. Fourth Embodiment
    5-0. Regarding known technique
    5-1. Regarding fourth embodiment
        5-1-1. Outline of fourth embodiment
        5-1-2. Specific description of fourth embodiment
    5-2. First modification
    5-3. Second modification
    5-4. Third modification
    5-5. Fourth modification
    5-6. Fifth modification
    5-7. Sixth modification
    5-8. Other modifications
6. Fifth Embodiment
    6-1. Application example of technology of present disclosure
    6-2. Application example to endoscopic surgery system
    6-3. Application example to moving objects 1. Technology Applicable to Each Embodiment First, in order to facilitate understanding, a technique applicable to each embodiment will be schematically described.

(1-1. Electronic Device)

First, an electronic device to which the technology according to each embodiment of the present disclosure is applicable will be described. FIG. 1 is a block diagram illustrating a configuration of an example of an electronic device to which the technology according to each embodiment of the present disclosure is applicable.

In FIG. 1, an electronic device 1000 includes an optical unit 1010, an imaging device 1011, a signal processing circuit 1012, a display device 1013, and a storage medium 1014. In FIG. 1, an imaging element as an imaging device according to the present disclosure described in detail below is applied to the imaging device 1011. The imaging element includes: a plurality of pixels each of which converts incident light into electric signals by photoelectric conversion; and a drive circuit that drives the plurality of pixels. Here, applicable examples of the electronic device 1000 include a digital still camera, a digital video camera, a mobile phone with an imaging function, and a smartphone.

The optical unit 1010 includes one or more lenses, a diaphragm mechanism, a focus mechanism, and the like, and forms an image of image light (incident light) from a subject onto an imaging surface of the imaging device 1011. With this structure, a signal charge is accumulated in the imaging device 1011 for a certain period. The signal processing circuit 1012 performs various types of signal processing including image processing on the pixel signal output from the imaging device 1011. The image signal that has undergone the signal processing can be stored in the storage medium 1014 as a nonvolatile medium, such as a flash drive or a hard disk drive. Furthermore, an image based on the pixel signal can also be output to the display device 1013.

(1-2. Schematic Configuration of CMOS Image Sensor)

Next, a schematic configuration of a complementary metal-oxide-semiconductor (CMOS) solid-state imaging device as an imaging element according to the present disclosure will be described. In the following description, a CMOS solid-state imaging device will be abbreviated as a CMOS image sensor. FIG. 1 is a block diagram illustrating a schematic configuration example of a CMOS image sensor applicable to each embodiment. Here, the CMOS image sensor is an image sensor created by applying or partially using a CMOS process. For example, the CMOS image sensor applicable to each embodiment includes a back-illuminated CMOS image sensor.

In FIG. 1, a CMOS image sensor 10 being an imaging element applicable to each embodiment has a stacked structure, for example, in which a semiconductor chip on which a pixel array unit 11 is formed and a semiconductor chip on which a peripheral circuit is formed are stacked. The peripheral circuit may include a vertical drive circuit 12, a column processing circuit 13, a horizontal drive circuit 14, and a system control unit 15, for example.

The CMOS image sensor 10 further includes a signal processing unit 18 and a data storage unit 19. The signal processing unit 18 and the data storage unit 19 may be provided on the same semiconductor chip as the peripheral circuit, or may be provided on a different semiconductor chip.

The pixel array unit 11 has a configuration in which unit pixels (hereinafter, simply described as "pixels" in some cases) each having a photoelectric conversion element that generates and accumulates a charge according to the amount of received light are arranged in a row direction and a column direction, that is, in a two-dimensional grid-like matrix pattern. Here, the row direction refers to an arrangement direction of pixels in a pixel row (that is, the horizontal direction), while the column direction refers to an arrangement direction of pixels in a pixel column (that is, the vertical direction). Specific circuit configurations and pixel structures of the unit pixels will be described below in detail.

The pixel array unit 11 has pixel drive lines LD wired in the row direction for individual pixel rows while having vertical signal lines VSL wired in the column direction for individual pixel columns with regard to the pixel array in a matrix. The pixel drive line LD transmits a drive signal for conducting drive when a signal is read out from a pixel. Although FIG. 1 illustrates the pixel drive line LD as one wiring line, the number is not limited to one. One end of the pixel drive line LD is connected to an output terminal corresponding to each of rows of the vertical drive circuit 12.

The vertical drive circuit 12 includes a shift register, an address decoder, and the like, and drives all the pixels of the pixel array unit 11 simultaneously or row by row. That is, together with the system control unit 15 that controls the vertical drive circuit 12, the vertical drive circuit 12 constitutes a drive unit that controls the operation of each of pixels of the pixel array unit 11. Although a specific configuration of the vertical drive circuit 12 is not illustrated, the vertical drive circuit typically includes two scan systems of a read-out scan system and a sweep-out scan system.

In order to read out a signal from the unit pixel, the read-out scan system sequentially performs selective scan of unit pixels of the pixel array unit 11 row by row. The signal read out from the unit pixel is an analog signal. The sweep-out scan system performs sweep-out scan on a read out row on which read-out scan is to be performed by the read-out scan system, prior to the read-out scan by an exposure time.

By the sweep-out scan by the sweep-out scan system, unnecessary charges are swept out from the photoelectric conversion element of the unit pixel of the read-out target row, and the photoelectric conversion element is reset. By sweeping out (resetting) unnecessary charges in the sweep-out scan system, an electronic shutter operation is performed. Here, the electronic shutter operation refers to an operation of discarding charges of the photoelectric conversion element and newly starting exposure (starting accumulation of charges).

The signal read out by the read-out operation by the read-out scan system corresponds to the amount of light received after the immediately preceding read-out operation or electronic shutter operation. Subsequently, a period from the read-out timing by the immediately preceding read-out operation or the sweep-out timing of the electronic shutter operation to the read-out timing of the current read-out operation corresponds to a charge accumulation period (also referred to as an exposure period) in the unit pixel.

A signal output from each of unit pixels in the pixel row selectively scanned by the vertical drive circuit 12 is input to the column processing circuit 13 through each of the vertical signal lines VSL for each pixel column. The column processing circuit 13 performs predetermined signal processing on the signal output from each pixel of the selected row through the vertical signal line VSL for each of the pixel columns of the pixel array unit 11, and temporarily holds the pixel signal after the signal processing.

Specifically, the column processing circuit 13 performs at least a noise removal process, for example, a correlated double sampling (CDS) process or a double data sampling (DDS) process, as the signal processing. For example, the CDS process removes the fixed pattern noise unique to the pixel such as the reset noise and the threshold variation of the amplification transistor in the pixel. The column processing circuit 13 also has an analog-digital (AD) conversion function, for example, and converts an analog pixel signal obtained by reading out from the photoelectric conversion element into a digital signal, and outputs the digital signal.

The horizontal drive circuit 14 includes a shift register, an address decoder, and the like, and sequentially selects a read-out circuit (hereinafter, referred to as a pixel circuit) corresponding to a pixel column of the column processing circuit 13. By the selective scan performed by the horizontal drive circuit 14, pixel signals subjected to signal processing for each pixel circuit in the column processing circuit 13 are sequentially output.

The system control unit 15 includes a timing generator that generates various timing signals and the like, and performs drive control of the vertical drive circuit 12, the column processing circuit 13, the horizontal drive circuit 14, and the like based on various timings generated by the timing generator.

The signal processing unit 18 has at least an arithmetic processing function, and performs various signal processing such as arithmetic processing on the pixel signal output from the column processing circuit 13. The data storage unit 19 temporarily stores data necessary for processes at signal processing in the signal processing unit 18.

Note that the output image output from the signal processing unit 18 may be subjected to predetermined processing in an application processor or the like in the electronic device equipped with the CMOS image sensor 10, or may be transmitted to an external device via a predetermined network, for example.

(1-3. Unit Pixel)

Next, the above-described unit pixel will be described more specifically.

(1-3-1. Circuit Configuration Example)

Figure 3:
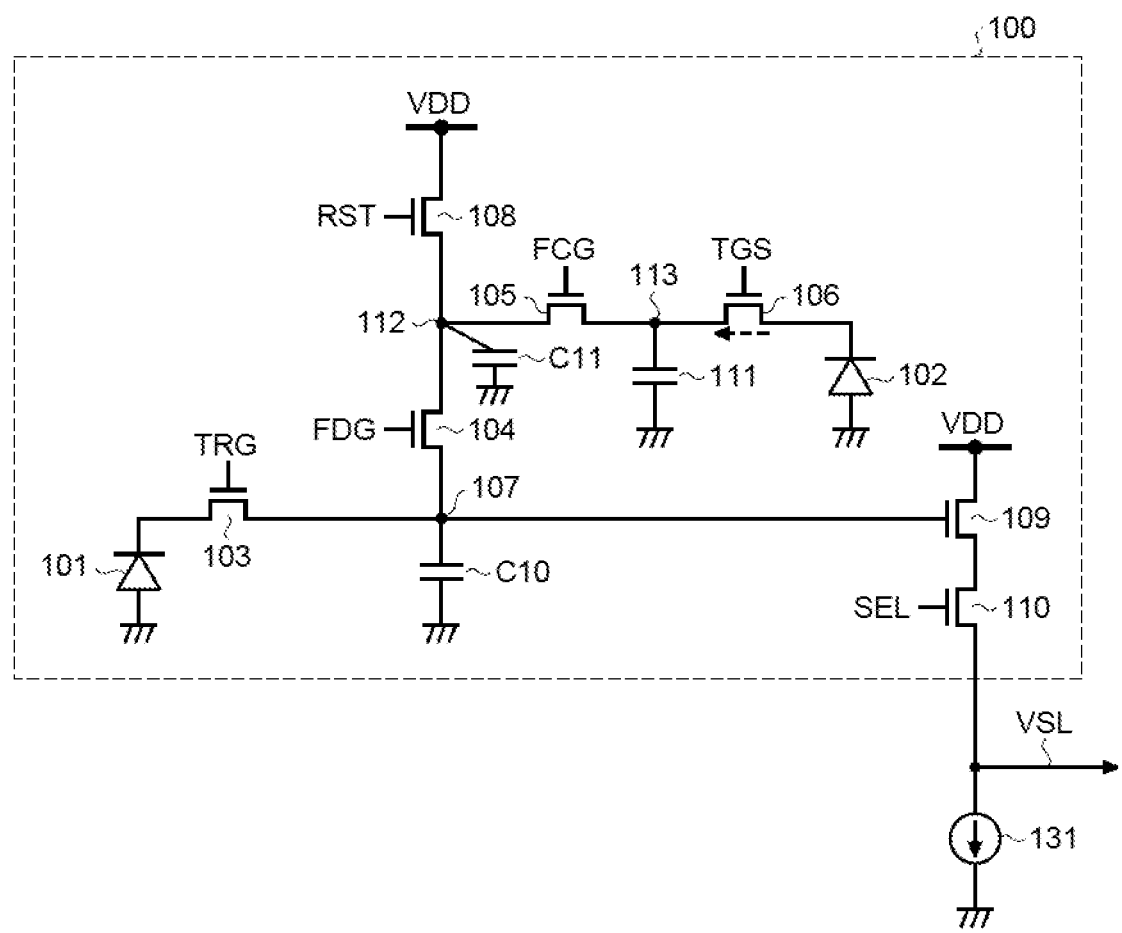
FIG. 3 is a circuit diagram illustrating a schematic configuration example of a unit pixel applicable to each embodiment.

FIG. 3 is a circuit diagram illustrating a schematic configuration example of a unit pixel applicable to each embodiment. As illustrated in FIG. 3, a unit pixel 100 includes two photoelectric conversion elements, namely, a first photoelectric conversion element 101 and a second photoelectric conversion element 102. Furthermore, in order to drive the first photoelectric conversion element 101 and the second photoelectric conversion element 102, the unit pixel 100 includes a first transfer transistor 103, a second transfer transistor 104, a third transfer transistor 105, a fourth transfer transistor 106, a floating diffusion (FD) portion 107, a reset transistor 108, an amplification transistor 109, and a selection transistor 110.

The pixel formed with the second photoelectric conversion element 102 included in the unit pixel 100 applicable to each embodiment is configured as an FD accumulation type pixel that reads a signal according to the charge generated by the second photoelectric conversion element 102 by accumulating the generated charge in a node 113 which is a floating diffusion layer to be described below.

The first transfer transistor 103, the second transfer transistor 104, the third transfer transistor 105, the fourth transfer transistor 106, the reset transistor 108, the amplification transistor 109, and the selection transistor 110 are formed with an n-type MOS transistor (hereinafter, referred to as an NMOS transistor), for example.

In the following description, the first transfer transistor 103, the second transfer transistor 104, the third transfer transistor 105, the fourth transfer transistor 106, the reset transistor 108, the amplification transistor 109, and the selection transistor 110 are also simply referred to as pixel transistors.

The reset transistor 108 and the amplification transistor 109 are connected to a power supply VDD. The first photoelectric conversion element 101 includes a device referred to as an embedded photodiode in which an n-type impurity region is formed inside a p-type impurity region formed in a silicon semiconductor substrate. Similarly, the second photoelectric conversion element 102 includes an embedded photodiode. The first photoelectric conversion element 101 and the second photoelectric conversion element 102 generate charges corresponding to the amount of received light, and accumulate the generated charges to a certain amount.

Furthermore, the unit pixel 100 further includes a charge accumulation portion 111. The charge accumulation portion 111 is, for example, a metal-oxide-semiconductor (MOS) capacitance or a metal-insulator-semiconductor (MIS) capacitance.

In FIG. 3, the first transfer transistor 103, the second transfer transistor 104, the third transfer transistor 105, and the fourth transfer transistor 106 are connected in series between the first photoelectric conversion element 101 and the second photoelectric conversion element 102. The floating diffusion layer connected between the first transfer transistor 103 and the second transfer transistor 104 functions as the FD portion 107. The FD portion 107 includes a parasitic capacitance C10.

The floating diffusion layer connected between the second transfer transistor 104 and the third transfer transistor 105 functions as a node 112. The node 112 includes a parasitic capacitance C11. The floating diffusion layer connected between the third transfer transistor 105 and the fourth transfer transistor 106 functions as a node 113. The charge accumulation portion 111 is connected to the node 113.

Figure 2:
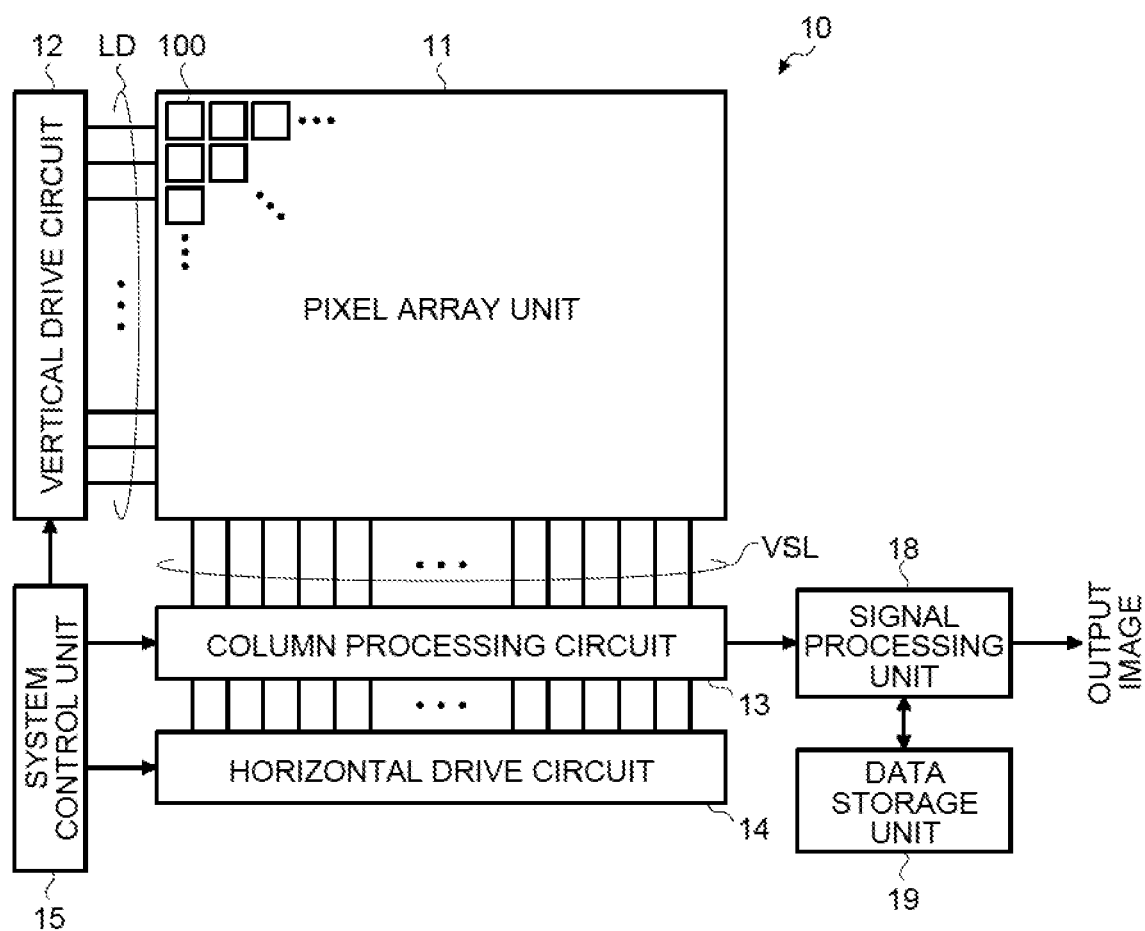
FIG. 2 is a block diagram illustrating a schematic configuration example of a CMOS image sensor applicable to each embodiment.

The unit pixel 100 exemplified in FIG. 3 is connected to a plurality of drive lines, on a pixel row basis, for example, as the pixel drive line LD described in FIG. 2. Through the plurality of drive lines, various drive signals TRG, FDG, FCG, TGS, RST, and SEL are supplied from the vertical drive circuit 12. The drive signals TRG, FDG, FCG, TGS, RST, and SEL may each be, for example, a pulse signal in which a high level (for example, the power supply voltage VDD) state is determined as an active state and a low level state (for example, a ground potential or a negative potential) is determined as an inactive state, or a signal maintaining each level state for a predetermined time.

The drive signal TRG is applied to the gate electrode of the first transfer transistor 103. When the drive signal TRG is active, the first transfer transistor 103 becomes conductive, and the charge accumulated in the first photoelectric conversion element 101 is transferred to the FD portion 107 via the first transfer transistor 103.

The drive signal FDG is applied to the gate electrode of the second transfer transistor 104. The state in which the drive signal FDG is active and the second transfer transistor 104 is conductive allows the potentials of the FD portion 107 and the node 112 to be coupled with each other to form one charge accumulation region.

The drive signal FCG is applied to the gate electrode of the third transfer transistor 105. The state in which the drive signal FDG and the drive signal FCG are active and the second transfer transistor 104 and the third transfer transistor 105 are conductive allows the potentials from the FD portion 107 to the charge accumulation portion 111 to be coupled with each other to form one charge accumulation region.

The drive signal TGS is applied to the gate electrode of the fourth transfer transistor 106. When the drive signal TGS is active, the fourth transfer transistor 106 becomes conductive, and the charge accumulated in the second photoelectric conversion element 102 is transferred to the charge accumulation portion 111 via the fourth transfer transistor 106. The state in which the fourth transfer transistor 106, the third transfer transistor 105, and the second transfer transistor 104 are active allows the potential from the charge accumulation portion 111 to the FD portion 107 to be coupled with each other, and then the charge accumulated in the second photoelectric conversion element 102 will be transferred to the coupled charge accumulation region.

Furthermore, the channel region under the gate electrode of the fourth transfer transistor 106, for example, has the potential being slightly shifted in a positive direction (in other words, the potential is slightly deeper) as compared with the channel region under the gate electrode of the first transfer transistor 103, the second transfer transistor 104, or the third transfer transistor 105, and this forms an overflow path for charges. When the photoelectric conversion in the second photoelectric conversion element 102 resulted in generation of a charge exceeding the saturation charge amount of the second photoelectric conversion element 102, the charge exceeding the saturation charge amount overflows (flows out) from the second photoelectric conversion element 102 to the charge accumulation portion 111 via the overflow path. The overflowed charge is accumulated in the charge accumulation portion 111.

In the following description, the overflow path formed in the channel region below the gate electrode of the fourth transfer transistor 106 is simply referred to as an overflow path of the fourth transfer transistor 106.

In FIG. 3, of the two electrodes included in the charge accumulation portion 111, a first electrode is a node electrode connected to the node 113 between the third transfer transistor 105 and the fourth transfer transistor 106. A second electrode of the two electrodes included in the charge accumulation portion 111 is a grounded electrode.

As a modification, the second electrode may be connected to a specific potential other than the ground potential, for example, a power supply potential.

In a case where the charge accumulation portion 111 is the MOS capacitance or the MIS capacitance, the second electrode, as an example, is an impurity region formed on the silicon substrate, and the dielectric film that forms the capacitance is an oxide film or a nitride film formed on the silicon substrate. The first electrode is an electrode formed of a conductive material, for example, polysilicon or metal, above the second electrode and the dielectric film.

When the second electrode is set to the ground potential, the second electrode may be a p-type impurity region electrically connected to the p-type impurity region provided in the first photoelectric conversion element 101 or the second photoelectric conversion element 102. When the second electrode is set to a specific potential other than the ground potential, the second electrode may be an n-type impurity region formed in the p-type impurity region.

The node 112 is also connected to the reset transistor 108 as well as to the second transfer transistor 104. The reset transistor is further connected to a specific potential, for example, a power supply VDD. A drive signal RST is applied to the gate electrode of the reset transistor 108. When the drive signal RST is active, the reset transistor 108 becomes conductive, and the potential of the node 112 is reset to the level of the voltage VDD.

When the drive signal FDG of the second transfer transistor 104 and the drive signal FCG of the third transfer transistor 105 are also activated at activation of the drive signal RST, the potentials of the node 112, the FD portion 107, and the charge accumulation portion 111 having coupled potentials are reset to the level of the voltage VDD.

By individually controlling the drive signal FDG and the drive signal FCG, the potentials of the FD portion 107 and the charge accumulation portion 111 can be individually (independently) reset to the level of the voltage VDD.

The FD portion 107 which is a floating diffusion layer has a function of converting a charge into a voltage. That is, when the charge is transferred to the FD portion 107, the potential of the FD portion 107 changes according to the amount of the transferred charge.

The amplification transistor 109 has on its source side connected to a current source 131 connected to one end of the vertical signal line VSL, while having, on its drain side, connected to a power supply VDD, so as to form a source follower circuit together with these. The FD portion 107 is connected to the gate electrode of the amplification transistor 109, and this serves as an input of the source follower circuit.

The selection transistor 110 is connected between the source of the amplification transistor 109 and the vertical signal line VSL. A drive signal SEL is applied to a gate electrode of the selection transistor 110. When the drive signal SEL is active, the selection transistor 110 becomes conductive, shifting the unit pixel 100 to a selected state.

When the charges are transferred to the FD portion 107, the potential of the FD portion 107 becomes a potential corresponding to the amount of transferred charges, and the potential is input to the source follower circuit. When the drive signal SEL is active, the potential of the FD portion 107 corresponding to the amount of electric charge is output to the vertical signal line VSL via the selection transistor 110 as the output of the source follower circuit.

The light receiving surface of the first photoelectric conversion element 101 is wider than that of the second photoelectric conversion element 102. That is, in each embodiment, the first photoelectric conversion element 101 has a large area, and the second photoelectric conversion element 102 has a small area. In that case, when imaging is performed under the condition of the same illuminance and the same exposure time, the charge generated in the first photoelectric conversion element 101 is larger than the charge generated in the second photoelectric conversion element 102. Therefore, the voltage change before and after the charge generated by the first photoelectric conversion element 101 is transferred to the FD portion 107 is larger than the voltage change before and after the charge generated by the second photoelectric conversion element 102 is transferred to the FD portion 107. This indicates that the first photoelectric conversion element 101 has higher sensitivity than the second photoelectric conversion element 102 in comparison between the first photoelectric conversion element 101 and the second photoelectric conversion element 102.

On the other hand, even when high illuminance light is incident and a charge exceeding the saturation charge amount of the second photoelectric conversion element 102 is generated, the second photoelectric conversion element 102 can accumulate the charge generated exceeding the saturation charge amount in the charge accumulation portion 111. Therefore, when charge-voltage conversion is performed on the charge generated in the second photoelectric conversion element 102, the charge-voltage conversion can be performed after adding both the charge accumulated in the second photoelectric conversion element 102 and the charge accumulated in the charge accumulation portion 111.

With this configuration, compared with the first photoelectric conversion element 101, the second photoelectric conversion element 102 can capture an image having gradation over a wider illuminance range, in other words, capture an image having a wider dynamic range.

Two images, namely, an image with high sensitivity captured by using the first photoelectric conversion element 101 and an image with a wide dynamic range captured by using the second photoelectric conversion element 102, are combined into one image through wide dynamic range image combining processing of combining two images to one image in an image signal processing circuit included in the CMOS image sensor 10 or an image signal processing device connected to the outside of the CMOS image sensor 10, for example.

(1-3-2. Planar Layout Example)

Next, a planar layout example of the unit pixel 100 applicable to each embodiment will be described.

(1-3-2-1. Planar Layout Example of Second Surface)

Figure 4:
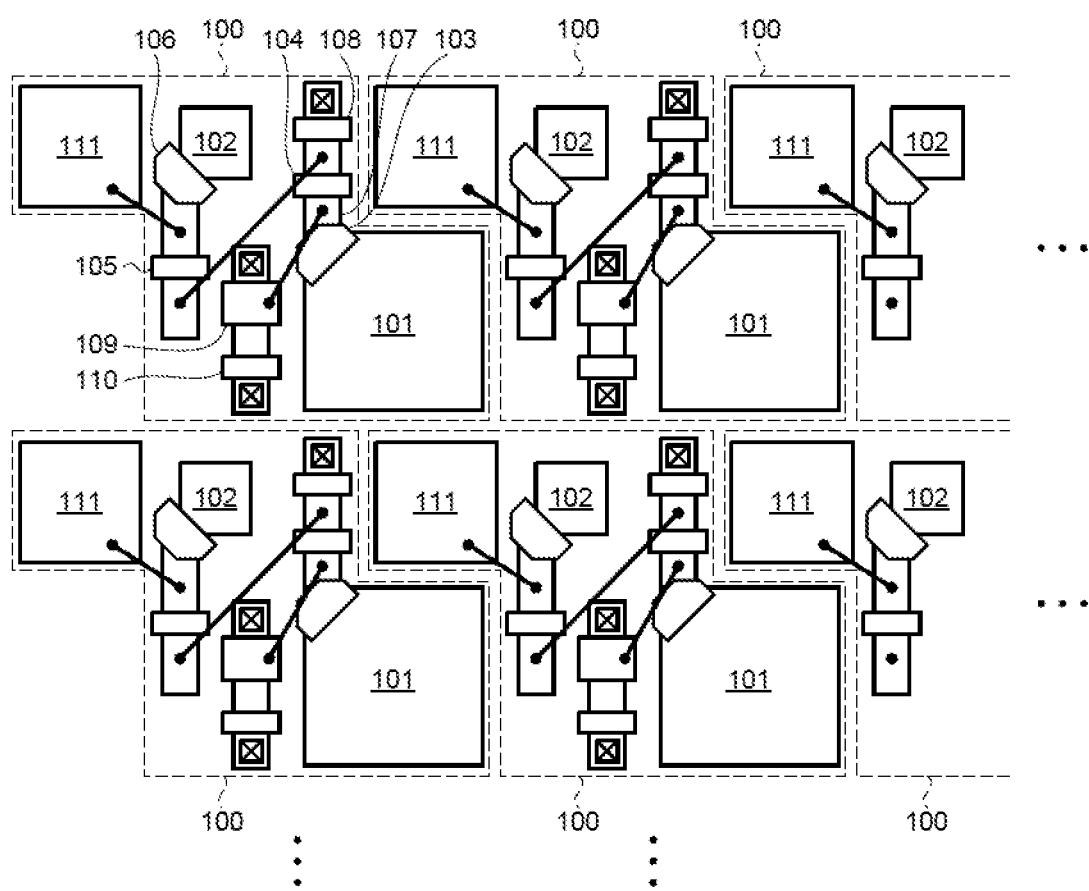
FIG. 4 is a schematic diagram illustrating a planar layout example of a unit pixel applicable to each embodiment.

FIG. 4 is a schematic diagram illustrating a planar layout example of the unit pixel according to the present embodiment. FIG. 4 illustrates a case where the unit pixel 100 is a device referred to as a back-illuminated CMOS image sensor.

In the back-illuminated CMOS image sensor 10, the silicon substrate on which the first photoelectric conversion element 101 and the second photoelectric conversion element 102 are formed includes a first surface serving as an incident surface of light to the photodiode, and a second surface facing the first surface. FIG. 4 illustrates a planar layout of the second surface of the silicon substrate, related to the unit pixel 100, which is a planar layout of an active region, a photoelectric conversion element, a pixel transistor, a charge accumulation portion, related to the unit pixel 100, as well as wiring lines connecting these components.

As illustrated in FIG. 4, the first photoelectric conversion element 101, the first transfer transistor 103, the FD portion 107, the second transfer transistor 104, a part of the node 112, the reset transistor 108, and a connection portion to the power supply VDD are formed on a continuous first active region.

On the other hand, the second photoelectric conversion element 102, the fourth transfer transistor 106, the node 113, the third transfer transistor 105, and another part of the node 112 are formed on a continuous second active region different from the first active region.

In addition, the connection portion to the vertical signal line VSL, the selection transistor 110, the amplification transistor 109, and the connection portion to the power supply VDD are formed on a continuous third active region different from the first and second active regions.

Furthermore, the charge accumulation portion 111 is formed on a fourth active region (not illustrated) different from the first to third active regions. Due to the configuration of the fourth active region in which the impurity region to be the lower electrode of the charge accumulation portion 111 is formed, a dielectric film is disposed on the fourth active region, and an upper electrode is further disposed on the dielectric film, FIG. 4 illustrates only the upper electrode. The fourth active region where the lower electrode is formed is disposed below the upper electrode.

In FIG. 4, the FD portion 107 and the gate electrode of the amplification transistor 109 are connected to each other by wiring disposed above the gate electrode. A part of the node 112 formed in the first active region and another part of the node 112 formed in the second active region are also connected to each other by wiring disposed above each gate electrode. Furthermore, the node 113 and the upper electrode of the charge accumulation portion 111 are also connected to each other by wiring arranged above each gate electrode and the upper electrode of the charge accumulation portion 111.

Note that a region surrounded by a dotted line in FIG. 4 corresponds to one region of the unit pixel 100 illustrated in FIG. 3. Accordingly, by arranging the unit pixels 100 in a two-dimensional grid-like pattern (matrix pattern), the first photoelectric conversion elements 101 are to be arranged in a two-dimensional grid-like pattern. The second photoelectric conversion elements 102 are arranged between the first photoelectric conversion elements 101, so as to be arranged in a two-dimensional grid-like pattern.

(1-3-2-2. Planar Layout of First Surface and Second Surface)

Figure 5:
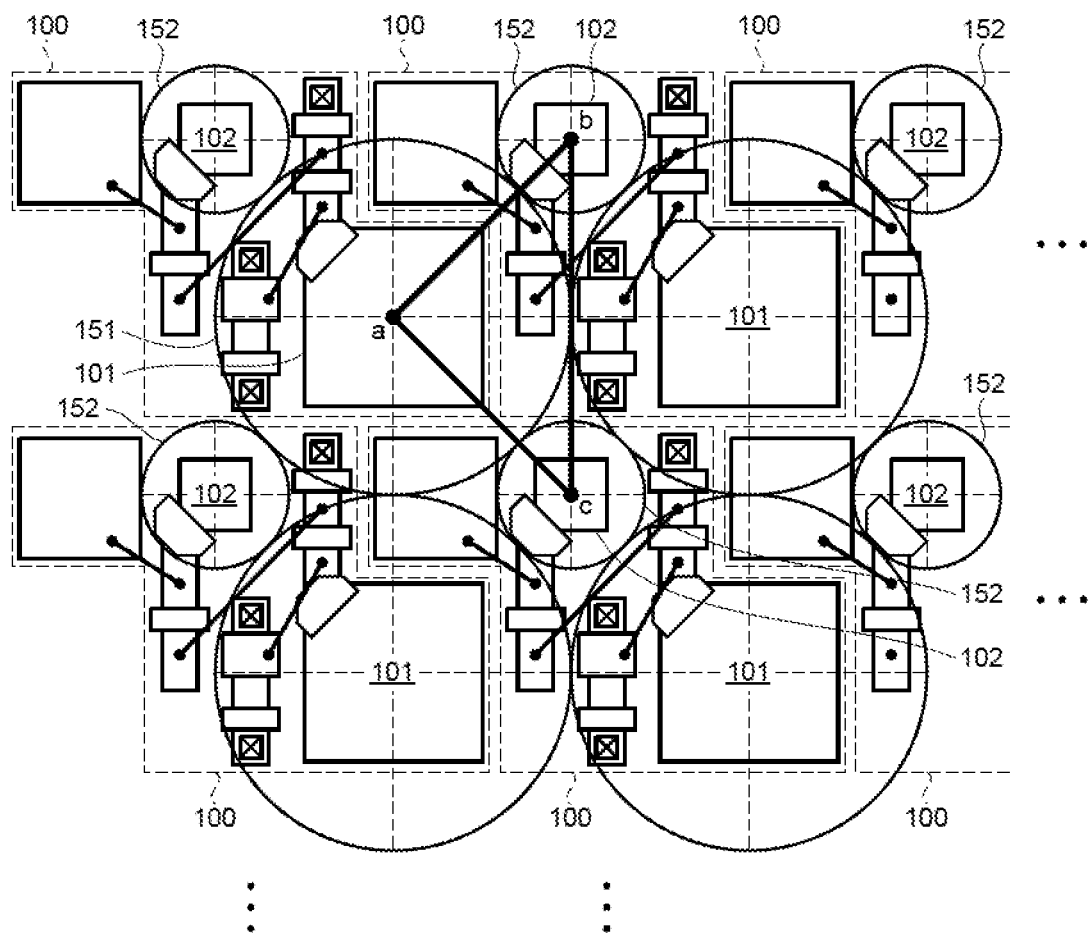
FIG. 5 is a schematic diagram illustrating a planar layout example of a unit pixel applicable to each embodiment.

FIG. 5 is a schematic diagram illustrating a planar layout example of the unit pixel according to the present embodiment, and is a schematic diagram in which a planar layout on the second surface of the silicon substrate and a planar layout on the first surface are superimposed. That is, FIG. 5 illustrates a planar layout of the photoelectric conversion elements and on-chip lenses formed on the first surface in addition to the planar layout of the second surface illustrated in FIG. 4. Note that a region surrounded by a dotted line in FIG. 5 corresponds to one region of the unit pixel 100 illustrated in FIG. 3.

As illustrated in FIG. 5, the first photoelectric conversion element 101 and the second photoelectric conversion element 102 are located in a same region on the second surface and the first surface.

A first on-chip lens 151 that collects light to be incident on the first photoelectric conversion element 101 is disposed so as to cover the first photoelectric conversion element 101. Similarly, a second on-chip lens 152 that collects light to be incident on the second photoelectric conversion element 102 is disposed so as to cover the second photoelectric conversion element 102.

The size of the first on-chip lens 151 and the second on-chip lens 152 can be appropriately set depending on factors in pixel designing, for example, the range of light to be collected and incident on the photoelectric conversion element on the first surface, the size of the photoelectric conversion element, the pixel transistor, and the charge accumulation portion on the second surface, and the resulting size of one pixel or the pixel pitch in a case where the pixels are arranged in an array.

For example, an excessively large on-chip lens would cause disadvantages such as a decrease in the resolution of the imaging device and occurrence of a useless region in which the components of the unit pixel are not arranged on the second surface. On the other hand, an excessively small on-chip lens would cause a disadvantage such as reduction of light incident on the photoelectric conversion element and resultant decrease in the sensitivity. Therefore, the size of the on-chip lens on the first surface and the size of each component of the unit pixel on the second surface are to be preferably designed appropriately while rebalancing sensitivity and resolution.

FIG. 5 illustrates an exemplary case where, as a result of pixel designing, the diameter of the first on-chip lens 151 is made equal to the pixel pitch, the first on-chip lenses 151 are arranged in a two-dimensional grid-like pattern in the vertical and horizontal directions, and the diameter of the second on-chip lens 152 is designed such that the second on-chip lens 152 fits within the region of the gap between the first on-chip lenses 151.

In this case, there are relationships between a distance $a_b$ from a center a of the first on-chip lens 151 included in a certain first pixel to a center b of the first on-chip lens 151 included in a second pixel adjacent to the first pixel, a distance $a_c$ from the center a of the first on-chip lens 151 included in the first pixel to a center c of the second on-chip lens 152 included in the third pixel, a distance $b_c$ from a center b of the first on-chip lens 151 included in the second pixel to the center c of the second on-chip lens 152 included in the third pixel, a radius $r_1$ of the first on-chip lens 151 included in each pixel, and a radius $r_2$ of the second on-chip lens 152 included in each pixel, the relationships as represented by the following Formulas (1) to (3).

$$\text{Distance } a_b = r_1 \times 2 \quad (1)$$

$$\text{Distance } a_c = \text{Distance } b_c = \text{Distance } a_b \times \sqrt{2}/2 \quad (2)$$

$$r_2 \leq r_1 \times (\sqrt{2} - 1) \quad (3)$$

According to Formula (1), the distance $a_b$ is twice the radius $r_1$ of the first on-chip lens 151, and the distance $a_b$ is equivalent to the diameter of the first on-chip lens 151. In addition, according to Formula (2), the distance $a_c$ and the distance $b_c$ are the same distance, and become a value calculated by dividing a value obtained by multiplying the distance $a_b$ by $\sqrt{2}$, by 2. That is, the distance $a_c$ (distance $b_c$) is a value obtained by multiplying the radius $r_1$ of the first on-chip lens 151 by $\sqrt{2}$. According to Formula (3), the radius $r_2$ of the second on-chip lens 152 can be derived from Formulas (1) and (2), and is equal to or less than a value calculated by multiplying the radius $r_1$ by a value obtained by subtracting 1 from $\sqrt{2}$.

Figure 6:
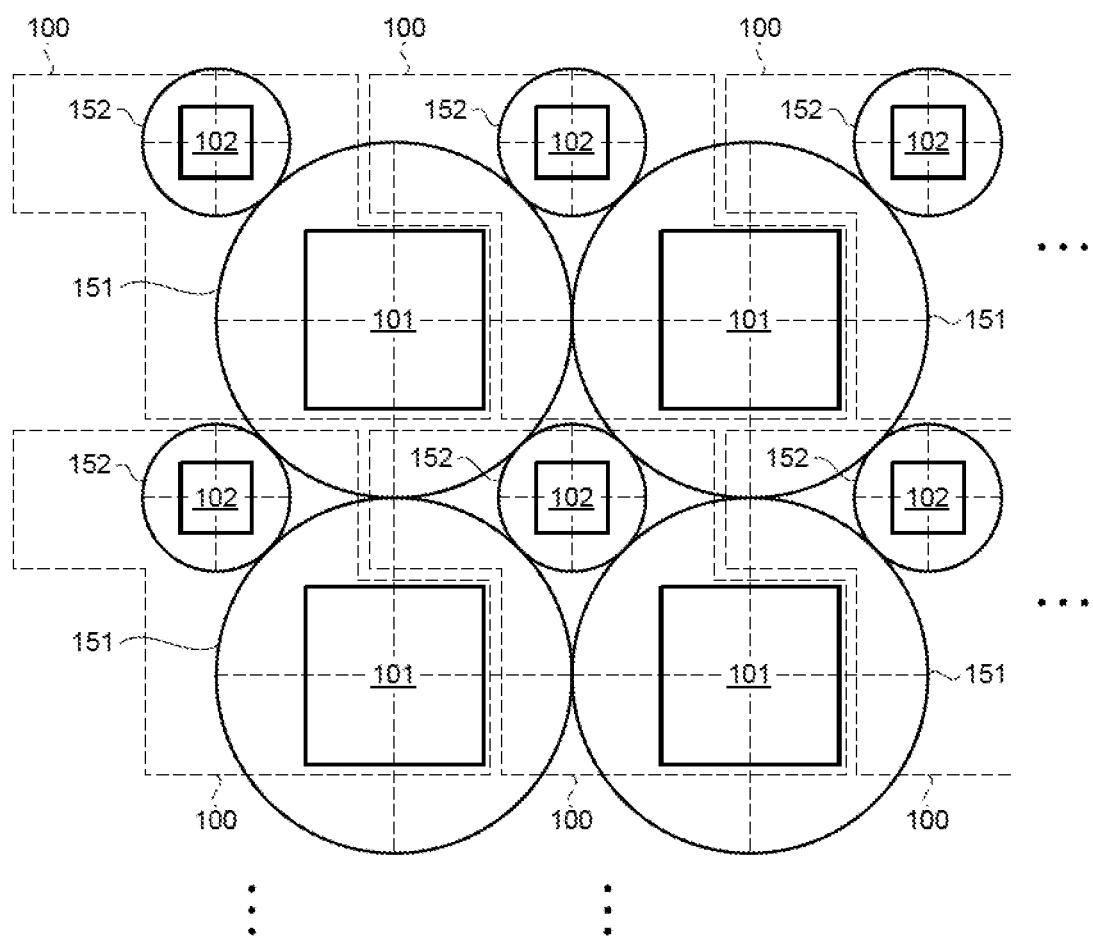
FIG. 6 is a schematic diagram illustrating a planar layout example of a unit pixel applicable to each embodiment.

FIG. 6 is a schematic diagram illustrating a planar layout example of a unit pixel applicable to each embodiment, and is a diagram obtained by extracting planar layouts of the first photoelectric conversion element 101, the second photoelectric conversion element 102, the first on-chip lens 151, and the second on-chip lens 152 on the first surface from FIG. 5. Note that a region surrounded by a dotted line in FIG. 6 corresponds to one region of the unit pixel 100 illustrated in FIG. 3.

Similarly to FIG. 5, FIG. 6 illustrates an exemplary case where, as a result of pixel designing, the diameter of the first on-chip lens 151 is made equal to the pixel pitch, the first on-chip lenses 151 are arranged in a two-dimensional grid-like pattern in the vertical and horizontal directions, and the diameter of the second on-chip lens 152 is designed such that the second on-chip lens 152 fits within the region of the gap between the first on-chip lenses 151.

Figure 7:
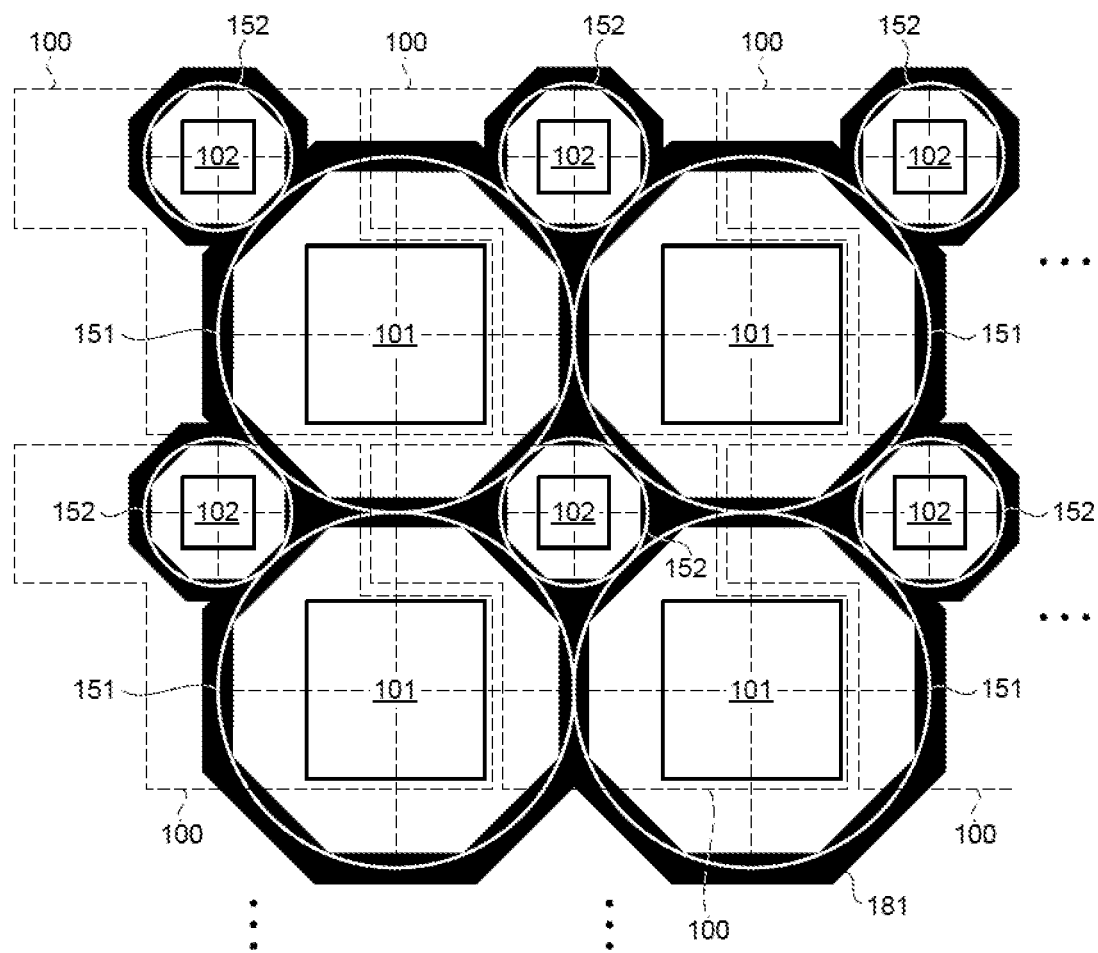
FIG. 7 is a schematic diagram illustrating a planar layout example of a unit pixel applicable to each embodiment.

FIG. 7 is a schematic diagram illustrating a planar layout example of a unit pixel applicable to each embodiment, and is a diagram obtained by extracting a planar layout including portions between pixels on the first surface of the unit pixel 100 in addition to the first photoelectric conversion element 101, the second photoelectric conversion element 102, the first on-chip lens 151, and the second on-chip lens 152 on the first surface illustrated in FIG. 6.

As illustrated in FIG. 7, an inter-pixel light-shielding portion 181 is provided to prevent light from leaking into adjacent pixels. In a portion where the first on-chip lens 151 of a certain pixel and the first on-chip lens 151 of a pixel adjacent to the certain pixel are closest to each other, the inter-pixel light-shielding portions 181 are arranged with the same width in the inward direction of these two on-chip lenses.

Furthermore, in a portion where the first on-chip lens 151 and the second on-chip lens 152 are closest to each other, the inter-pixel light-shielding portions 181 are arranged with the same width in the inward direction of these two on-chip lenses.

(1-3-2-3. Planar Layout of Color Filter)

Figure 8:
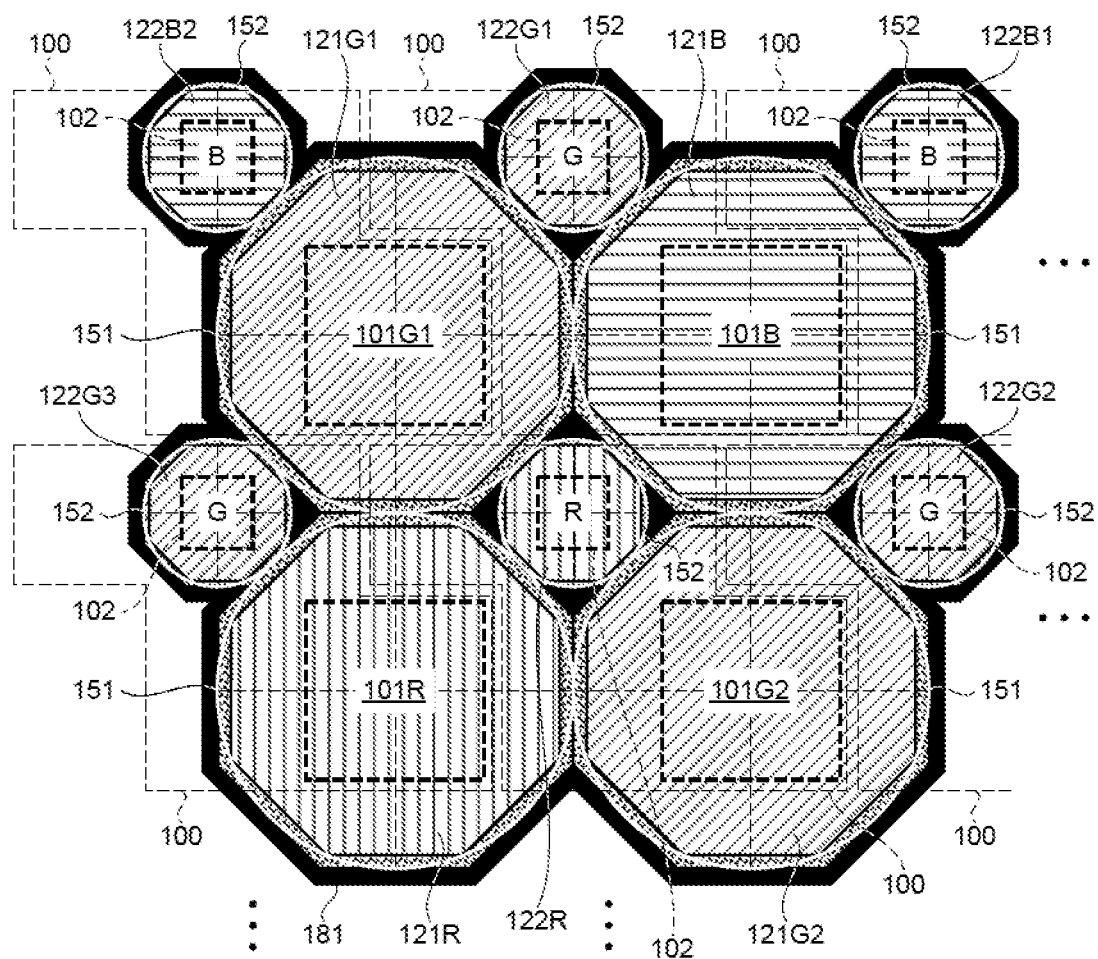
FIG. 8 is a plan view illustrating a planar layout example of a color filter array applicable to each embodiment.

FIG. 8 is a plan view illustrating a planar layout example of a color filter array applicable to each embodiment, and is a diagram obtained by extracting the planar layout of first color filters 121R, 121G1, 121G2, and 121B and second color filters 122R, 122G1 to 122G3, 122B1 and 122B2 provided in each pixel on the first surface of the unit pixel 100 in addition to the planar layout of the first photoelectric conversion element 101, the second photoelectric conversion element 102, the first on-chip lens 151, the second on-chip lens 152, and the inter-pixel light-shielding portion 181 on the first surface illustrated in FIG. 7. In the following description, when the first color filter is not distinguished from each other, the reference numeral 121 is given. Similarly, when the second color filter is not distinguished from each other, the reference numeral 122 is given.

The first color filter 121 is a color filter provided for the first photoelectric conversion element 101 constituting a large pixel as a first pixel, and is disposed between the first on-chip lens 151 and the first photoelectric conversion element 101 in each pixel, for example.

The second color filter 122 is a color filter provided for the second photoelectric conversion element 102 constituting a small pixel as the second pixel, and is disposed between the second on-chip lens and the second photoelectric conversion element 102 in each pixel, for example.

As can be seen from FIGS. 4 to 8 and the sizes of the first on-chip lens 151 and the second on-chip lens 152 based on Formulas (1) to (3) described above, the area of the light receiving surface of the large pixel is larger than the area of the light receiving surface of the small pixel.

Here, the planar layout of the color filter for the large pixel will be described. As illustrated in FIG. 8, the first color filters 121 for the large pixels are arranged in an array on the first surface according to the rule of the Bayer array, for example. Therefore, in a total of four large pixels of 2×2 pixels as a unit of repetition of the Bayer array, the two first color filters 121G1 and 121G2 that transmit the wavelength component of green (G) are arranged diagonally, while the first color filter 121B that transmits the wavelength component of blue (B) and the first color filter 121R that transmits the wavelength component of red (R) are arranged diagonally so as to intersect with the two first color filters.

The planar layout of the color filter for the large pixel may be other types of arrays, not limited to the Bayer array.

Basically, similarly to the first color filter 121 provided for a large pixel, the second color filter 122 provided for a small pixel includes a combination of color filters that transmit the same wavelength components as those of the Bayer array and other color filter arrays, for example. For example, in a case where the Bayer array is applied to the second color filters 122, the repeating unit of the array includes two second color filters 122G1 and 122G2 that transmit the green (G) wavelength component, one second color filter 122R that transmits the red (R) wavelength component, and one second color filter 122B that transmits the blue (B) wavelength component.

(1-3-3. Structural Example)

Figure 9:
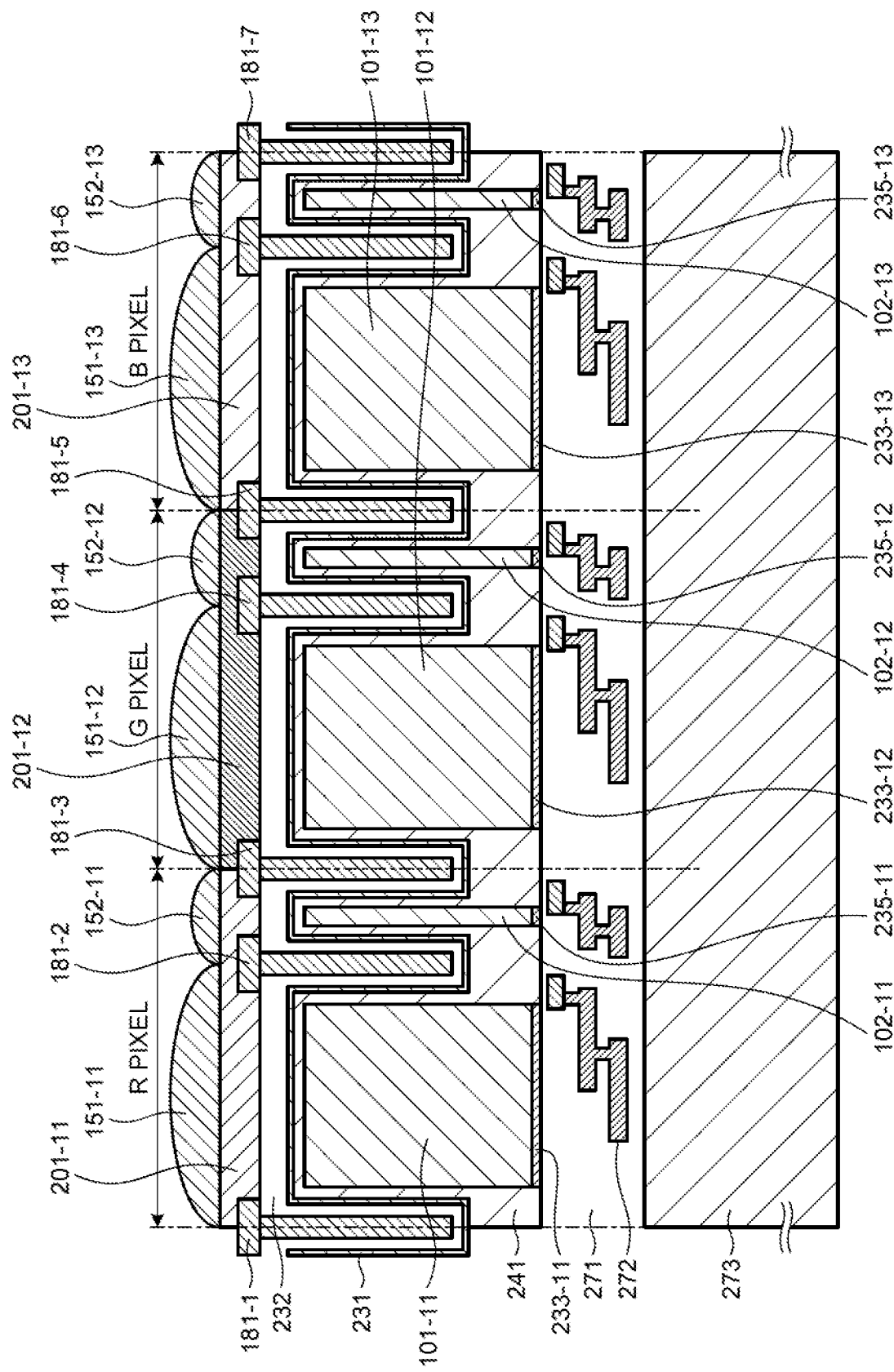
FIG. 9 is a diagram illustrating a structure of a unit pixel applicable to each embodiment.

Next, a structure example of a unit pixel applicable to each embodiment will be described. FIG. 9 is a schematic diagram of a cross section related to the unit pixel 100, and repeatedly schematically illustrates a portion in which the first on-chip lens 151 and the second on-chip lens 152 are closest to each other in one pixel and a portion in which the second on-chip lens 152 of a certain pixel and the first on-chip lens 151 of a pixel adjacent thereto are closest to each other in two adjacent pixels.

In FIG. 9, each unit pixel includes photoelectric conversion units (first photoelectric conversion units 101-11, 101-12, and 101-13) of the first photoelectric conversion element 101, photoelectric conversion units (second photoelectric conversion units 102-11, 102-12, and 102-13) of the second photoelectric conversion element 102, first on-chip lenses 151-11, 151-12, and 151-13 and second on-chip lenses 152-11, 152-12, and 152-13 each of which arranged on these photoelectric conversion units, color filters 201-11, 201-12, and 201-13 disposed between the photoelectric conversion unit and the on-chip lens, a film having a negative fixed charge (film referred to as pinning film 231) disposed between the photoelectric conversion unit and the color filters, an interlayer insulating film 232, and inter-pixel light-shielding portions 181-1, 181-2, 181-3, 181-4, 181-5, 181-6, and 181-7 disposed around the first photoelectric conversion units 101-11, 101-12, and 101-13 and the second photoelectric conversion units 102-11, 102-12 and 102-13.

FIG. 9 illustrates an example in which the R pixel, the G pixel, and the B pixel are arranged from the left in the horizontal direction. The R pixel is a pixel provided with a color filter 201-11 that transmits a red (R) wavelength component. The G pixel is a pixel provided with a color filter 201-12 that transmits a green (G) wavelength component. Furthermore, the B pixel is a pixel provided with a color filter 201-13 that transmits a blue (B) wavelength component.

For example, description will be given with reference to the G pixel located at the center. The G pixel includes a stack of a wiring layer 271 in which wiring 272 is arranged on a support substrate 273. On the wiring layer 271, the first photoelectric conversion unit 101-12 which is a photoelectric conversion unit in the first photoelectric conversion element 101 and the second photoelectric conversion unit 102-12 which is a photoelectric conversion unit in the second photoelectric conversion element 102 are formed.

Each of the first photoelectric conversion unit 101-12 and the second photoelectric conversion unit 102-12 is a photodiode including a P-well region 241 and an n-type impurity region formed therein. Furthermore, a P-type pinning region 233-12 is formed between the first photoelectric conversion unit 101-12 and the wiring layer 271, while a P-type pinning region 235-12 is formed between the second photoelectric conversion unit 102-12 and the wiring layer 271.

Between the first photoelectric conversion unit 101-12 and the second photoelectric conversion unit 102-12, there is provided an inter-pixel light-shielding portion 181-4 so as to prevent leakage of light from the first photoelectric conversion unit 101-12 to the second photoelectric conversion unit 102-12 and leakage of light from the second photoelectric conversion unit 102-12 to the first photoelectric conversion unit 101-12.

Furthermore, there is provided an inter-pixel light-shielding portion 181-3 at a portion between the G pixel and the left adjacent pixel (an R pixel in FIG. 9) so as to prevent leakage of light from the left adjacent R pixel and leakage of light to the left adjacent R pixel.

Similarly, there is provided an inter-pixel light-shielding portion 181-5 at a portion between the G pixel and the right adjacent pixel (a B pixel in FIG. 9) so as to prevent leakage of light from the right adjacent B pixel and leakage of light to the right adjacent B pixel.

(1-3-4. Operation Example)

Next, an operation example of a unit pixel applicable to each embodiment will be described.

(Operation Example at the Time of Starting Exposure)

Figure 10:
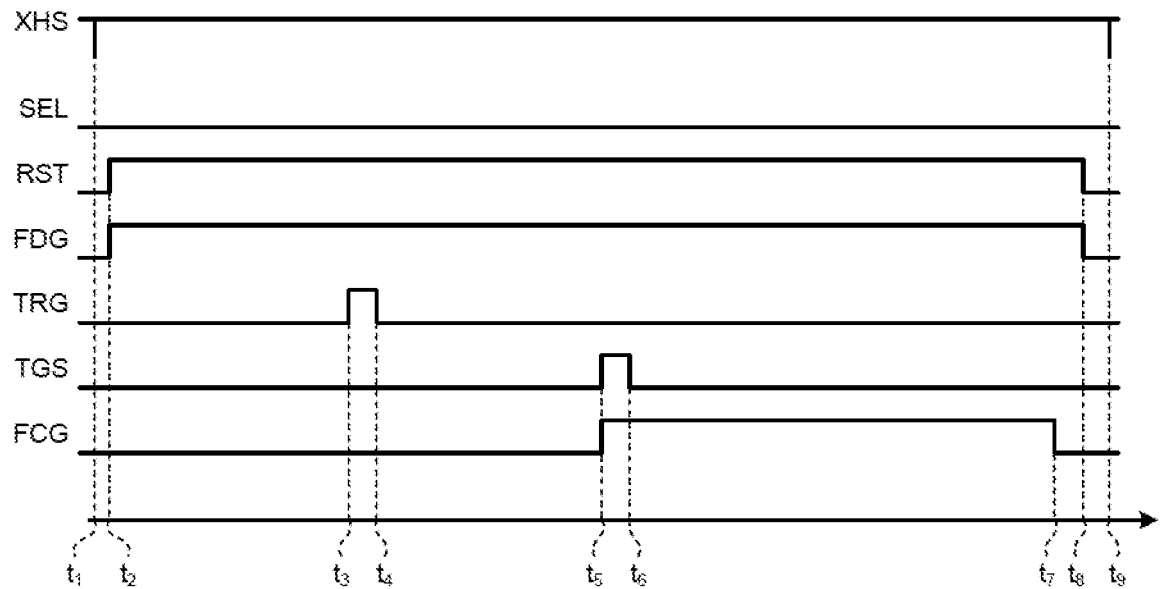
FIG. 10 is a timing chart illustrating an operation example of a unit pixel at the time of starting exposure applicable to each embodiment.

FIG. 10 is a timing chart illustrating an operation example at the time of starting exposure of the unit pixel. First, an operation example at the time of starting exposure of the unit pixel 100 will be described with reference to the timing chart of FIG. 10 and the circuit diagram of FIG. 3 described above. The processing of this operation is performed, for example, for each pixel row of the pixel array unit 11 or for each of a plurality of pixel rows in a predetermined scanning order. Note that FIG. 10 illustrates timing charts of horizontal synchronization signal XHS, and drive signals SEL, RST, FDG, TRG, TGS, and FCG.

First, at time $t_1$, the horizontal synchronization signal XHS is input to start the exposure processing of the unit pixel 100.

Next, at time $t_2$, the drive signals RST and FDG are turned on to turn on the reset transistor 108 and the second transfer transistor 104, respectively. This couples the potentials of the FD portion 107 the node 112 to each other, and the potential of the coupled region is reset to the level of the power supply voltage VDD.

Next, at time $t_3$, the drive signal TRG is turned on to turn on the first transfer transistor 103. With this operation, the charge accumulated in the photoelectric conversion unit of the first photoelectric conversion element 101 is transferred via the first transfer transistor 103 to the region where the potentials of the FD portion 107 and the node 112 are coupled, and the photoelectric conversion unit of the first photoelectric conversion element 101 is reset.

In the following description, the photoelectric conversion unit of the first photoelectric conversion element 101 is simply referred to as the first photoelectric conversion element 101 unless otherwise specified. Similarly, the photoelectric conversion unit of the second photoelectric conversion element 102 will be simply described as the second photoelectric conversion element 102.

Next, at time $t_4$, the drive signal TRG is turned off to turn off the first transfer transistor 103. This starts accumulation of charges in the first photoelectric conversion element 101 to start the exposure period.

Next, at time $t_5$, the drive signals TGS and FCG are turned on to turn on the fourth transfer transistor 106 and the third transfer transistor 105, respectively. As a result, the potentials of the node 113, the FD portion 107, and the node 112 are coupled. Furthermore, the charge accumulated in the second photoelectric conversion element 102 is transferred via the fourth transfer transistor 106 to the coupled region, and the second photoelectric conversion element 102 and the node 113 are reset.

Next, at time $t_6$, the drive signal TGS is turned off to turn off the fourth transfer transistor 106. This starts accumulation of charges in the second photoelectric conversion element 102.

Next, at time $t_7$, the drive signal FCG is turned off to turn off the third transfer transistor 105. With this operation, the node 113 starts accumulation of a charge that overflows from the second photoelectric conversion element 102 and transferred via the overflow path of the fourth transfer transistor 106.

Next, at time $t_8$, the drive signals RST and FDG are turned off to turn off the reset transistor 108 and the second transfer transistor 104, respectively.

Subsequently, at time $t_9$, the horizontal synchronization signal XHS is input.

(Operation Example at the Time of Readout)

Figure 11:
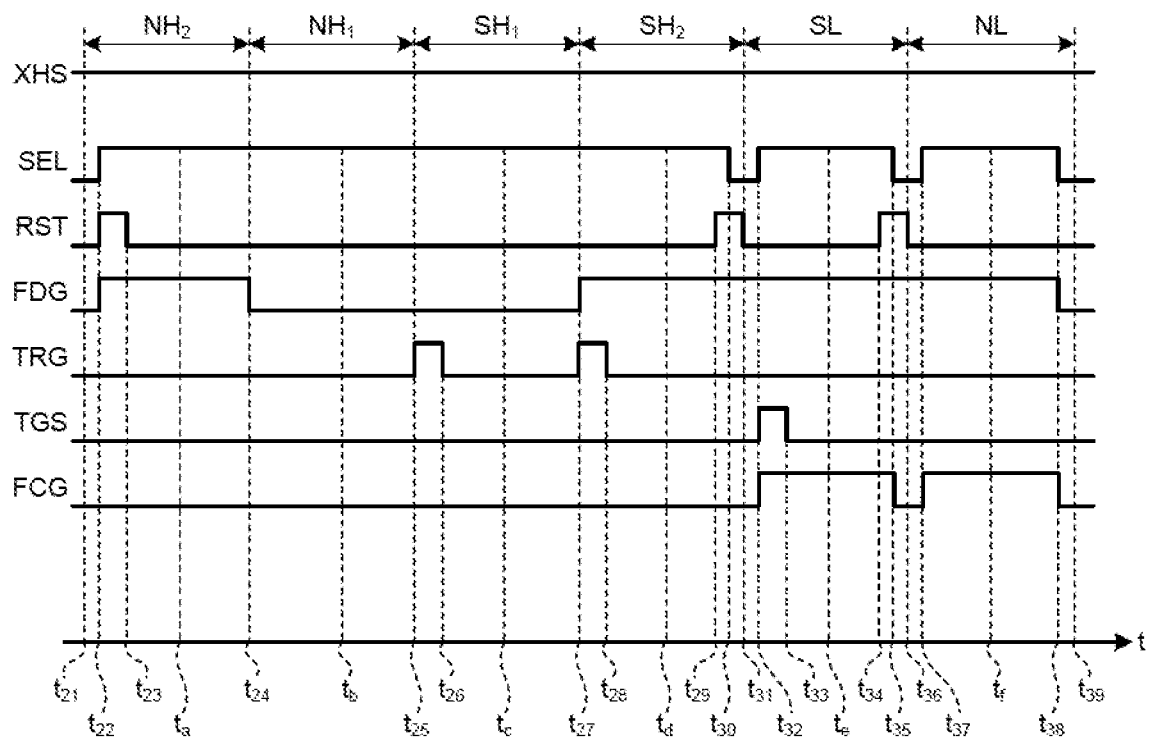
FIG. 11 is a timing chart illustrating an operation example of a unit pixel at the time of readout applicable to each embodiment.

Next, a first operation example at the time of readout of the pixel signal of the unit pixel 100 will be described with reference to a timing chart of FIG. 11. The processing of this operation is performed in the pixel array unit 11 for each pixel row or each of a plurality of pixel rows, for example, in a predetermined scanning order after a predetermined time from the execution of the processing of FIG. 10. Note that FIG. 11 illustrates timing charts of horizontal synchronization signal XHS, and drive signals SEL, RST, FDG, TRG, TGS, and FCG.

First, at time $t_{21}$, the horizontal synchronization signal XHS is input, and the readout period of the unit pixel 100 starts.

Next, at time $t_{22}$, the drive signals SEL, RST, and FDG are turned on to turn on the selection transistor 110, the reset transistor 108, and the second transfer transistor 104, respectively. This sets the unit pixel 100 in a selected state. This also couples the potentials of the FD portion 107 the node 112 to each other, and the potential of the coupled region is reset to the level of the power supply voltage VDD.

Next, at time $t_{23}$, the drive signal RST is turned off to turn off the reset transistor 108.

Next, at time to between time $t_{23}$ and time $t_{24}$, a signal $NH_2$, which is based on the potential of the region where the potentials of the FD portion 107 and the node 112 are coupled, is output to the vertical signal line VSL via the amplification transistor 109 and the selection transistor 110. The signal $NH_2$ is a signal based on the potential in the reset state of the region in which the potentials of the FD portion 107 and the node 112 are coupled.

Note that, hereinafter, the signal $NH_2$ is also referred to as a high-sensitivity reset signal $NH_2$.

Next, at time $t_{24}$, the drive signal FDG is turned off to turn off the second transfer transistor 104. This cancels the potential coupling between the FD portion 107 and the node 112.

Next, at time $t_b$ between time $t_{24}$ and time $t_{25}$, a signal $NH_1$ based on the potential of the FD portion 107 is output to the vertical signal line VSL via the amplification transistor 109 and the selection transistor 110. The signal $NH_1$ is a signal based on the potential in the reset state of the FD portion 107.

Note that, hereinafter, the signal $NH_1$ is also referred to as a high-sensitivity reset signal $NH_1$.

Next, at time $t_{25}$, the drive signal TRG is turned on, and the first transfer transistor 103 is turned on. With this operation, the charge generated and accumulated in the first photoelectric conversion element 101 during the exposure period is transferred to the FD portion 107 via the first transfer transistor 103.

At time $t_{25}$, readout of the pixel signal is started, and the exposure period ends.

Next, at time $t_{26}$, the drive signal TRG is turned off to turn off and the first transfer transistor 103. This stops the transfer of the charge from the first photoelectric conversion element 101 to the FD portion 107.

Next, at time $t_c$ between time $t_{26}$ and time $t_{27}$, a signal $SH_1$ based on the potential of the FD portion 107 is output to the vertical signal line VSL via the amplification transistor 109 and the selection transistor 110. The signal $SH_1$ is a signal based on the potential of the FD portion 107 in a state where charges generated and accumulated in the first photoelectric conversion element 101 during the exposure period are accumulated in the FD portion 107.

Hereinafter, the signal $SH_1$ is also referred to as a high-sensitivity data signal $SH_1$.

Next, at time $t_{27}$, the drive signals FDG and TRG are turned on to turn on the second transfer transistor 104 and the first transfer transistor 103. With this operation, the potentials of the FD portion 107 and the node 112 are coupled, and the charge remaining in the first photoelectric conversion element 101 without being transferred from the time $t_{25}$ to the time $t_{26}$ is transferred to the coupled region via the first transfer transistor 103. Note that, at the time of readout of the high-sensitivity data signal $SH_1$, the capacitance for charge-voltage conversion is small with respect to the charge amount to be handled, and thus, there is no problem to have a charge remaining in the first photoelectric conversion element 101. The charge remaining in the first photoelectric conversion element 101 only needs to be able to be transferred at the time of readout of the high-sensitivity data signal $SH_2$, and would not cause damage by the charge in the first photoelectric conversion element 101.

Next, at time $t_{28}$, the drive signal TRG is turned off to turn off the first transfer transistor 103. This stops the transfer of charges from the first photoelectric conversion element 101 to the region where the potentials of the FD portion 107 and the node 112 are coupled.

Next, at time td between time $t_{28}$ and time $t_{29}$, a signal $SH_2$ based on the potential of the region obtained by coupling the potentials of the FD portion 107 and the node 112 is output to the vertical signal line VSL via the amplification transistor 109 and the selection transistor 110. The signal $SH_2$ is a signal based on the potential of the coupled region in a state where the charge generated and accumulated in the first photoelectric conversion element 101 during the exposure period is accumulated in the region where the potentials of the FD portion 107 and the node 112 are coupled. Therefore, the capacitance for charge-voltage conversion at the time of readout of the signal $SH_2$ is the combined capacitance of the FD portion 107 and the node 112, and becomes larger than that at the time of readout of the high-sensitivity data signal $SH_1$ at the time $t_c$.

Hereinafter, the signal $SH_2$ is also referred to as a high-sensitivity data signal $SH_2$.

Next, at time $t_{29}$, the drive signal RST is turned on, and the reset transistor 108 is turned on. With this operation, the potential of the region where the potentials of the FD portion 107 and the node 112 are coupled is reset to the level of the power supply voltage VDD.

Next, at time $t_{30}$, the drive signal SEL is turned off to turn off the selection transistor 110. This sets the unit pixel 100 in a non-selected state.

Next, at time $t_{31}$, the drive signal RST is turned off, and the reset transistor 108 is turned off.

Next, at time $t_{32}$, the drive signals SEL, TGS, and FCG are turned on, and the selection transistor 110, the fourth transfer transistor 106, and the third transfer transistor 105 are turned on. This sets the unit pixel 100 in a selected state. Furthermore, the potentials of the node 113, the FD portion 107, and the node 112 are coupled, and the charge accumulated in the second photoelectric conversion element 102 is transferred to the coupled region. With this operation, the charges accumulated in the second photoelectric conversion element 102 and the node 113 during the exposure period are accumulated in the coupled region.

Next, at time $t_{33}$, the drive signal TGS is turned off, and the fourth transfer transistor 106 is turned off. This stops the transfer of the charge from the second photoelectric conversion element 102.

Next, at time to between time $t_{33}$ and time $t_{34}$, a signal SL based on the potential of the region in which the potentials of the node 113, the FD portion 107, and the node 112 are coupled is output to the vertical signal line VSL via the amplification transistor 109 and the selection transistor 110. The signal SL is a signal based on the potential of the coupled region in a state where the charges generated in the second photoelectric conversion element 102 during the exposure period and accumulated in the second photoelectric conversion element 102 and the node 113 are accumulated in the region where the potentials of the node 113, the FD portion 107, and the node 112 are coupled. Therefore, the capacitance for charge-voltage conversion at the time of readout of the signal SL is a capacitance obtained by combining the node 113, the FD portion 107, and the node 112. This capacitance is larger than that at the time of readout of the high-sensitivity data signal $SH_1$ at the time $t_c$ and at the time of readout of the high-sensitivity data signal $SH_2$ at the time td.

Note that the signal SL is also referred to as a low-sensitivity data signal SL.

Next, at time $t_{34}$, the drive signal RST is turned on to turn on the reset transistor 108. As a result, the region in which the potentials of the node 113, the FD portion 107, and the node 112 are coupled is reset.

Next, at time $t_{35}$, the drive signals SEL and FCG are turned off to turn off the selection transistor 110 and the third transfer transistor 105, respectively. This sets the unit pixel 100 in a non-selected state. Furthermore, the potential of the node 113 is separated from the potentials of the FD portion 107 and the node 112.

Next, at time $t_{36}$, the drive signal RST is turned off to turn off the reset transistor 108.

Next, at time $t_{37}$, the drive signals SEL and FCG are turned on to turn on the selection transistor 110 and the third transfer transistor 105, respectively. This sets the unit pixel 100 in a selected state. Furthermore, the potential of the node 113 is coupled with the potentials of the FD portion 107 and the node 112.

Next, at time $t_f$ between time $t_{37}$ and time $t_{38}$, a signal NL based on the potential of the region where the potentials of the node 113, the FD portion 107, and the node 112 are coupled is output to the vertical signal line VSL via the amplification transistor 109 and the selection transistor 110. The signal NL is a signal based on the potential in the reset state of the region in which the potentials of the node 113, the FD portion 107, and the node 112 are coupled.

Note that the signal NL is also referred to as a low-sensitivity reset signal NL.

Next, at time $t_{38}$, the drive signals SEL, FDG, and FCG are turned off to turn off the selection transistor 110, the second transfer transistor 104, and the third transfer transistor 105, respectively. This sets the unit pixel 100 in a non-selected state. Furthermore, the potential coupling among the node 113, the FD portion 107, and the node 112 is resolved.

Next, at time $t_{39}$, the horizontal synchronization signal XHS is input, and the readout period of the pixel signal of the unit pixel 100 ends.

2. First Embodiment

Next, a first embodiment of the present disclosure will be described. The first embodiment relates to the CMOS image sensor 10 as the above-described imaging element, and relates to the arrangement of the accumulation portion that accumulates the charge in the unit pixel 100, and particularly relates to the arrangement of the node 113, which is a floating diffusion layer that accumulates the charge generated in the second photoelectric conversion element 102, in the pixel including the second photoelectric conversion element 102. Hereinafter, the node 113 is also referred to as an accumulation portion.

Furthermore, compared with the small pixel including the second photoelectric conversion element 102, the large pixel including the first photoelectric conversion element 101 has a larger light receiving surface area and thus higher sensitivity to incident light, for example. Therefore, unless otherwise specified, a large pixel will be described as a high-sensitivity pixel, and a small pixel will be described as a low-sensitivity pixel, within the unit pixel 100.

In the FD accumulation type pixel structure, direct entry of light or electrons into the FD portion causes crosstalk and significant deterioration of parasitic light sensitivity (PLS). In particular, in the case where an FD accumulation type low-sensitivity pixel is used in a pixel structure in which pixels having different sensitivities are combined for the purpose of supporting a high dynamic range, incidence of light from the high-sensitivity pixel directly to the FD portion of the low-sensitivity pixel might lead to significant deterioration in characteristics.

For example, in Patent Literature 2, an FD accumulation type pixel structure is formed by connecting MOS capacitance to a low-sensitivity pixel. However, with no description regarding the position related to the FD portion is given in Patent Literature 2, avoidance of deterioration of the characteristics as described above is considered to be difficult.

By disposing the accumulation portion at an appropriate position in the unit pixel 100, the first embodiment makes it possible to suppress deterioration of characteristics due to incidence of light that has been incident on the high-sensitivity pixel to the low-sensitivity pixel.

Figure 12A:
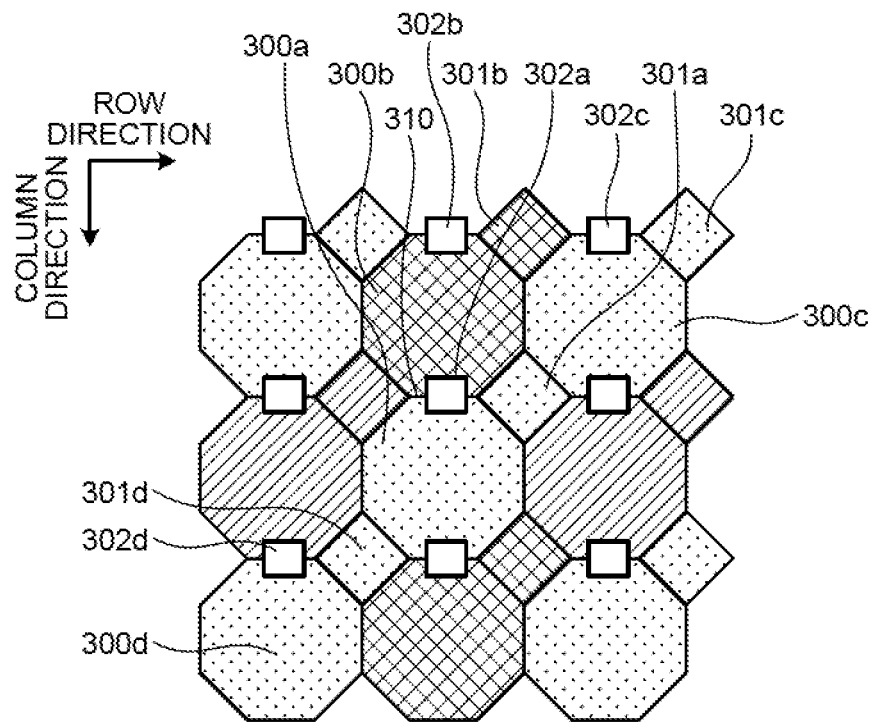
FIG. 12A is a plan view of an example of a pixel schematically illustrating an arrangement position of an accumulation portion according to a first embodiment.
Figure 12B:
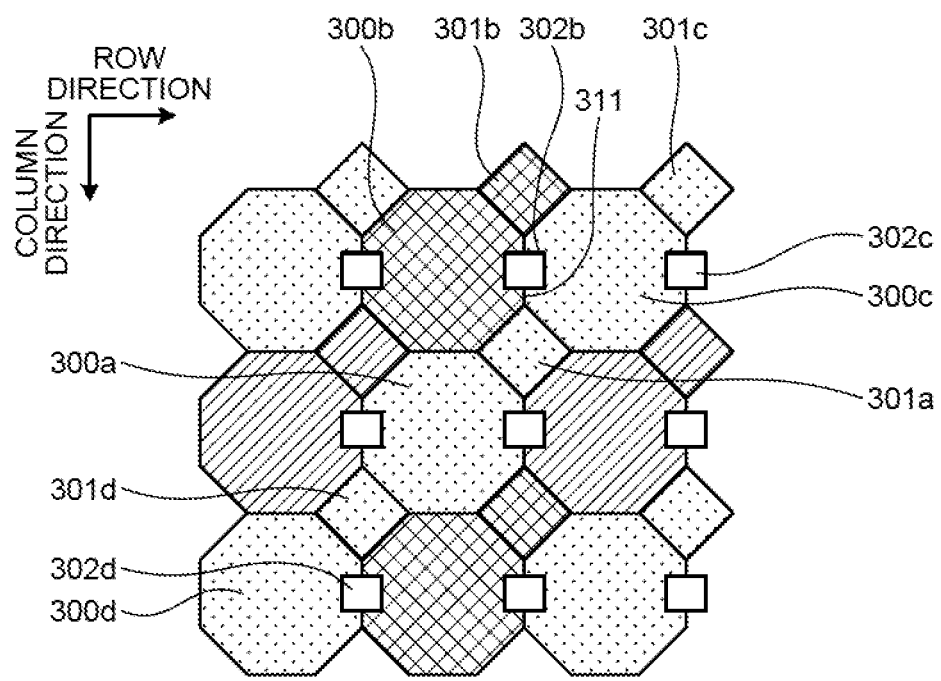
FIG. 12B is a plan view of an example of a pixel schematically illustrating an arrangement position of the accumulation portion according to the first embodiment.
Figure 12C:
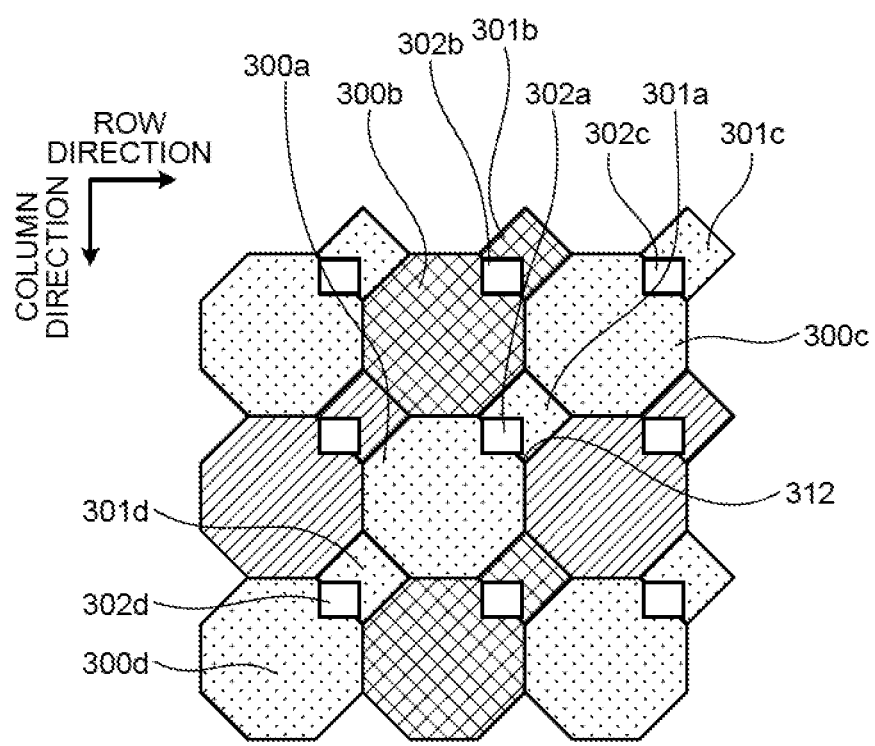
FIG. 12C is a plan view schematically illustrating an example in which the accumulation portion is disposed at an inappropriate position.

FIGS. 12A, 12B, and 12C are plan views of an example of a pixel, schematically illustrating arrangement positions of accumulation portions. FIGS. 12A and 12B are diagrams illustrating examples of appropriate arrangement of the accumulation portions according to the first embodiment. In contrast, FIG. 12C is a plan view schematically illustrating an example in which the accumulation portions are disposed at inappropriate positions. FIGS. 12A to 12C and subsequent similar plan views are schematic diagrams viewed from the opposite side of the incident surface of the pixel, for example, the side of the wiring layer 271 in FIG. 9. In FIGS. 12A to 12C, the vertical direction in the drawing is defined as a column direction of the pixel array unit 11, and the horizontal direction is defined as a row direction of the pixel array unit 11.

Note that these drawings omit configurations other than the first color filter 121 and the second color filter 122 of each color and the accumulation portion illustrated in FIG. 9, and include configurations corresponding to the inter-pixel light-shielding portion 181 as necessary. The first color filter 121 and the second color filter 122 will be simply described as color filters.

In FIGS. 12A to 12C, a high-sensitivity pixel 300a and a low-sensitivity pixel 301a, which are provided with a color filter that transmits an identical wavelength component (green, for example) and arranged adjacent to each other, constitute one unit pixel. An accumulation portion 302a corresponds to the node 113 in FIGS. 3 and 4, for example, and is provided corresponding to the low-sensitivity pixel 301a. Similarly, a set of a high-sensitivity pixel 300c and a low-sensitivity pixel 301c, and a set of a high-sensitivity pixel 300d and a low-sensitivity pixel 301d, each set being provided with a green color filter and arranged adjacent to each other, constitute one unit pixel each. Furthermore, accumulation portions 302c and 302d are respectively provided corresponding to the low-sensitivity pixels 301c and 301d of the unit pixels. Furthermore, a high-sensitivity pixel 300b and a low-sensitivity pixel 301b, which are provided with a color filter that transmits an identical wavelength component (red, for example) and arranged adjacent to each other, constitute one unit pixel. An accumulation portion 302b is provided corresponding to the low-sensitivity pixel 301b.

The unit pixel including the high-sensitivity pixel 300b and the low-sensitivity pixel 301b is arranged adjacent to the unit pixel including the high-sensitivity pixel 300a and the low-sensitivity pixel 301a in the column direction. At this time, in each unit pixel, one side of the high-sensitivity pixel 300a and one side of the high-sensitivity pixel 300b are in contact with each other at a boundary 310, while one side of the low-sensitivity pixel 301a and the other side of the high-sensitivity pixel 300b are in contact with each other.

With respect to the unit pixel including the high-sensitivity pixel 300a and the low-sensitivity pixel 301a, a unit pixel including the high-sensitivity pixel 300c and the low-sensitivity pixel 301c and a unit pixel including the high-sensitivity pixel 300d and the low-sensitivity pixel 301d are arranged adjacent in a direction of a line connecting the centers of the high-sensitivity pixel 300a and the low-sensitivity pixel 301a.

In FIG. 12A which is an appropriate first arrangement example of the accumulation portions, the accumulation portion 302a corresponding to the low-sensitivity pixel 301a is disposed at a position corresponding to the boundary 310 where the high-sensitivity pixel 300a and the high-sensitivity pixel 300b are in contact with each other in the column direction. For example, the accumulation portion 302a is disposed at a position across the boundary 310 as a position corresponding to the boundary 310. Similarly, the other accumulation portions 302b, 302c, and 302d are disposed at boundaries between the high-sensitivity pixels 300b, 300c, and 300d of the unit pixels including the corresponding low-sensitivity pixels 301b, 301c, and 301d, respectively, and the high-sensitivity pixels adjacent to the high-sensitivity pixels 300b, 300c, and 300d in the column direction.

In the following description, when there is no need to distinguish the high-sensitivity pixels 300a to 300d, each of the high-sensitivity pixels 300a to 300d will be appropriately described as the high-sensitivity pixel 300. Furthermore, in a case where it is not necessary to distinguish the low-sensitivity pixels 301a to 301d, each of the low-sensitivity pixels 301a to 301d will be appropriately described as the low-sensitivity pixel 301. Similarly, when there is no need to distinguish the accumulation portions 302a to 302d, each of the accumulation portions 302a to 302d will be appropriately described as the accumulation portion 302.

In FIG. 12B which is an appropriate second arrangement example of the accumulation portion, the unit pixel including the high-sensitivity pixel 300c and the low-sensitivity pixel 301c is adjacent to the unit pixel including the high-sensitivity pixel 300b and the low-sensitivity pixel 301b in the row direction. In the example of FIG. 12B, the accumulation portion 302b corresponding to the low-sensitivity pixel 301b is arranged at a position corresponding to a boundary 311 where the high-sensitivity pixel 300b and the high-sensitivity pixel 300c are in contact with each other in the row direction. Similarly, the other accumulation portions 302b, 302c, and 302d are arranged at boundaries between the high-sensitivity pixels 300b, 300c, and 300d of the unit pixels including the corresponding low-sensitivity pixels 301b, 301c, and 301d, respectively, and the high-sensitivity pixels adjacent to the high-sensitivity pixels 300b, 300c, and 300d in the row direction.

In contrast, according to FIG. 12C, which is an inappropriate arrangement example of the accumulation portion, the accumulation portion 302a is arranged at a position corresponding to a boundary 312 where the high-sensitivity pixel 300a and the low-sensitivity pixel 301a are in contact with each other, for example. Similarly, the other accumulation portions 302b, 302c, and 302d are arranged at the boundaries where the corresponding low-sensitivity pixels 301b, 301c, and 301d and the corresponding high-sensitivity pixels 300b, 300c, and 300d are in contact with each other, respectively.

Here, the direction of connecting the high-sensitivity pixel 300 and the low-sensitivity pixel 301 is a direction in which leakage (crosstalk) of incident light from the high-sensitivity pixel to the second photoelectric conversion element 102 of the low-sensitivity pixel is the greatest. Furthermore, in a case where the accumulation portion 302 of the low-sensitivity pixel 301 is arranged in the direction of connecting the high-sensitivity pixel 300 and the low-sensitivity pixel 301, the crosstalk from the high-sensitivity pixel 300 to the accumulation portion 302 of the low-sensitivity pixel 301 is the greatest. In the example of FIG. 12C, the direction in which the crosstalk from the high-sensitivity pixel to the second photoelectric conversion element 102 of the low-sensitivity pixel is the greatest is aligned with the direction in which the crosstalk from the high-sensitivity pixel 300 to the accumulation portion 302 of the low-sensitivity pixel 301 is the greatest.

In contrast, in the examples of FIGS. 12A and 12B, the crosstalk from the high-sensitivity pixel 300 to the second photoelectric conversion element 102 of the low-sensitivity pixel 301 is equivalent to that in the example of FIG. 12C. However, in the examples of FIGS. 12A and 12B, the arrangement position of the accumulation portion 302 of the low-sensitivity pixel 301 is not in the direction in which the crosstalk from the high-sensitivity pixel 300 to the accumulation portion 302 of the low-sensitivity pixel 301 is the worst. Therefore, the arrangements of FIGS. 12A and 12B are advantageous in terms of crosstalk from the high-sensitivity pixel 300 to the accumulation portion 302 of the low-sensitivity pixel 301 compared to the arrangement of FIG. 12C.

Hereinafter, "crosstalk from the high-sensitivity pixel 300 to the second photoelectric conversion element 102 of the low-sensitivity pixel 301" will be appropriately described as "crosstalk from the high-sensitivity pixel 300 to the low-sensitivity pixel 301".

FIG. 13 is a cross-sectional view schematically illustrating a structure of an example of a pixel in a case where the accumulation portion 302 is disposed at an appropriate position according to the first embodiment. FIG. 13 corresponds to FIG. 12A described above. The right diagram of FIG. 13 illustrates positions of an A-A' cross section and a B-B' cross section in the arrangement of FIG. 12A.

The left diagram in FIG. 13 is a diagram illustrating the A-A' cross section that is a cross section taken along a line connecting the center of the high-sensitivity pixel and the center of the low-sensitivity pixel in the pixel unit in the configuration of the right diagram in FIG. 13. Furthermore, the central diagram in FIG. 13 is a diagram illustrating a B-B' cross section which is a cross section taken along a line connecting the centers of the high-sensitivity pixels aligned in the column direction in the configuration of the right diagram in FIG. 13.

As illustrated in the cross-sectional views taken along line A-A' and line B-B' in FIG. 13, the wiring layer 271 (refer to FIG. 9) is stacked on a support substrate (not illustrated), and a semiconductor layer 330 including the P-well region 241 (refer to FIG. 9) is further stacked on the wiring layer 271. A color filter 320 is provided on the incident surface side of the semiconductor layer 330, and an on-chip lens 322 is provided on the incident surface side of the color filter 320.

As illustrated in the cross-sectional view taken along line A-A', there is a trench light-shielding portion 303 corresponding to the above-described inter-pixel light-shielding portion 181 as a portion dug down in a layer direction provided at the boundary 312 between the high-sensitivity pixel 300a and the low-sensitivity pixels 301c and 301d.

Similarly, as illustrated in the cross-sectional view taken along line B-B', the trench light-shielding portion 303 is provided at the boundary 310 between the high-sensitivity pixel 300a and the high-sensitivity pixel 300b as a portion dug down in the layer direction.

Here, arranging the accumulation portion 302a corresponding to the low-sensitivity pixel 301a in the region of the low-sensitivity pixel 301a would be difficult in terms of area limitation. Therefore, the arrangement position of the accumulation portion 302a is a point. In the first embodiment, the accumulation portion 302a is arranged at a boundary between pixels. Since the trench light-shielding portion 303 is provided at the boundary, it is possible to suppress direct light incidence (indicated by a path S in the drawing) and blooming from adjacent pixels to the accumulation portion 302a.

Note that, also in FIG. 12B described above, the accumulation portion 302 is arranged in a portion corresponding to the boundary between the high-sensitivity pixels. Therefore, similarly to the example of the central diagram in FIG. 13, it is possible to suppress direct light incidence and blooming from adjacent pixels to the accumulation portion by the trench light-shielding portion 303 provided at the boundary.

Figure 14:
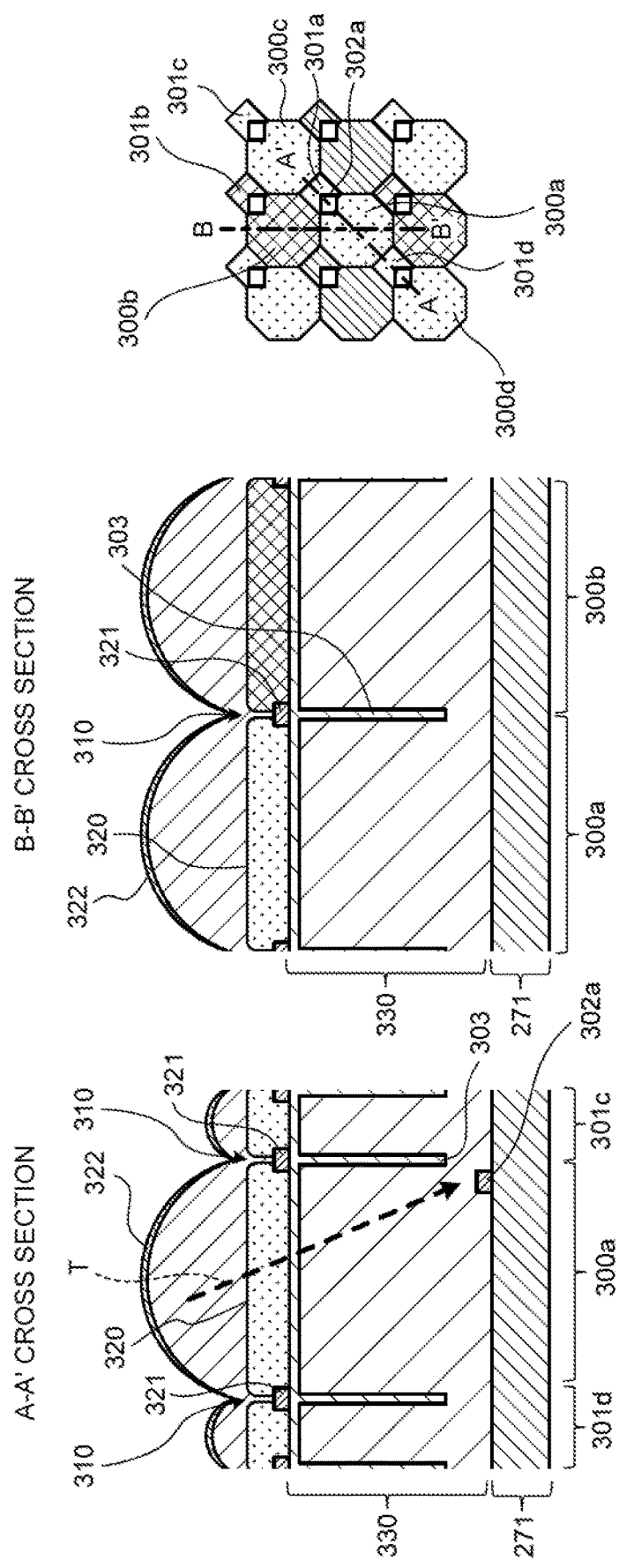
FIG. 14 is a cross-sectional view schematically illustrating a structure of an example of a pixel in a case where an accumulation portion is disposed at an inappropriate position.

FIG. 14 is a cross-sectional view schematically illustrating a structure of an example of a pixel in a case where the accumulation portion 302 is disposed at an inappropriate position. FIG. 14 corresponds to FIG. 12C described above. The right diagram of FIG. 14 illustrates positions of an A-A' cross section and a B-B' cross section in the arrangement of FIG. 12C.

In this example, for example, the accumulation portion 302a is arranged at the boundary 312 between the high-sensitivity pixel 300a and the low-sensitivity pixel 301a. Here, as described above, since it is difficult to arrange the accumulation portion 302a in the region of the low-sensitivity pixel 301a, the accumulation portion 302a is actually arranged closer to the high-sensitivity pixel 300a side, for example. Therefore, the accumulation portion 302a is arranged on the front side of the trench light-shielding portion 303 provided at the boundary 310 when viewed from the high-sensitivity pixel 300a side. Therefore, this arrangement has a possibility that light from the high-sensitivity pixel 300a is directly incident on the accumulation portion 302a (indicated by a path T in the drawing) together with a possibility of occurrence of blooming.

Note that, depending on the layout, it is also conceivable that the accumulation portion 302a can be arranged at a position corresponding to the boundary 312 being a boundary between the high-sensitivity pixel 300a and the low-sensitivity pixel 301a, similarly to the central diagram of FIG. 13. In this case, with the accumulation portion 302a being disposed in the boundary 312, it is also possible to suppress direct incidence of light from an adjacent pixel to the accumulation portion 302a and occurrence of blooming.

Note that, also in this case, as described with reference to FIGS. 12A and 12B, a higher effect can be obtained by arranging the accumulation portion 302a not in the direction of the line connecting the high-sensitivity pixel 300a and the low-sensitivity pixel 301a but at the boundary between the high-sensitivity pixel 300a and another high-sensitivity pixel adjacent to the high-sensitivity pixel 300a. As described above, this effect is because of non-alignment between the direction in which the crosstalk from the high-sensitivity pixel 300a to the second photoelectric conversion element 102 of the low-sensitivity pixel 301a is the worst and the direction in which the crosstalk from the high-sensitivity pixel 300a to the accumulation portion 302a of the low-sensitivity pixel 301a is the worst.

(2-1. First Modification)

Next, a first modification of the first embodiment will be described. The first modification of the first embodiment is an example in which the accumulation portion 302 is arranged at a position corresponding to the direction of the angle of view with respect to the pixel array unit 11 in which the unit pixels are arranged in a matrix array. Note that, when the pixel array unit 11 is mounted on an imaging device or the like, a main lens is arranged on the incident surface side with an optical axis aligned with the center of the pixel array unit 11.

Figure 15A:
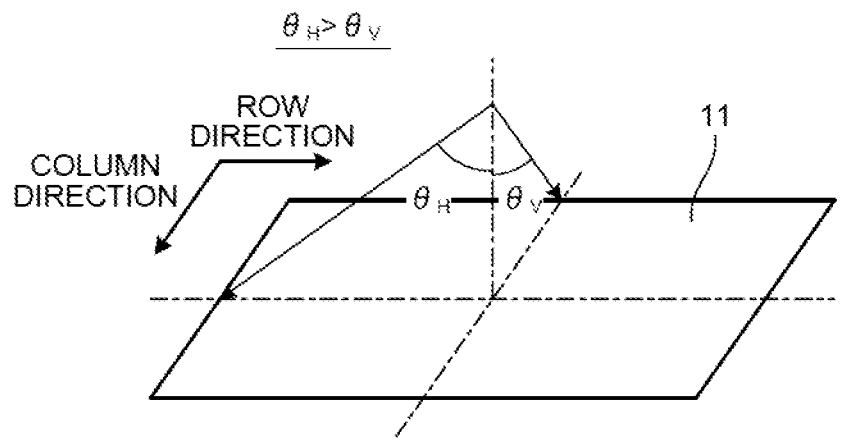
FIG. 15A is a diagram illustrating an example of a case where an angle of view of the pixel array unit with respect to a row direction is wide in a column direction.

FIG. 15A is a diagram illustrating an example of a case where an angle of view of the pixel array unit 11 with respect to the row direction is wide in the column direction. That is, the pixel array unit 11 illustrated in FIG. 15A has a long side in the row direction. In FIG. 15A, in the pixel array unit 11, the side in the row direction is a long side, and thus, an incident angle $\theta_H$ at the end of a pixel array unit 11a is larger than an incident angle $\theta_V$ at the end in the column direction. Therefore, crosstalk of the incident light to the adjacent pixel will be more disadvantageous in the row direction compared to the column direction.

Figure 15B:
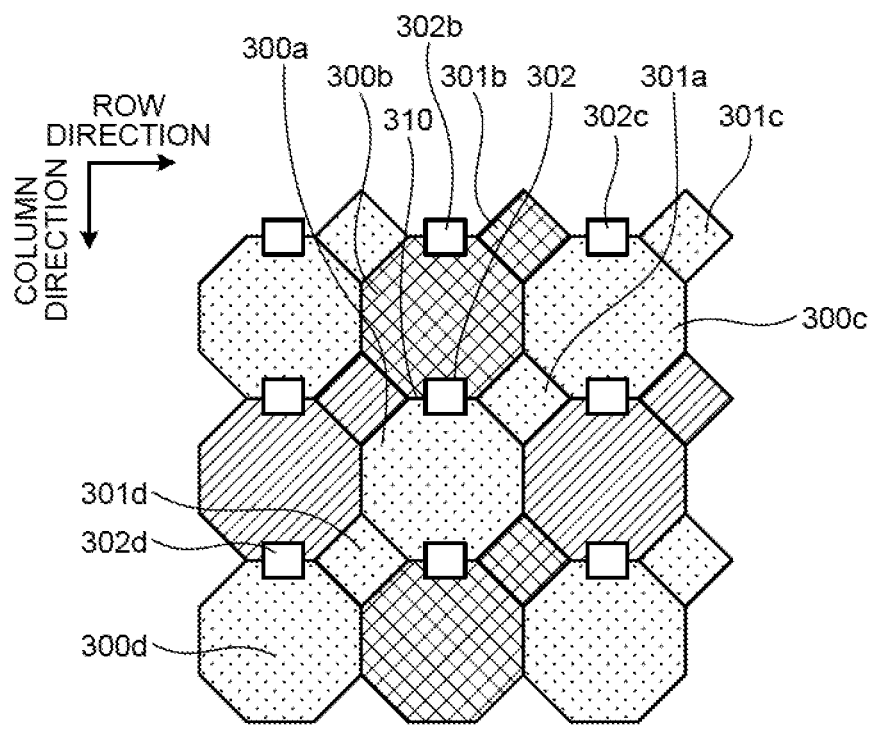
FIG. 15B is a diagram illustrating an example of arrangement of accumulation portion in a case where the angle of view with respect to the pixel array unit is wide in the row direction according to a first modification of the first embodiment.

FIG. 15B is a diagram illustrating an example of arrangement of the accumulation portion 302 with respect to the pixel array unit 11 illustrated in FIG. 15A according to the first modification of the first embodiment. Although FIG. 15B is the same illustration as FIG. 12A described above, this figure is repeatedly used here for reference. In this case, as described above, crosstalk of the incident light to the adjacent pixel is more disadvantageous in the row direction compared to the column direction, and thus, the accumulation portion 302 of the low-sensitivity pixel 301 is arranged at the boundary of the high-sensitivity pixel 300 arranged adjacent to the low-sensitivity pixel in the column direction. In the example of FIG. 15B, the accumulation portions 302b, 302a, . . . of the low-sensitivity pixels 301b, 301a, . . . are arranged for the respective boundaries 310 which are in contact with the respective high-sensitivity pixels 300b, 300a, . . . sequentially adjacent in the column direction.

In this manner, when the angle of view in the row direction with respect to the pixel array unit 11 is larger than the angle of view in the column direction, the accumulation portion 302 of the low-sensitivity pixel 301 is arranged at each boundary 310 of the high-sensitivity pixels 300 sequentially adjacent in the column direction. In other words, each boundary 310 runs in the direction of the long side of the pixel array unit 11, and the accumulation portion 302 is arranged at the boundary 310 in the direction of the long side of the pixel array unit 11. With this arrangement, the incident angle $\theta_V$ of the incident light with respect to each accumulation portion 302 can be set to a relatively low angle with respect to the incident angle $\theta_H$, as compared with a case where the accumulation portion 302 is arranged at each boundary 311 of each high-sensitivity pixel 300 sequentially adjacent in the row direction. Therefore, it is possible to suppress crosstalk with respect to the accumulation portion 302 of the low-sensitivity pixel 301.

Figure 16A:
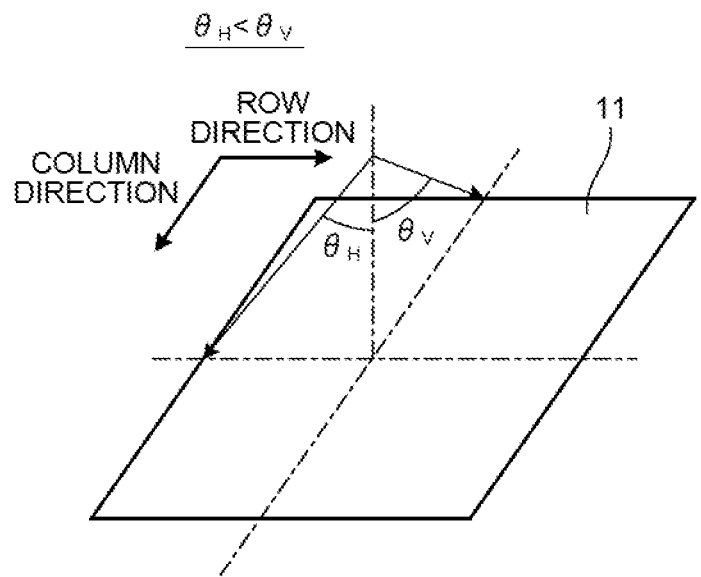
FIG. 16A is a view illustrating an example in a case where the angle of view of the pixel array unit with respect to the column direction is wider than the angle of view with respect to the row direction.

FIG. 16A is a view illustrating an example in a case where the angle of view of the pixel array unit 11 with respect to the column direction is wider than the angle of view with respect to the row direction. That is, the pixel array unit 11 illustrated in FIG. 16A has a long side in the column direction. In FIG. 16A, the side in the column direction is a long side in the pixel array unit 11, and the incident angle $\theta$ of the incident light from the main lens at the end of the pixel array unit 11b is characterized in that the incident angle $\theta_V$ at the end in the column direction is larger than the incident angle $\theta_H$ at the end in the row direction. Therefore, crosstalk of the incident light to the adjacent pixel is more disadvantageous in the column direction compared to the row direction.

Figure 16B:
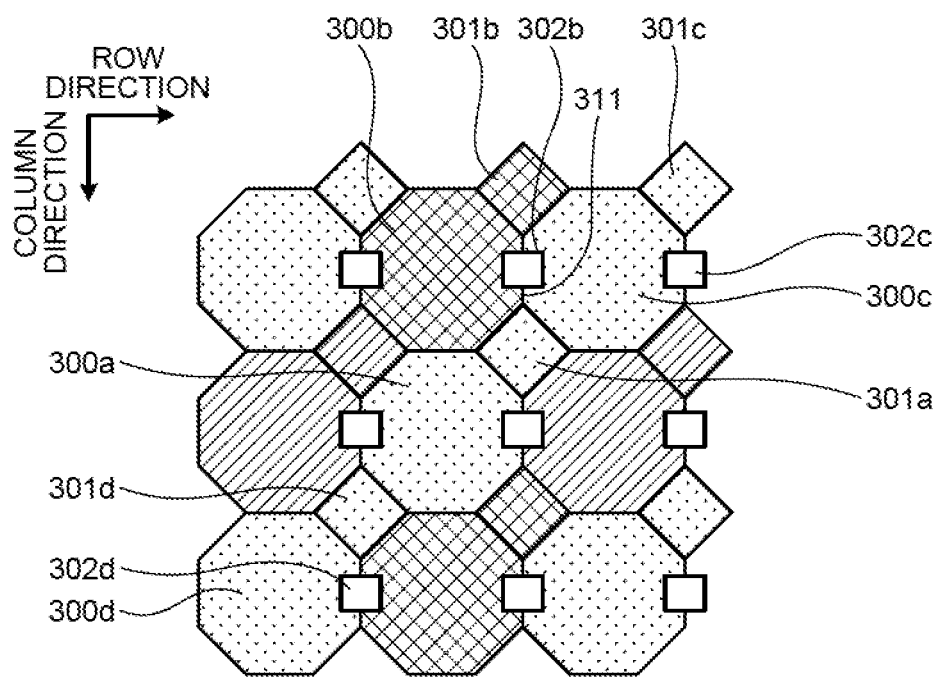
FIG. 16B is a diagram illustrating an example of arrangement of accumulation portion in a case where the angle of view with respect to the pixel array unit 11 is wide in the column direction according to the first modification of the first embodiment.

FIG. 16B is a diagram illustrating an example of arrangement of the accumulation portion 302 in a case where the angle of view with respect to the pixel array unit 11 is wide in the column direction illustrated in FIG. 16A according to the first modification of the first embodiment. Although FIG. 16B is the same illustration as FIG. 12B described above, this figure is repeatedly used here for reference. In this case, as described above, crosstalk of the incident light to the adjacent pixel is more disadvantageous in the column direction compared to the row direction, and thus, the accumulation portion 302 of the low-sensitivity pixel 301 is arranged at the boundary of the high-sensitivity pixel 300 arranged adjacent to the low-sensitivity pixel 301 in the row direction. In the example of FIG. 16B, the accumulation portion 302 of the low-sensitivity pixel 301 is arranged for each boundary 311 with which each of the high-sensitivity pixels 300 sequentially adjacent in the row direction is in contact. In this case, the boundary 311 also runs in the direction of the long side of the pixel array unit 11, and the accumulation portion 302 is disposed at the boundary 311 in the direction of the long side of the pixel array unit 11.

Also in this case, similarly to the case of FIGS. 15A and 15B described above, the accumulation portion 302 of the low-sensitivity pixels 301 is disposed at each boundary 311 of the high-sensitivity pixels 300 sequentially adjacent in the row direction. Therefore, the incident angle $\theta_H$ of the incident light with respect to each accumulation portion 302 can be set to a relatively low angle with respect to the incident angle $\theta_V$, as compared with a case where the accumulation portion 302 is disposed at each boundary 310 of each high-sensitivity pixel 300 sequentially adjacent in the column direction. Therefore, it is possible to suppress crosstalk from the high-sensitivity pixel 300 with respect to the accumulation portion 302 of the low-sensitivity pixel 301.

(2-2. Second Modification)

Figure 17A:
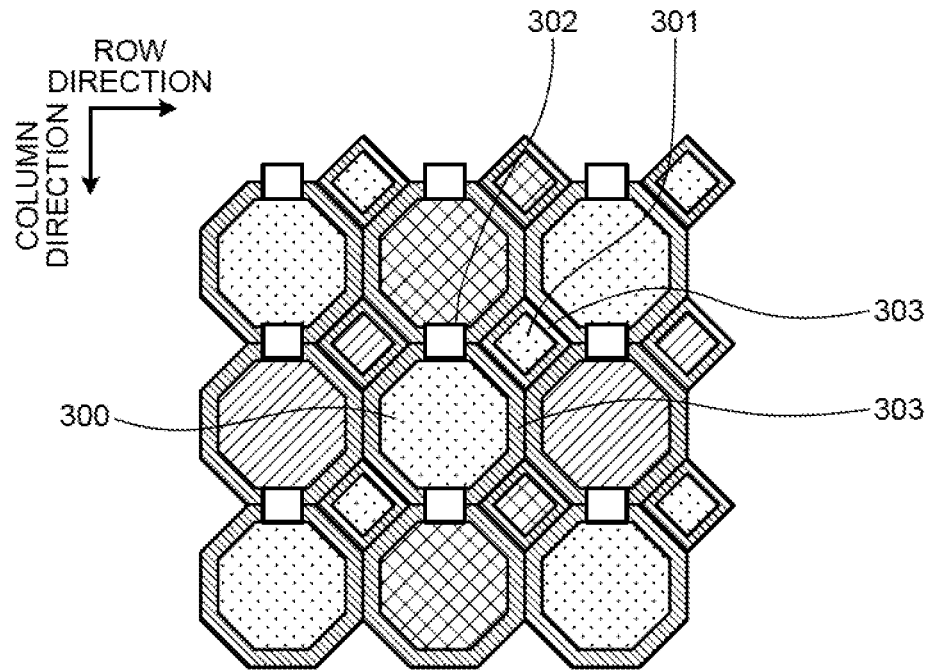
FIG. 17A is a plan view schematically illustrating a first arrangement example of a trench light-shielding portion according to a second modification of the first embodiment.
Figure 17B:
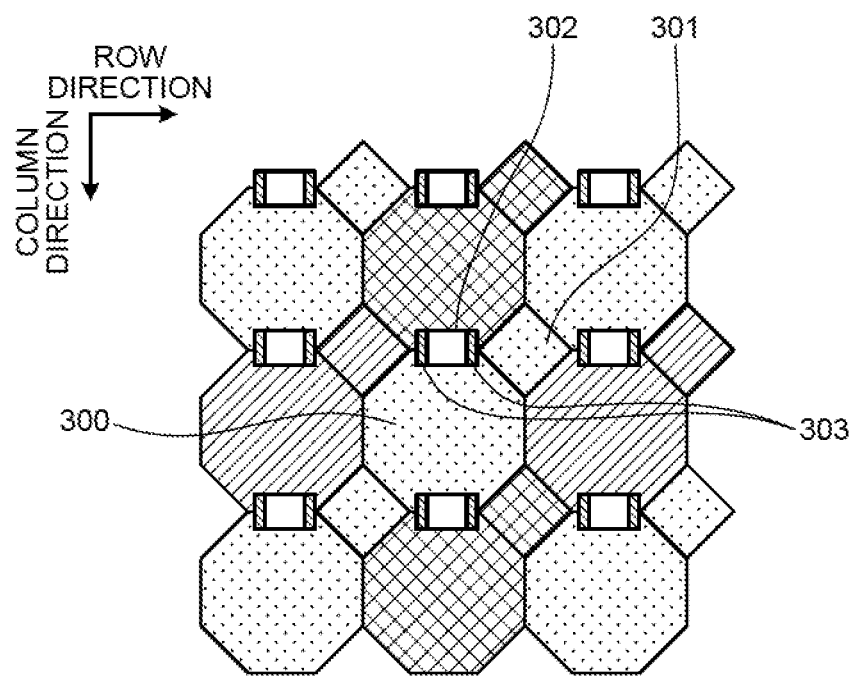
FIG. 17B is a plan view schematically illustrating a second arrangement example of the trench light-shielding portion according to the second modification of the first embodiment.

Next, a second modification of the first embodiment will be described. The second modification of the first embodiment is an example related to the arrangement of the trench light-shielding portion 303. FIG. 17A is a plan view schematically illustrating a first arrangement example of the trench light-shielding portion 303 according to the second modification of the first embodiment. FIG. 17B is a plan view schematically illustrating a second arrangement example of the trench light-shielding portion 303 according to the second modification of the first embodiment. As described above, FIGS. 17A and 17B are plan views when viewed from the wiring layer 271 side in FIG. 9.

The accumulation portion 302 of each low-sensitivity pixel 301 is arranged at a boundary 310 between one high-sensitivity pixel 300 and another high-sensitivity pixel 300 adjacent to the high-sensitivity pixel 300. It is desirable to provide the trench light-shielding portion 303 at the boundary 310 where the accumulation portion 302 is disposed. In the first example illustrated in FIG. 17A, the trench light-shielding portion 303 is provided around each of the high-sensitivity pixels 300 and each of the low-sensitivity pixels 301 without a gap.

The present invention is not limited thereto, and as illustrated in FIG. 17B as a second example, by providing the trench light-shielding portion 303 only to at least the side (that is, the boundary 310) of the high-sensitivity pixel 300 where the accumulation portion 302 is disposed, it is also possible to suppress crosstalk and the like from the high-sensitivity pixel 300 to the accumulation portion 302 of the low-sensitivity pixel 301.

In this manner, in the first embodiment and its modifications, the accumulation portion 302 of the low-sensitivity pixel 301 is arranged at the boundary between the unit pixels, making it possible to suppress leakage of incident light from the high-sensitivity pixel 300 to the accumulation portion 302. This makes it possible to suppress crosstalk from the high-sensitivity pixel 300 to the accumulation portion 302 of the low-sensitivity pixel 301 and the resultant blooming, leading to improvement of color characteristics within the angle of view.

3. Second Embodiment

Next, a second embodiment of the present disclosure will be described. The second embodiment relates to an inter-pixel light-shielding portion 181 (refer to FIGS. 7 to 9) provided to prevent light leakage to adjacent pixels in the CMOS image sensor 10 as the above-described imaging element.

For example, Patent Literature 1 discloses a pixel structure having a pixel unit including high-sensitivity pixels and low-sensitivity pixels having different areas. In this pixel structure, since the sensitivity is greatly different in the high-sensitivity pixel and the low-sensitivity pixel, there is a possibility of occurrence of crosstalk from the high-sensitivity pixel to the low-sensitivity pixel. As a countermeasure against this crosstalk, Patent Literature 1 discloses an example of increasing an inter-pixel light-shielding width on a low-sensitivity pixel side. However, the sensitivity of the low-sensitivity pixel in this case would be significantly reduced, and thus there is a need to perform designing including the sensitivity ratio with the high-sensitivity pixel. Furthermore, deterioration of the characteristics of the low-sensitivity pixel for obliquely incident light and a decrease in sensitivity in the low-sensitivity pixel might lead to a problem of an increase of crosstalk rate from the high-sensitivity pixel.

In the second embodiment of the present disclosure, the width of the inter-pixel light-shielding portion arranged between two adjacent pixels is set to a width according to the sensitivity difference between the two pixels.

Figure 18A:
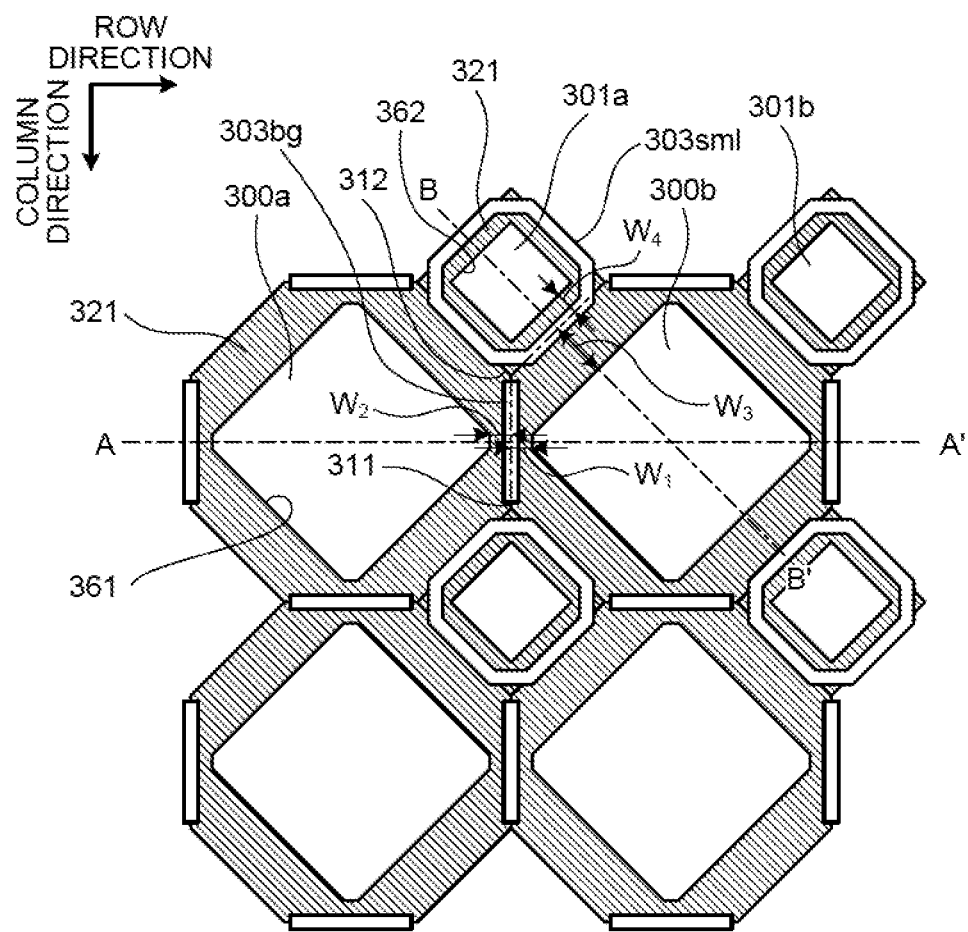
FIG. 18A is a schematic diagram illustrating arrangement of an inter-pixel light-shielding portion according to a second embodiment.

FIGS. 18A and 18B are schematic diagrams illustrating the arrangement of the inter-pixel light-shielding portion according to the second embodiment. FIG. 18A is a plan view of a pixel, and FIG. 18B is a view illustrating an A-A' cross section and a B-B' cross section in FIG. 18A. Note that FIG. 18A is a schematic diagram viewed from the opposite side of the incident surface of the pixel, for example, from the side of the wiring layer 271 in FIG. 9. In FIG. 18A, a unit pixel including the high-sensitivity pixel 300a and the low-sensitivity pixel 301a and a unit pixel including the high-sensitivity pixel 300b and the low-sensitivity pixel 301b are arranged adjacent to each other in the row direction.

In FIG. 18A, an inter-pixel light-shielding film 321 constituting an inter-pixel light-shielding portion is provided for each of the high-sensitivity pixels 300 and low-sensitivity pixels 301. Examples of applicable material of the inter-pixel light-shielding film 321 include tungsten, titanium, titanium nitride, $SiO_2$, and resin.

In the inter-pixel light-shielding film 321, openings 361 and 362 are provided corresponding to the high-sensitivity pixels 300 and the low-sensitivity pixels 301, respectively.

The light emitted to each of the high-sensitivity pixels 300 and the low-sensitivity pixels 301 is incident on the first photoelectric conversion element 101 and the second photoelectric conversion element 102 included in each of the high-sensitivity pixels 300 and the low-sensitivity pixels 301 respectively from the openings 361 and 362.

Furthermore, in the example of FIG. 18A, a trench light-shielding portion 303 is provided between individual pixels of the high-sensitivity pixels 300 and the low-sensitivity pixels 301. More specifically, a trench light-shielding portion 303bg is provided at the boundary 311 between the high-sensitivity pixels 300, while a trench light-shielding portion 303sml is provided around each of the low-sensitivity pixels 301. As illustrated in the cross-sectional view taken along line A-A' of FIG. 18B, the trench light-shielding portion 303bg is formed by embedding a specific material in a groove dug down in the layer direction from the position of the boundary 311 between the high-sensitivity pixels 300. Examples of applicable material to be embedded in the trench light-shielding portion 303 include $SiO_2$, tungsten, aluminum, titanium, titanium nitride, a magnesium-titanium alloy, a magnesium-nickel alloy, and tantalum oxide.

In the second embodiment, the width of the inter-pixel light-shielding film 321 at the boundary where the sensitivity difference between two adjacent pixels is large is made larger than the width of the inter-pixel light-shielding film 321 at the boundary between the other pixels. That is, an inter-pixel sensitivity difference is small between the high-sensitivity pixels 300 and between the low-sensitivity pixels 301. In contrast, the inter-pixel sensitivity difference is larger between the high-sensitivity pixel 300 and the low-sensitivity pixel 301 compared to the inter-pixel sensitivity difference between the high-sensitivity pixels 300 and between the low-sensitivity pixels 301. Therefore, the width of the inter-pixel light-shielding film 321 at the boundary 312 between the high-sensitivity pixel 300 and the low-sensitivity pixel 301 is made larger than the width of the inter-pixel light-shielding film 321 at the boundary 311 (In the pixel arrangement of FIG. 18A, the low-sensitivity pixels 301 are not in contact with each other.) between the high-sensitivity pixels 300.

A more specific description will be given with reference to FIG. 18A. With reference to FIG. 18A, a consideration will be given to the high-sensitivity pixels 300a and 300b adjacent in the row direction, and the low-sensitivity pixel 301a coming in contact with both the high-sensitivity pixels 300a and 300b.

In a portion of the inter-pixel light-shielding film 321 provided between the high-sensitivity pixel 300a and the high-sensitivity pixel 300b, a width from the inter-pixel boundary 311 to the high-sensitivity pixel 300a (specifically, the opening 361 thereof) at a narrowest width position is defined as a width $W_1$. In the example of FIG. 18A, since the opening 361 of the high-sensitivity pixel 300a is arranged obliquely with respect to the boundary 311, the narrowest width position is a corner portion of the opening 361 on the boundary 311 side. Similarly, a width from the inter-pixel boundary 311 to the high-sensitivity pixel 300b (specifically, the opening 361 thereof) at the narrowest with position is defined as a width $W_2$.

The inter-pixel boundary can be set to a center line of the trench light-shielding portion 303 provided for the pixel at the central portion of the pixel array unit 11 in a state without pupil correction.

Furthermore, in a portion of the inter-pixel light-shielding film 321 provided between the high-sensitivity pixel 300b and the low-sensitivity pixel 301a in contact with one side of the high-sensitivity pixel 300b, a width to (specifically, the opening 361 thereof) the high-sensitivity pixel 300b from the inter-pixel boundary 312 as a base point at a position where the width is the narrowest is defined as a width $W_3$. In the example of FIG. 18A, the side of the opening 561 of the high-sensitivity pixel 300b on the side in contact with the low-sensitivity pixel 301a and the side of the opening 561 of the low-sensitivity pixel 301a on the side in contact with the high-sensitivity pixel 300b are arranged in parallel to each other. Therefore, the position where the width is the narrowest is the range of the side of the opening 561 of the low-sensitivity pixel 301a on the side in contact with the high-sensitivity pixel 300b. Similarly, a width to the low-sensitivity pixel 301a (specifically, the opening 361 thereof) from the inter-pixel boundary 312 as a base point at a position where the width is the narrowest in the portion is defined as a width $W_4$.

In this case, the inter-pixel light-shielding film 321 is formed to satisfy the following Formula (1) regarding the widths $W_1$ to $W_4$.

$$W_3 + W_4 > W_1 + W_2 \tag{1}$$

Furthermore, in the first embodiment, the inter-pixel light-shielding film 321 is formed to satisfy the conditions of the following Formulas (2) and (3) regarding the width $W_1$ and the width $W_2$, and the width $W_3$ and the width $W_4$ described above. The condition of Formula (2) is not essential in the second embodiment. Furthermore, it is conceivable that the width $W_4$ is, for example, a width in a case where the second embodiment is not applied.

$$W_1 = W_2 \tag{2}$$

$$W_3 > W_4 \tag{3}$$

Formula (3) indicates that the inter-pixel light-shielding film 321 is provided closer to the high-sensitivity pixel 300 between the high-sensitivity pixel 300 and the low-sensitivity pixel 301. Therefore, the width of the inter-pixel light-shielding film 321 between the high-sensitivity pixel 300 and the low-sensitivity pixel 301 can be made larger than the width of the inter-pixel light-shielding film 321 between the high-sensitivity pixels 300 without impairing the area of the opening 362 of the low-sensitivity pixel 301.

As a result, in the low-sensitivity pixel 301, it is possible to suppress crosstalk from the high-sensitivity pixel 300 to the low-sensitivity pixel 301 while suppressing a decrease in sensitivity and a decrease in oblique incidence sensitivity for the low-sensitivity pixel having the known structure and suppressing a decrease in sensitivity of the high-sensitivity pixel 300.

(3-1. First Modification)

Next, a first modification of the second embodiment will be described. In the second embodiment described above, the trench light-shielding portion 303 is provided at the boundary between the pixels. In contrast, the first modification of the second embodiment is an example in which the trench light-shielding portion 303 is not provided at the boundary between the pixels.

Figure 19A:
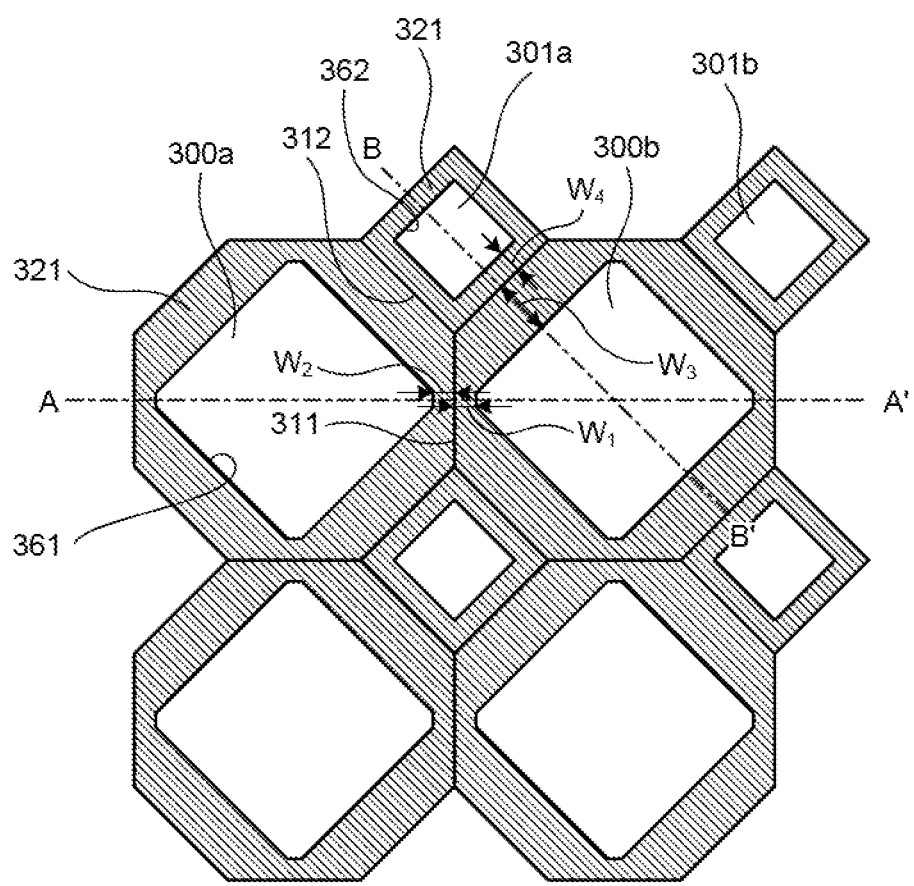
FIG. 19A is a schematic diagram illustrating arrangement of an inter-pixel light-shielding portion according to a first modification of the second embodiment.

FIGS. 19A and 19B are schematic diagrams illustrating the arrangement of the inter-pixel light-shielding portion according to the first modification of the second embodiment. FIGS. 19A and 19B are views corresponding to FIGS. 18A and 18B described above, respectively. FIG. 19A is a plan view of a pixel, and FIG. 19B is a cross-sectional view illustrating an A-A' cross section and a B-B' cross section in FIG. 19A.

As illustrated in FIGS. 19A and 19B, the trench light-shielding portion 303 is not provided between the high-sensitivity pixels 300 or between the high-sensitivity pixels 300 and the low-sensitivity pixels 301. On the other hand, the widths $W_1$ and $W_2$ of the inter-pixel light-shielding film 321, which is provided between the high-sensitivity pixels 300, on each side of the high-sensitivity pixels 300a and 300b respectively from the boundary 311, as well as the widths $W_3$ and $W_4$ of the inter-pixel light-shielding film 321, which is provided between the high-sensitivity pixel 300 and the low-sensitivity pixel 301, on each side of the low-sensitivity pixels 301 and the high-sensitivity pixels 300 from the boundary 312, are set to satisfy the conditions of the above-described Formulas (1) to (3).

Even in a case where the trench light-shielding portion 303 is not provided at the boundary between the pixels as in the first modification of the second embodiment, by forming the inter-pixel light-shielding film 321 to satisfy the conditions of the above-described Formulas (1) to (3), it is still possible to obtain effects equivalent to the effects of the above-described second embodiment.

Incidentally, in the first modification of the second embodiment, the boundary between the pixels can be defined as a boundary of a periodic pattern of impurity concentration injected into the silicon substrate.

(3-2. Second Modification)

Next, a second modification of the second embodiment will be described. In the second embodiment and the first modification thereof described above, the pixels are arranged in units of pixels including the high-sensitivity pixels 300 and the low-sensitivity pixels 301. However, the pixel arrangement applicable to the second embodiment is not limited to this unit. The second modification of the second embodiment is an example in which the second embodiment is applied to an RCCC array of pixels.

The RCCC array has a configuration including, for example, four pixels arranged in 2 pixels×2 pixels, in which a red color filter is arranged in one pixel, and colorless (clear) color filters are arranged in the other three pixels. As an example, application of the RCCC array to an in-vehicle imaging device will, for example, enable imaging at lower illuminance and facilitate identification between a front light and a tail light of the vehicle.

FIG. 20 is a schematic diagram illustrating an example of a pixel array by using an RCCC array applicable to a second modification of the second embodiment. In the example of FIG. 20, pixels 3000 to 3003 arranged in an array of 2×2 pixels constitute one pixel set, and the pixel sets are arranged in a matrix array in the pixel array. Of the pixels 3000 included in the pixel set, the pixel 3000 is provided with a filter that selectively transmits light of a red wavelength component, while the pixels 3001 to 3003 are provided with colorless filters, that is, filters that transmit light of the entire visible light region.

Here, since light of wavelength components other than the red wavelength component is attenuated by the color filter, the pixel 3000 has low sensitivity compared to the pixels 3001 to 3003. Therefore, the pixels 3001 to 3003 correspond to the high-sensitivity pixels 300 described above, and the pixel 3000 corresponds to the low-sensitivity pixel 301. Furthermore, there is provided an inter-pixel light-shielding film 3010 in the region of the pixel set, specifically in a region other than the opening of each of the pixels 3000 to 3003. In the case of such a configuration, there is a possibility of leakage of incident light to the pixel 3000 from the pixels 3001 and 3002 adjacent to the pixel 3000.

Here, by defining a boundary 3020 that equally divides the pixel set region into two in the row direction and a boundary 3021 that equally divides the pixel set region into two in the column direction, each of the divided regions is obtained as a pixel region. In the example of FIG. 20, each of the pixels 3000 and 3003 is arranged at the center of this pixel region. Furthermore, the pixel 3001 is arranged at the center of the pixel region such that the long side runs in the column direction, while the pixel 3002 is arranged at the center of the pixel region such that the long side runs in the row direction.

In this arrangement, in the portion of the inter-pixel light-shielding film 3010 provided between the pixel 3000 and the pixel 3001, the width between the right end of the opening of the pixel 3000 and the boundary 3020 corresponds to the above-described width $W_4$, while the width between the left end of the opening of the pixel 3001 and the boundary 3020 corresponds to the above-described $W_3$. Similarly, the width between the lower end of the opening of the pixel 3000 and the boundary 3021 corresponds to the above-described width $W_4$, while the width between the upper end of the pixel 3002 and the boundary 3021 corresponds to the above-described width $W_3$.

Also in this case, by setting the widths $W_3$ and $W_4$ to satisfy the condition of the above-described Formula (3), it is possible to suppress a decrease in sensitivity and a decrease in oblique incidence sensitivity of the pixel 3000, which is a low-sensitivity pixel, suppress a decrease in sensitivity of the pixels 3001 and 3002, which are high-sensitivity pixels, and suppress crosstalk from the pixels 3001 and 3002 to the pixel 3000.

4. Third Embodiment

A third embodiment of the present disclosure will be described. The third embodiment relates to the configuration of the trench light-shielding portion 303 in the CMOS image sensor 10 as the above-described imaging element.

Here is an exemplary case of a pixel structure using a unit pixel formed with a pair of a high-sensitivity pixel and a low-sensitivity pixel, in which a trench light-shielding portion for suppressing crosstalk is arranged without any gap around the low-sensitivity pixels and between the high-sensitivity pixels. The configuration in this case increases the width of the connection portion that connects the trench light-shielding portion between the high-sensitivity pixels with the trench light-shielding portion around the low-sensitivity pixels, causing a local increase in the depth of the trench light-shielding portion at the connection portion due to the microloading effect.

On the other hand, it is known that deepening the trench light-shielding portion would deteriorate the dark time characteristics due to the reasons of overlapping the trench light-shielding portion over an underlying FD depletion layer region or accumulation of damage due to deep digging, leading to the depth of the trench light-shielding portion is limited by the depth.

As described above, in a configuration of arranging the trench light-shielding portions without a gap, the depth of the trench light-shielding portion would be maximized not at a portion between the high-sensitivity pixel and the low-sensitivity pixel where the crosstalk is most desired to be suppressed but at the connection portion between the inter-pixel light-shielding portions, resulting in a failure of effective light shielding. For example, although Patent Literature 3 describes an element isolation portion in which an insulating film is embedded as a portion corresponding to a trench light-shielding portion, the description regarding the layout of the element isolation portion only includes a point that the portion is arranged in a grid-like shape so as to surround a pixel, with no description regarding a countermeasure against the microloading effect or the like.

Figure 21:
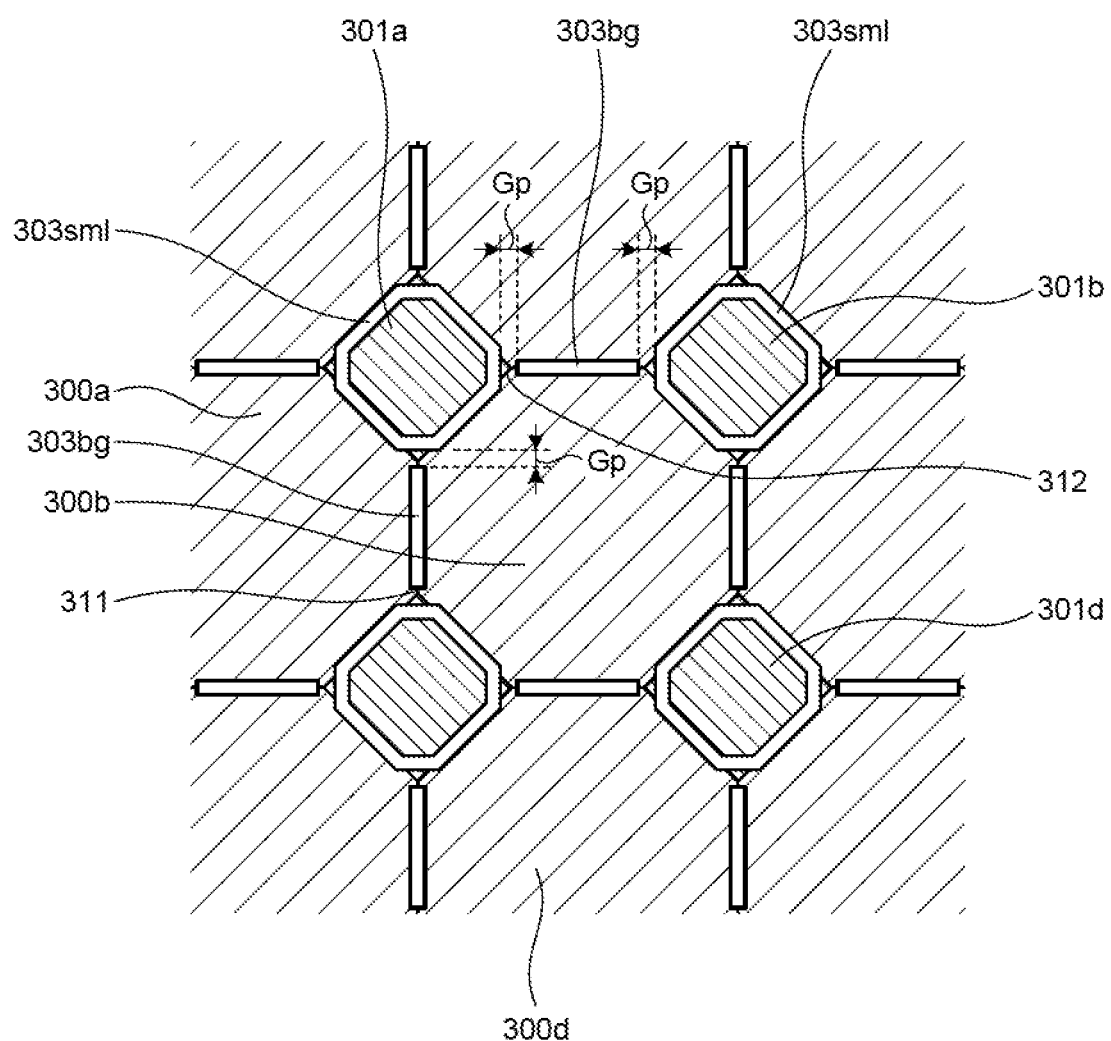
FIG. 21 is a plan view illustrating an arrangement example of trench light-shielding portions according to a third embodiment.

FIG. 21 is a schematic diagram illustrating a configuration example of the trench light-shielding portion 303 according to the third embodiment. FIG. 21 is a plan view of the pixel. Note that FIG. 21 is a schematic diagram when viewed from the opposite side of the incident surface of the pixel, for example, the side of the wiring layer 271 in FIG. 9.

In FIG. 21, the horizontal direction in the drawing is defined as the row direction, the vertical direction is as the column direction, and unit pixels, namely, a unit pixel including a high-sensitivity pixel 300a and a low-sensitivity pixel 301a, a unit pixel including a high-sensitivity pixel 300b and a low-sensitivity pixel 301b, a unit pixel including a high-sensitivity pixel 300d and a low-sensitivity pixel 301d, and a unit pixel including a high-sensitivity pixel 300b and a low-sensitivity pixel 301b, are arranged adjacent to each other in the row direction. Furthermore, the unit pixel including the high-sensitivity pixel 300d and the low-sensitivity pixel 301d is arranged adjacent to the unit pixel including the high-sensitivity pixel 300b and the low-sensitivity pixel 301b in the column direction.

In FIG. 21, for the sake of explanation, the description will be given focusing on the high-sensitivity pixels 300a and 300b and the low-sensitivity pixel 301a. In the surroundings of the low-sensitivity pixel 301a, a trench light-shielding portion 303sml is arranged with no gap, in other words, arranged continuously. On the other hand, there is provided a trench light-shielding portion 303bg arranged between the high-sensitivity pixel 300a and the high-sensitivity pixel 300b adjacent to the high-sensitivity pixel 300a in the row direction. At this time, the trench light-shielding portion 303bg and the trench light-shielding portion 303sml are arranged apart from each other with a gap Gp, without being connected to each other.

According to this arrangement, there is no connection portion between the trench light-shielding portion 303bg and the trench light-shielding portion 303sml. This makes it possible to avoid a situation in which the line width of the trench light-shielding portion 303bg locally increases due to the microloading effect and a portion where the depth locally increases is formed. This makes it possible to uniformly make the depth of the trench light-shielding portion 303bg as a whole, leading to the achievement of a higher light-shielding effect.

Note that the spacing of the gap Gp is not particularly limited as long as it is a spacing that disconnects between the trench light-shielding portion 303bg and the trench light-shielding portion 303sml.

In the following description, when there is no need to particularly distinguish between the trench light-shielding portion 303bg and the trench light-shielding portion sml, the trench light-shielding portion 303bg and the trench light-shielding portion sml will be collectively described as the trench light-shielding portion 303 as appropriate.

A more specific description will be given with reference to cross-sectional views of FIGS. 22 and 23. Note that, as illustrated in the upper right of FIG. 22, FIGS. 22 and 23 illustrate an A-A' cross section, a B-B' cross section, and a C-C' cross section in the pixel arrangement equivalent to the arrangement illustrated in FIG. 21.

Here, the cross section A-A' is a cross section along a line connecting the central portions of the low-sensitivity pixels 301a and 301d. The cross section B-B' is a cross section along a line connecting the central portions of the high-sensitivity pixels 300a and 300b in the row direction. Furthermore, the cross section C-C' is a cross section along a line connecting the high-sensitivity pixels 300a and 300b passing through the immediate vicinity of the low-sensitivity pixel 301d in the row direction.

Figure 22:
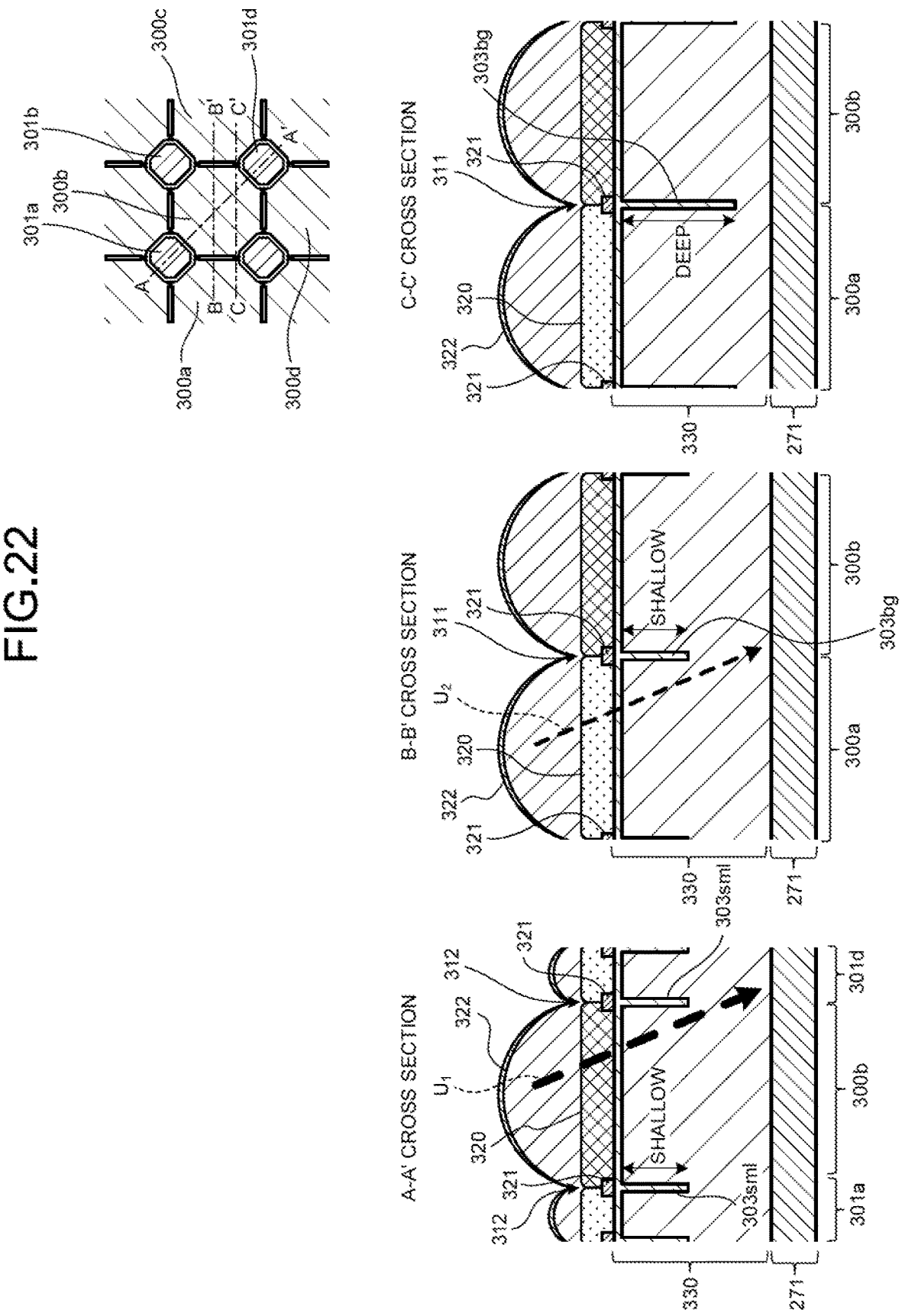
FIG. 22 is a cross-sectional view schematically illustrating a structure of an example of a pixel in a case where the third embodiment is not applied.

FIG. 22 is a cross-sectional view schematically illustrating a structure of an example of a pixel in a case where the third embodiment is not applied. In FIG. 22, the trench light-shielding portion 303bg illustrated in the C-C' cross section is connected to the trench light-shielding portion 303sml arranged around the low-sensitivity pixel 301d, and thus is formed deep due to the microloading effect. The depths of other trench light-shielding portions 303bg and 303sml are limited by the depth of the trench light-shielding portion 303bg, and are formed shallower than the depth of the trench light-shielding portion 303bg (refer to A-A' cross section and B-B' cross section). Therefore, for example, as illustrated in the diagram of A-A' cross section, there is a possibility that light obliquely incident on the high-sensitivity pixel 300b leaks into the adjacent low-sensitivity pixel 301d from below the shallow trench light-shielding portion 303sml (refer to a path $U_1$). Similarly, as illustrated in the diagram of B-B' cross section, there is a possibility that light obliquely incident on the high-sensitivity pixel 300a leaks from below the shallow trench light-shielding portion 303bg to the adjacent high-sensitivity pixel 300b (refer to a path $U_2$).

Figure 23:
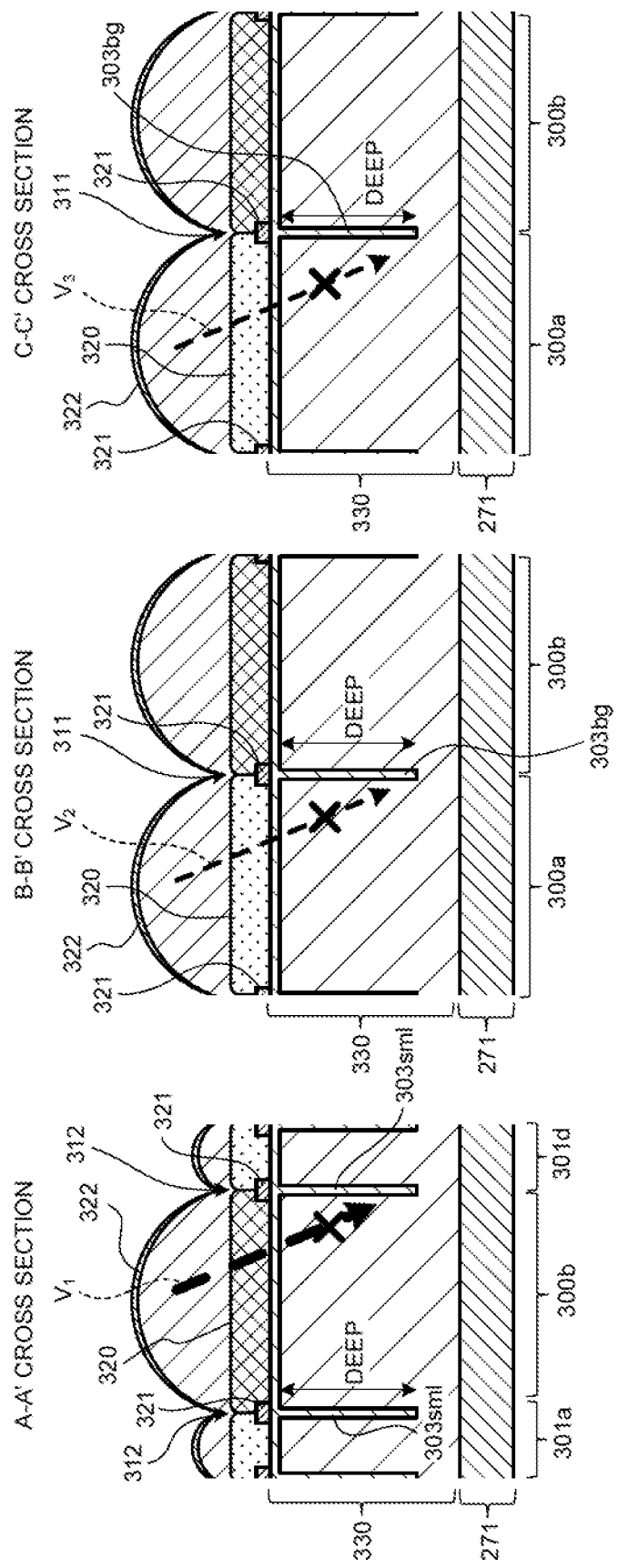
FIG. 23 is a cross-sectional view schematically illustrating a structure of an example of an element in a case where the third embodiment is applied.

FIG. 23 is a cross-sectional view schematically illustrating a structure of an example of a pixel in a case where the third embodiment is applied. In this case, there is provided a gap Gp between the trench light-shielding portion 303sml arranged around the low-sensitivity pixel 301 and the trench light-shielding portion 303bg arranged between the high-sensitivity pixels 300, disconnecting the trench light-shielding portion 303sml and the trench light-shielding portion 303bg from each other. Therefore, as illustrated in the A-A' cross section, the B-B' cross section, and the C-C' cross section, each of the trench light-shielding portions 303bg and the trench light-shielding portions 303sml can be formed at a substantially uniform depth. This makes it possible to form each of the trench light-shielding portions 303bg and the trench light-shielding portions 303sml at a desired depth, for example, a depth having a higher light-shielding effect and less influence on dark time characteristics.

In the example of FIG. 23, as illustrated in the diagram of A-A' cross section, leakage of incident light from the high-sensitivity pixel 300b to the low-sensitivity pixel 301d (refer to a path $V_1$) is suppressed. Furthermore, as illustrated in the diagram of B-B' cross section, leakage of incident light between the high-sensitivity pixels 300a and 300b (refer to a path $V_2$) is suppressed. Furthermore, as illustrated in the diagram of C-C' cross section, leakage of incident light between the high-sensitivity pixels 300a and 300b is suppressed even at a position in the immediate vicinity of the trench light-shielding portion 303sml around the low-sensitivity pixel 301.

Note that the light incident on the high-sensitivity pixel 300 is collected, for example, at the central portion by the on-chip lens 322 provided in the high-sensitivity pixel 300, and thus, providing a space Gp between the trench light-shielding portion 303bg and the trench light-shielding portion 303sml would have a small influence.

In this manner, according to the third embodiment, it is possible to form an effective trench light-shielding portion 303bg also between the high-sensitivity pixels 300 while surrounding, with no gap, the portions between the low-sensitivity pixels 301 having a large influence of crosstalk by using the trench light-shielding portion 303sml having a desired depth. This makes it possible to suppress crosstalk from the high-sensitivity pixel 300 to the low-sensitivity pixel 301 as well as suppressing crosstalk between the high-sensitivity pixels 300.

(4-1. First Modification)

Figure 24:
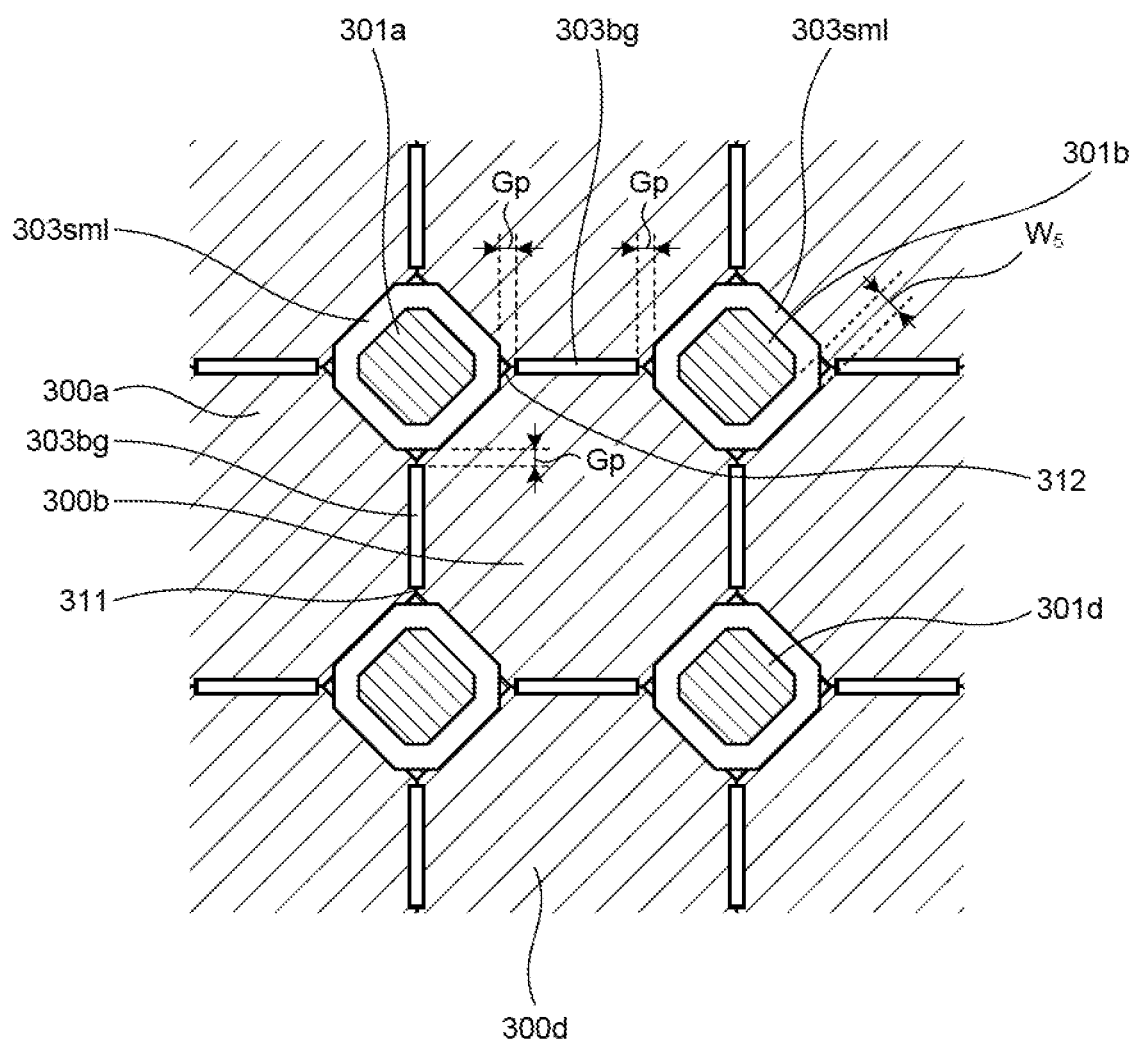
FIG. 24 is a schematic diagram illustrating a configuration example of a trench light-shielding portion according to a first modification of the third embodiment.

Next, a first modification of the third embodiment will be described. FIG. 24 is a schematic diagram illustrating a configuration example of a trench light-shielding portion 303 according to a first modification of the third embodiment. FIG. 24 is a plan view seen from the opposite side of the incident surface of the pixel, for example, the side of the wiring layer 271 in FIG. 9. Since the arrangement of each high-sensitivity pixel 300 and each low-sensitivity pixel 301 is the same as the arrangement illustrated in FIG. 21 described above, the description thereof will be omitted here.

In FIG. 24, similarly to FIG. 21 described above, the trench light-shielding portion 303bg provided between the high-sensitivity pixels 300 is arranged at the space Gp from the trench light-shielding portion 303sml provided around the low-sensitivity pixel 301.

Furthermore, in the first modification of the third embodiment, the width $W_5$ of the trench light-shielding portion 303sml disposed around each low-sensitivity pixel 301 is formed thicker than the width of the trench light-shielding portion 303bg disposed between the high-sensitivity pixels 300. That is, in the first modification of the third embodiment, the width $W_5$ of the trench light-shielding portion 303sml between the high-sensitivity pixel 300 and the low-sensitivity pixel 301, which needs suppression of crosstalk most, is formed to be thick in advance at the stage of lithography. This makes it possible to intentionally form the depth of the trench light-shielding portion 303sml to be deep.

As an example, while deepening the trench light-shielding portion 303bg between the high-sensitivity pixels 300 would deteriorate the dark-time characteristics due to the relationship with the position of the floating diffusion layer (for example, the accumulation portion 302 illustrated in FIG. 12A or the like) disposed above the wiring layer 271, deepening the trench light-shielding portion 303sml between the high-sensitivity pixel 300 and the low-sensitivity pixel 301 would not deteriorate the dark-time characteristics in some cases. In such a case, it is possible to increase the depth of the trench light-shielding portion 303sml arranged between the high-sensitivity pixel 300 and the low-sensitivity pixel 301 without being limited by the depth of the trench light-shielding portion 303bg arranged between the high-sensitivity pixels 300. This makes it possible to effectively suppress the crosstalk from the high-sensitivity pixel 300 to the low-sensitivity pixel 301.

(4-2. Second Modification)

Next, a second modification of the third embodiment will be described. In the second modification of the third embodiment, in addition to the sensitivity difference due to the difference in area between the high-sensitivity pixels 300 and the low-sensitivity pixels 301, the width of the trench light-shielding portion 303 arranged between the pixels is changed according to the sensitivity difference due to other factors, as compared with the first modification of the third embodiment described above.

Figure 25:
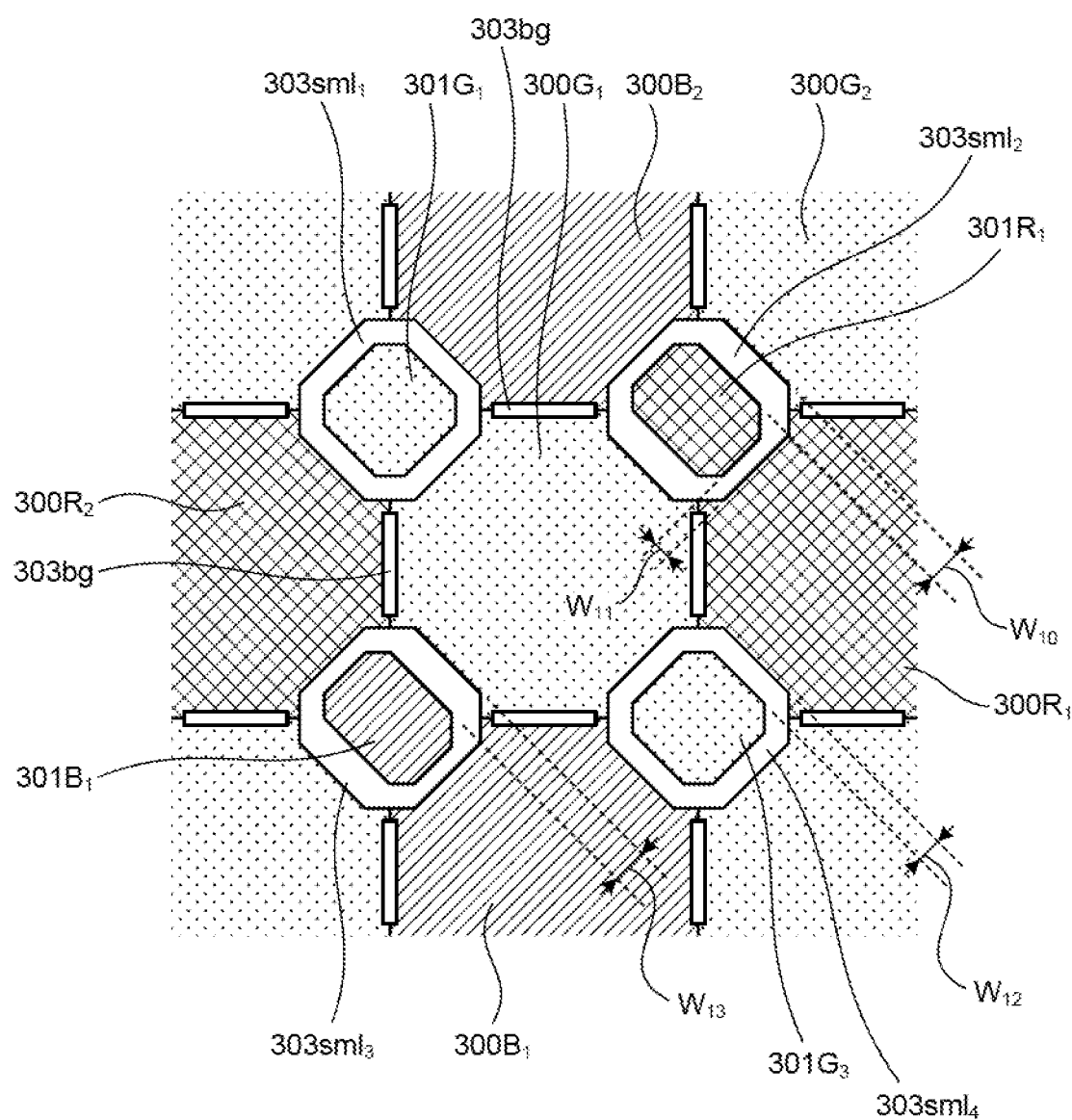
FIG. 25 is a schematic diagram illustrating a configuration example of a trench light-shielding portion according to a second modification of the third embodiment.

FIG. 25 is a schematic diagram illustrating a configuration example of the trench light-shielding portion 303 according to the second modification of the third embodiment. FIG. 25 is a plan view seen from the opposite side of the incident surface of the pixel, for example, the side of the wiring layer 271 in FIG. 9.

In the example of FIG. 25, high-sensitivity pixels $300R_1$ and $300R_2$ and low-sensitivity pixels $301R_1$ and $301R_2$ are red pixels each provided with a color filter that transmits light of a red wavelength component. One unit pixel is constituted by a set of the high-sensitivity pixel $300R_1$ and the low-sensitivity pixel $301R_1$ and by a set of the high-sensitivity pixel $300R_2$ and the low-sensitivity pixel $301R_2$.

Furthermore, high-sensitivity pixels $300G_1$ and $300G_2$ and low-sensitivity pixels $301G_1$ and $301G_3$ are green pixels each provided with a color filter that transmits light of a green wavelength component. One unit pixel is constituted by each of a set of the high-sensitivity pixel $300G_1$ and the low-sensitivity pixel $301G_1$ and by a set of the high-sensitivity pixel $300G_3$ and the low-sensitivity pixel $301G_3$. Furthermore, each of high-sensitivity pixels $300B_1$ and $300B_2$ and a low-sensitivity pixel $301B_1$ is a blue pixel provided with a color filter that transmits light of a blue wavelength component. A set of the high-sensitivity pixel $300B_1$ and the low-sensitivity pixel $301B_1$ constitutes one unit pixel.

In FIG. 25, a unit pixel including a high-sensitivity pixel $300B_2$ and a low-sensitivity pixel (not illustrated) corresponding to the high-sensitivity pixel $300B_2$, a unit pixel including the high-sensitivity pixel $300G_1$ and the low-sensitivity pixel $301G_1$, and a unit pixel including the high-sensitivity pixel $300B_1$ and the low-sensitivity pixel $301B_1$ are sequentially arranged adjacent to each other in the column direction. Furthermore, a unit pixel including the high-sensitivity pixel $300R_1$ and the low-sensitivity pixel $301R_1$, a unit pixel including the high-sensitivity pixel $300G_1$ and the low-sensitivity pixel $301G_1$, and a unit pixel including the high-sensitivity pixel $300R_2$ and the low-sensitivity pixel $301R_2$ are sequentially arranged adjacent to each other in the row direction.

Here, in each of the high-sensitivity pixels 300 and each of the low-sensitivity pixels 301, the sensitivity difference occurs not only due to a difference in size but also due to the difference of color filters, for example. For example, in comparison of pixels having the same area and structure, specifically, in comparison between the pixel provided with a color filter that transmits light of a green wavelength component (hereinafter, referred to as a G pixel) and the pixel provided with a color filter that transmits light of a blue wavelength component (hereinafter, referred to as a B pixel), the G pixel typically has higher sensitivity. Furthermore, in comparison between the G pixel and a pixel provided with a color filter that transmits light of a red wavelength component (hereinafter, referred to as an R pixel), the G pixel typically has higher sensitivity. The order of the sensitivity of the R pixel, the G pixel, and the B pixel is, for example, "G pixel>R pixel>B pixel".

As an example, the width of the trench light-shielding portion 303*sml* arranged at the pixel boundary between the high-sensitivity pixel 300 being a high-sensitivity G pixel and the low-sensitivity pixel 301 being a low-sensitivity R pixel, for example, in which the crosstalk from the high-sensitivity pixel 300 to the low-sensitivity pixel 301 becomes most prominent, is formed thick in advance at the stage of lithography. With this configuration, similarly to the case of the first modification of the third embodiment described above, it is also possible to selectively form the trench light-shielding portion 303 to be deep at the portion where the crosstalk is most desired to be suppressed, and by forming the other portions shallow, it is also possible to improve the dark time characteristics.

As an example, in FIG. 25, for example, in a case where color filters that transmit light of the same wavelength component are provided in the high-sensitivity pixel 300 and the low-sensitivity pixel 301 adjacent to each other, the width of the trench light-shielding portion 303*sml* disposed at the boundary between the high-sensitivity pixel 300 and the low-sensitivity pixel 301 will be considered as a reference. In the example of FIG. 25, the width $W_{11}$ of the trench light-shielding portion 303*sml*$_2$ at the boundary where the high-sensitivity pixel $300R_1$ and the low-sensitivity pixel $301R_1$, which are R pixels, are adjacent to each other, and the width of the trench light-shielding portion 303*sml*$_1$ at the boundary where the high-sensitivity pixel $300G_1$ and the low-sensitivity pixel $301G_1$, which are G pixels, are adjacent to each other are defined as the reference widths.

As a first example, a case where a color filter using a low sensitivity color is provided in the low-sensitivity pixel 301 and a color filter using a high sensitivity color is provided in the high-sensitivity pixel 300 will be described. In this case, the sensitivity difference due to the color filter is added to the sensitivity difference due to the difference in area between the high-sensitivity pixel 300 and the low-sensitivity pixel 301, and this increases the sensitivity difference between the high-sensitivity pixel 300 and the low-sensitivity pixel 301.

In the example of FIG. 25, a width $W_{13}$ of the trench light-shielding portion 303*sml*$_3$ arranged around the low-sensitivity pixel $301B_1$ being a B pixel, specifically, the width $W_{13}$ of a portion arranged at the boundary adjacent to the high-sensitivity pixel $300G_1$ being a G pixel, is formed to be greater than the reference width. Similarly, a width $W_{10}$ of the trench light-shielding portion 303*sml*$_2$ arranged around the low-sensitivity pixel $301R_1$ being a R pixel, specifically, the width $W_{10}$ of a portion arranged at the boundary adjacent to the high-sensitivity pixels $300G_1$ and $300G_2$ being G pixels, is formed to be greater than the reference width.

As a second example, a case where a color filter using a high sensitivity color is provided in the low-sensitivity pixel 301 and a color filter using a low sensitivity color is provided in the high-sensitivity pixel 300 will be described. In this case, since the sensitivity difference due to the difference in area between the high-sensitivity pixel 300 and the low-sensitivity pixel 301 is offset to some extent by the sensitivity difference due to the color filter, and this decreases the sensitivity difference between the high-sensitivity pixel 300 and the low-sensitivity pixel 301.

In the example of FIG. 25, a width $W_{12}$ of the trench light-shielding portion 303*sml*$_4$ arranged around the low-sensitivity pixel $301G_3$ being a G pixel, specifically, the width $W_{12}$ of a portion arranged at the boundary adjacent to the high-sensitivity pixel $R_1$ being a R pixel, is formed to be equivalent to the reference width $W_{11}$. Similarly, a width of the trench light-shielding portion 303*sml* arranged around the low-sensitivity pixel $301G_1$ being a G pixel, specifically, the width of a portion arranged at the boundary adjacent to the high-sensitivity pixel $B_2$ being a B pixel, is formed to be equivalent to the reference width $W_{11}$.

Note that, in a case where a color filter using a high sensitivity color is provided in one of the two adjacent high-sensitivity pixels 300 and a color filter with high sensitivity is provided in the other, the width of the trench light-shielding portion 303*bg* arranged between the high-sensitivity pixels 300 will not be changed.

5. Fourth Embodiment

Next, a fourth embodiment of the present disclosure will be described. The fourth embodiment relates to a configuration provided to prevent light leakage into adjacent pixels in the CMOS image sensor 10 as the above-described imaging element.

(5-0. Regarding Known Technology)

First, a known technology related to the fourth embodiment will be described. Patent Literature 4 discloses a technique of improving an effect of suppressing color mixing (effect of suppressing crosstalk) between adjacent pixels by improving a light-shielding structure between the pixels. An example of an inter-pixel light-shielding structure according to Patent Literature 4 as an existing technology will be described with reference to FIG. 26.

Figure 26:
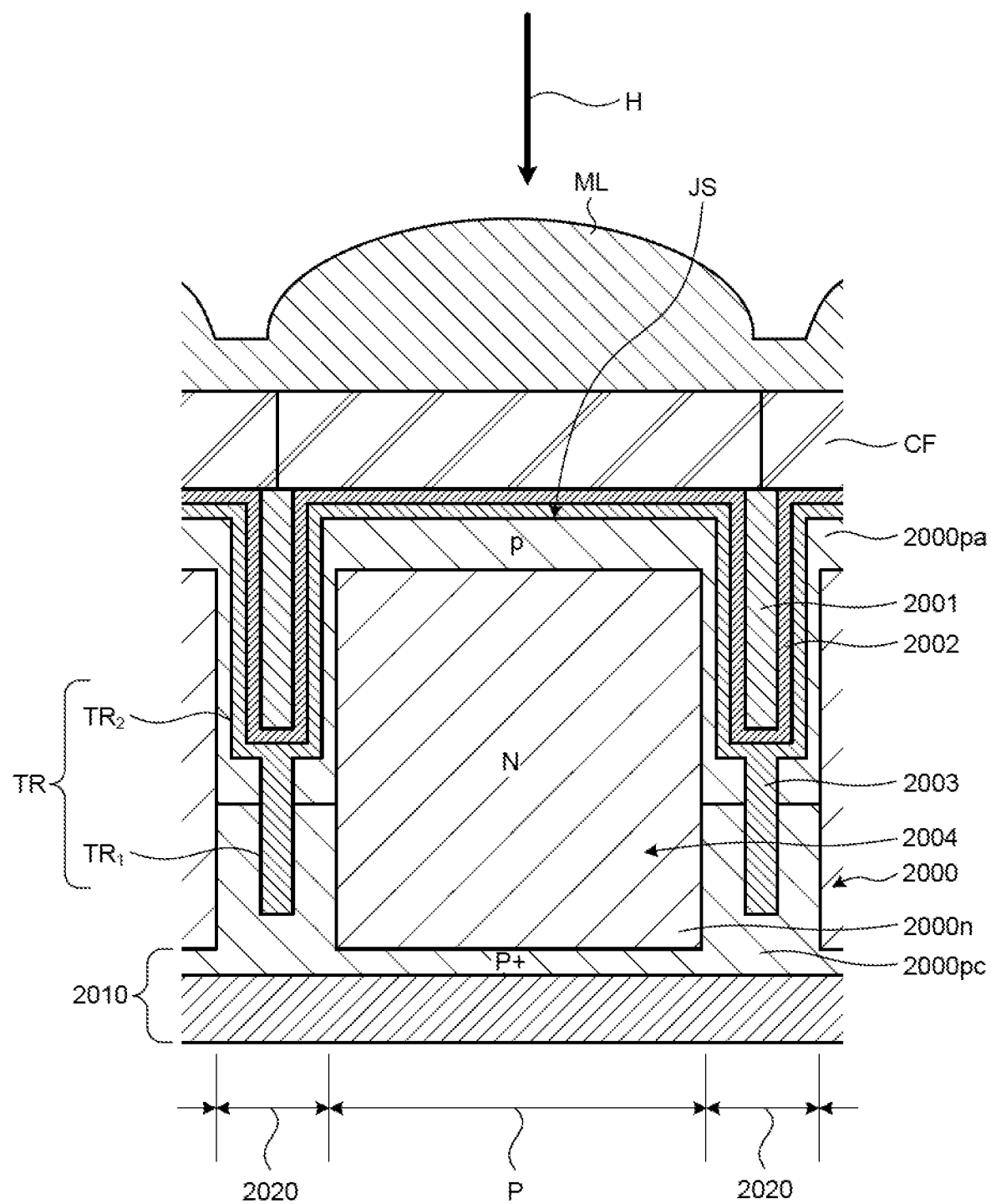
FIG. 26 is a cross-sectional view illustrating a cross section of an example of a solid-state imaging element according to a known technique taken in an incident direction of incident light.

FIG. 26 is a cross-sectional view illustrating a cross section of an example of a solid-state imaging element according to a known technique taken in an incident direction of incident light H. As illustrated in FIG. 3, the solid-state imaging element includes, inside a semiconductor substrate 2000, a photodiode 2004 and a pixel isolation portion 2020 constituting a pixel P. Here, the components are provided on the semiconductor substrate 2000 which is formed of thinned monocrystalline silicon. On the back surface (upper surface in FIG. 26) of the semiconductor substrate 2000, members such as a color filter CF and a microlens ML are provided. The pixels P are arranged in a grid-like array, for example, and constitute a pixel array.

On the other hand, the front surface (lower surface in FIG. 26) of the semiconductor substrate 2000 is provided with a wiring/circuit layer 2010 on which a pixel circuit and wiring (not illustrated) are provided. In the wiring/circuit layer 2010, a support substrate (not illustrated) is provided on the surface opposite to the semiconductor substrate 2000 side.

The incident light H incident from the back surface (upper surface in FIG. 26) side of the semiconductor substrate 2000 is received by the photodiode 2004. As illustrated in FIG. 26, the color filter (optical filter) CF and the microlens ML are provided above the photodiode 2004, and the incident light H sequentially incident through these units is received by a light receiving surface JS and undergoes photoelectric conversion.

In the photodiode 2004, an n-type semiconductor region 2000$n$ formed as a charge accumulation region that accumulates charges is provided inside a p-type semiconductor regions 2000$pa$ and 2000$pc$ of the semiconductor substrate 2000.

In a solid-state imaging device 1, the microlens ML is provided on the upper surface of the color filter CF on the back surface (upper surface in FIG. 26) side of the semiconductor substrate 2000. The microlens ML is disposed in plurality so as to correspond to each pixel P. The microlens ML is a convex lens formed of an organic material such as resin and protruding in a convex shape on the back surface side of the semiconductor substrate 2000, and is configured to collect the incident light H to the photodiode 2004 of each pixel P.

The semiconductor substrate 2000 internally includes the pixel isolation portion 2020 that electrically isolates the plurality of pixels P from each other, and the photodiode 2004 is provided in a region of the pixel P partitioned by the pixel isolation portion 2020.

The pixel isolation portion 2020 will be described. In the solid-state imaging device, the pixel isolation portion 2020 is formed so as to partition the plurality of pixels P inside the semiconductor substrate 2000. In addition, the pixel isolation portion 2020 electrically isolates the plurality of pixels P from each other. That is, the photodiodes 2004 of the pixels P are electrically separated from each other.

In the pixel isolation portion 2020 located between the plurality of pixels P, the p-type semiconductor regions 2000$pa$ and 2000$pc$ are provided between the n-type semiconductor regions 2000$n$ constituting the charge accumulation region of the photodiode 2004. In the semiconductor substrate 2000, there is provided a trench TR in a portion located on the side of the back surface (upper surface) on which the incident light H enters and on the side of the photodiode 2004.

Specifically, the trench TR is formed so as to include a first trench $TR_1$ and a second trench $TR_2$. Here, the first trench $TR_1$ is provided in a deep portion of the semiconductor substrate 2000.

The second trench $TR_2$ is formed in a portion shallower than the first trench $TR_1$ in the semiconductor substrate 2000. That is, the trenches TR are formed such that the second trench $TR_2$ has a side surface vertically extending downward from the back surface (upper surface) of the semiconductor substrate 2000, and the first trench $TR_1$ has a side surface vertically extending downward from the central portion of the bottom surface of the second trench $TR_2$. In addition, the second trench $TR_2$ is formed to be wider (thicker) than the first trench $TR_1$.

Furthermore, in this example, the trenches TR are formed so as to be symmetric in a direction along the back surface (upper surface) of the semiconductor substrate 2000 between the plurality of pixels P.

The pixel isolation portion 2020 includes a pinning layer 2003, an insulating film 2002, and a light-shielding layer 2001, and these portions are provided inside the trench TR. The insulating film 2002 is formed so as to cover the inner surface of the second trench $TR_2$ formed above the first trench $TR_1$ in a shallow portion of the semiconductor substrate 2000. In addition to the pixel isolation portion 2020, the insulating film 2002 is formed so as to cover the light receiving surface JS via the pinning layer 2003 on the back surface (upper surface) of the semiconductor substrate 2000.

The light-shielding layer 2001 is formed so as to fill the inside of the second trench $TR_2$ via the pinning layer 2003 and the insulating film 2002 in a shallow portion of the semiconductor substrate 2000. The light-shielding layer 2001 is formed of a metal material having a high light-shielding property, such as tungsten (W) or aluminum (Al).

In this manner, the structure suggested in Patent Literature 4 is an inter-pixel light-shielding structure (hereinafter, referred to as B-rear deep trench isolation (B-RDTI)) having two types of trenches TR (the first trench $TR_1$ and the second trench $TR_2$) having different widths between the pixels P, in which the width of the second trench $TR_2$ on the back surface side (the upper surface in FIG. 26) is wider than the width of the first trench $TR_1$ on the deep side of the semiconductor substrate 2000 in comparison of the trenches TR. Embedding the light-shielding layer 2001 inside the second trench $TR_2$ enhances the color mixing suppressing effect. Note that, in Patent Literature 4, the applied pixel layout is limited to a grid-like layout in which individual pixels are arranged in a matrix array.

In the technique of Patent Literature 4, while the color mixing suppressing effect is enhanced by the light-shielding layer 2001, it is necessary to widen the width of the second trench $TR_2$ with respect to the first trench $TR_1$ in order to embed the light-shielding layer 2001. Therefore, a decrease in the opening area (area of the light receiving surface) of the pixel P and a decrease in the volume of the photodiode 2004 would decrease the sensitivity of the pixel P and the saturation of the photodiode 2004.

(5-1. Regarding Fourth Embodiment)

(5-1-1. Outline of Fourth Embodiment)

In view of this, the fourth embodiment of the present disclosure applies the above-described known technology to the structures of the high-sensitivity pixel 300 and the low-sensitivity pixel 301 according to the present disclosure, and disposes the first trench $TR_1$ and the second trench $TR_2$ in which the light-shielding layer 2001 is embedded such that their positional relationship is asymmetric with respect to the boundary between the high-sensitivity pixel 300 and the low-sensitivity pixel 301. This makes it possible to improve a color mixing suppression effect to be an issue in a case where the high-sensitivity pixels 300 and the low-sensitivity pixels 301 are arranged while suppressing deterioration of important characteristics such as pixel sensitivity and saturation characteristics of the photodiode, that is, the first photoelectric conversion element 101 (refer to FIGS. 3 and 4).

Furthermore, in the fourth embodiment of the present disclosure, the second trench $TR_2$ is arranged to be closer to the low-sensitivity pixel 301 side. This makes it possible to suppress a decrease in the sensitivity of the pixel in the high-sensitivity pixel 300 and a decrease in the saturation characteristic of the first photoelectric conversion element 101 due to an increase in the width of the second trench $TR_2$ by embedding the light-shielding layer.

That is, by arranging the second trench $TR_2$ in which the light-shielding film is embedded to be closer to the low-sensitivity pixel 301 side, it is possible to suppress deterioration of the sensitivity of the high-sensitivity pixel 300 and the saturation characteristic of the first photoelectric conversion element 101. On the other hand, the low-sensitivity pixel 301 is designed to have low sensitivity, and the saturation characteristic of the photodiode (second photoelectric conversion element 102) is determined by the in-pixel capacitance, that is, the charge accumulation portion 111 (refer to FIGS. 3 and 4). Therefore, the low-sensitivity pixel 301 is less affected by the opening area (area of the light receiving surface) caused by arranging the second trench $TR_2$ closer to the low-sensitivity pixel 301 and caused by the decrease in the volume of the second photoelectric conversion element 102.

Therefore, by applying the configuration according to the fourth embodiment, it is possible to suppress the influence on the sensitivity ratio of the high-sensitivity pixel 300 and the low-sensitivity pixel 301, which is important in the configuration using the high-sensitivity pixel 300 and the low-sensitivity pixel 301, leading to acquisition of a higher color mixing suppression effect.

Furthermore, another effect obtained by the configuration according to the fourth embodiment is that it is possible to use an asymmetric layout with respect to the boundary between the high-sensitivity pixel 300 and the low-sensitivity pixel 301 in an optical black region (for example, the inter-pixel light-shielding portion 181) without considering deterioration of oblique incidence characteristics due to oblique incidence of incident light on the photoelectric conversion element. This makes it possible to improve the degree of freedom in designing regarding adjustment of characteristics such as the sensitivity ratio of the high-sensitivity pixel 300 and the low-sensitivity pixel 301, for example.

More specifically, according to the known technology, the layout of the optical black region needs to be designed in sufficient consideration of the trade-off between the oblique input characteristic and the sensitivity ratio characteristics. Application of the configuration according to the fourth embodiment makes it possible to omit consideration of this trade-off.

(5-1-2. Specific Description of Fourth Embodiment)

Figure 27:
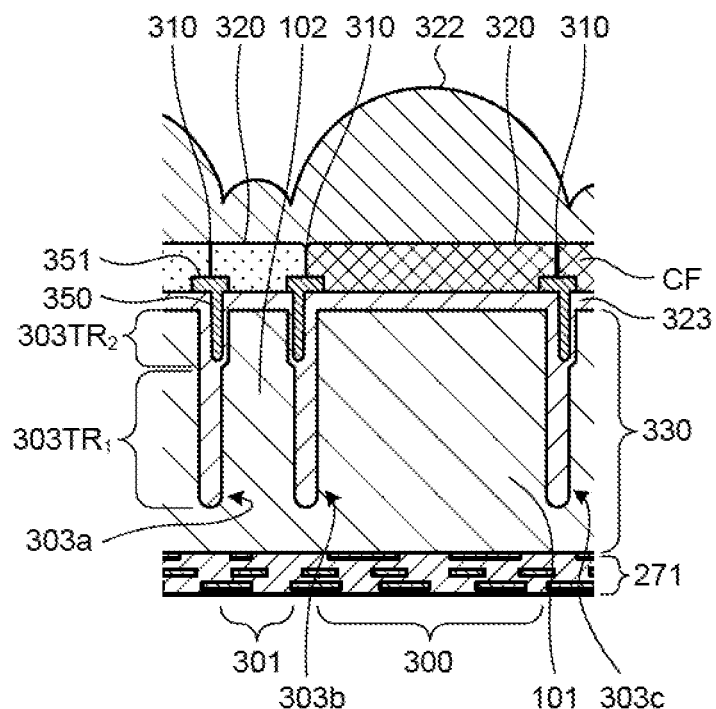
FIG. 27 is a schematic diagram schematically illustrating a cross section of a unit pixel according to a fourth embodiment.

Next, the fourth embodiment will be described more specifically. FIG. 27 is a schematic diagram schematically illustrating a cross section of a unit pixel according to a fourth embodiment. FIG. 27 schematically illustrates a cross section in an alignment direction of the high-sensitivity pixels 300 and the low-sensitivity pixels 301, and omits illustrations of portions not deeply related to the description of the fourth embodiment.

Similarly to FIG. 26, FIG. 27 defines the upper side of the semiconductor layer 330 as the back surface side, and the lower side as the front surface side. The wiring layer 271 is provided on the front surface side of the semiconductor layer 330. On the back surface side of the semiconductor layer 330, an optical filter (color filter CF in this example) and an on-chip lens 322 are provided via an interlayer insulating film 323.

Trench light-shielding portions 303a, 303b, and 303c are provided by being dug down in the layer direction from the interlayer insulating film 323 toward the front surface side of the semiconductor layer 330 with respect to the boundary of each color filter CF, that is, each boundary of the high-sensitivity pixel 300 and the low-sensitivity pixel 301. In FIG. 27, in the semiconductor layer 330, a region partitioned by the trench light-shielding portion 303a and the trench light-shielding portion 303b corresponds to the first photoelectric conversion element 101, and a region partitioned by the trench light-shielding portion 303b and the trench light-shielding portion 303c corresponds to the second photoelectric conversion element 102.

An inter-pixel light-shielding portion 351 corresponding to the above-described inter-pixel light-shielding portion 181 is provided as an optical black region at the bottom (upper end in FIG. 27) of each of the trench light-shielding portions 303a, 303b, and 303c, and the light-shielding wall 350 is provided by being dug down in the layer direction from the inter-pixel light-shielding portion 351. The light-shielding wall 350 corresponds to the light-shielding layer 2001 in FIG. 26, and is formed of tungsten (W) as a material, for example. The material is not limited thereto, and the light-shielding wall 350 may be formed of another material having a high light-shielding property, such as aluminum (Al).

Here, in each of the trench light-shielding portions 303a, 303b, and 303c, a portion not including the light-shielding wall 350 is referred to as a first trench light-shielding portion $303TR_1$, and a portion including the light-shielding wall 350 is referred to as a second trench light-shielding portion $303TR_2$. In each of the trench light-shielding portions 303a, 303b, and 303c, the width (thickness) of the second trench light-shielding portion $303TR_2$ is larger (thicker) than the width (thickness) of the first trench light-shielding portion $303TR_1$.

Furthermore, each light-shielding wall 350 is provided close to the low-sensitivity pixel 301 side in each second trench light-shielding portion $303TR_2$. In the example of FIG. 27, in the trench light-shielding portion 303a, the high-sensitivity pixel 300 is on the left side in the figure, while the low-sensitivity pixel 301 (not illustrated) is on the right side. In the second trench light-shielding portion $303TR_2$ of the trench light-shielding portion 303a, the light-shielding wall 350 is provided to be closer to the right with respect to the boundary 310 between the high-sensitivity pixel 300 and the low-sensitivity pixel 301.

Similarly, the trench light-shielding portion 303b has the high-sensitivity pixel 300 on the right side and the low-sensitivity pixel 301 on the left side in the figure. In the second trench light-shielding portion 303TR$_2$ of the trench light-shielding portion 303b, the light-shielding wall 350 is provided closer to the left with respect to the boundary 310 between the high-sensitivity pixel 300 and the low-sensitivity pixel 301.

Figure 28:
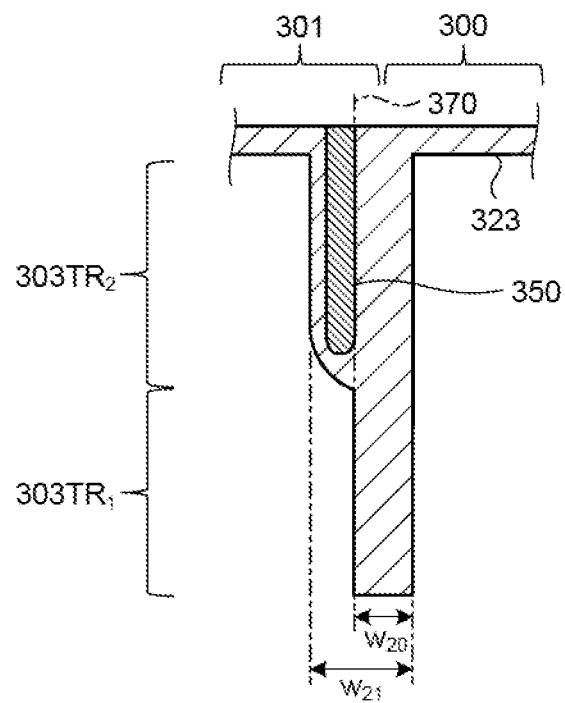
FIG. 28 is a schematic diagram illustrating a relationship between the light-shielding wall according to the fourth embodiment and the first trench light-shielding portion and the second trench light-shielding portion.

FIG. 28 is a schematic diagram illustrating a relationship between the light-shielding wall 350 according to the fourth embodiment and the first trench light-shielding portion 303TR$_1$ and the second trench light-shielding portion 303TR$_2$. In FIG. 28, the high-sensitivity pixel 300 is on the right side, while the low-sensitivity pixel 301 is on the left side. In addition, the width (thickness) of the first trench light-shielding portion 303TR$_1$ is set to a width w$_{20}$, and the width (thickness) of the second trench light-shielding portion 303TR$_2$ is set to a width w$_{21}$.

The light-shielding wall 350 and the first trench light-shielding portion 303TR$_1$ and the second trench light-shielding portion 303TR$_2$ need to satisfy the following relationships.

(1) The relationship between the width w$_{20}$ and the width w$_{21}$ needs to be [w$_{20}$<w$_{21}$]

(2) A portion of the difference (w$_{21}$–w$_{20}$) in width from the first trench light-shielding portion 303TR$_1$ in the second trench light-shielding portion 303TR$_2$ protrudes toward the low-sensitivity pixel 301 with respect to the first trench light-shielding portion 303TR$_1$, and does not protrude toward the high-sensitivity pixel 300.

This suppress occurrence of deterioration in sensitivity in the high-sensitivity pixel 300 and deterioration in saturation characteristics of the first photoelectric conversion element 101, which occur in the example of FIG. 26 described above.

(3) Furthermore, the light-shielding wall 350 is provided such that its end on the high-sensitivity pixel 300 side is at least in contact with an extension line 370 of the outer edge of the first trench light-shielding portion 303TR$_1$ on the low-sensitivity pixel 301 side. The light-shielding wall 350 may overlap over the extension line 370.

(4) Furthermore, the light-shielding wall 350 needs to be provided so as not to exceed the width (thickness) of the first trench light-shielding portion 303TR$_1$.

Note that the length (depth) of the light-shielding wall 350 is determined according to various conditions including the sizes of the high-sensitivity pixel 300 and the low-sensitivity pixel 301. As an example, with reference to FIG. 27, in a case where the size of the high-sensitivity pixel 300 is such that, for example, the length and the height (depth) between the trench light-shielding portion 303a and the trench light-shielding portion 303b are each 3 [µm], it is conceivable to set the length (depth) of the light-shielding wall 350 to several 100 [nm], for example, about 300 [nm] to 400 [nm].

Figure 29:
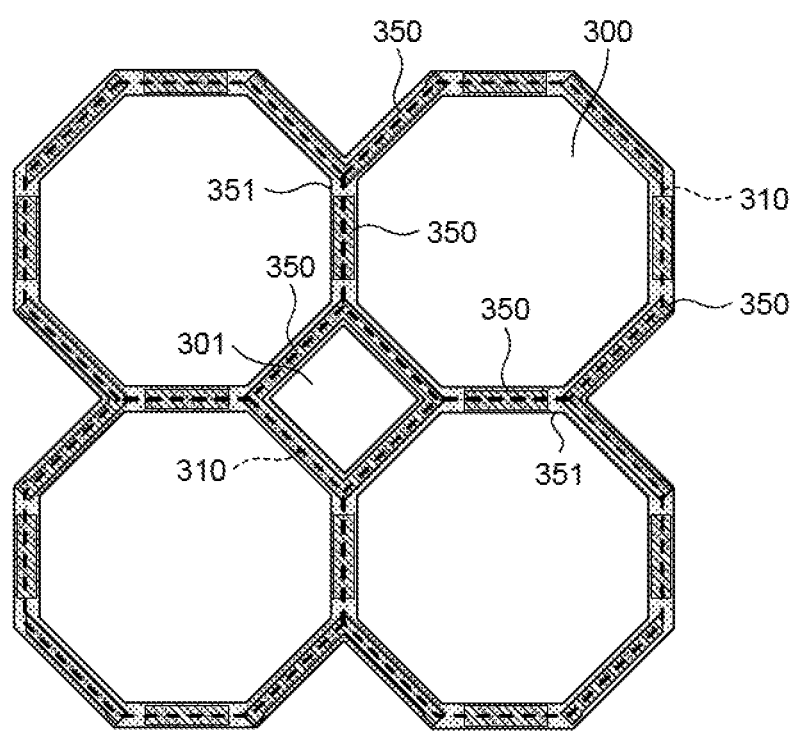
FIG. 29 is a schematic diagram illustrating the arrangement of the light-shielding wall according to the fourth embodiment.

FIG. 29 is a schematic diagram illustrating the arrangement of the light-shielding wall 350 according to the fourth embodiment. FIG. 29 is a plan view of the high-sensitivity pixels 300 and the low-sensitivity pixels 301 arranged in a predetermined manner as viewed from the light receiving surface side. In the example of FIG. 29, the inter-pixel light-shielding portion 351 as an optical black region is provided on the entire circumference of each of the high-sensitivity pixel 300 and the low-sensitivity pixel 301. In other words, the inter-pixel light-shielding portion 351 is continuously provided corresponding to all sides of the high-sensitivity pixel 300 and the low-sensitivity pixel 301.

Note that the "sides" of the high-sensitivity pixels 300 and the low-sensitivity pixels 301 here indicate sides of pixels in a case where pixels up to the boundary 310 are defined as pixels.

In the fourth embodiment, the light-shielding wall 350 is provided on the entire circumference of the low-sensitivity pixel 301. For the high-sensitivity pixel 300, the light-shielding wall 350 is provided to be isolated on a side where the high-sensitivity pixels 300 are adjacent to each other. In other words, in the side where the high-sensitivity pixels 300 are adjacent to each other, the light-shielding wall 350 is provided with a gap at both ends of the side. In this manner, by providing the light-shielding wall 350 with a gap at both ends of the side, it is possible to prevent the intersection between the light-shielding wall 350 provided on the adjacent side and the light-shielding wall 350 provided on the entire circumference of the low-sensitivity pixel 301, making it possible to suppress the local increase in the depth and width of the light-shielding wall 350 due to the microloading effect.

FIG. 30 is a schematic diagram illustrating a light-shielding effect achieved by the pixel structure according to the fourth embodiment. In FIG. 30, Section (a) illustrates an example of a pixel structure according to a known technology without the light-shielding wall 350 according to the fourth embodiment, while Section (b) illustrates an example of a pixel structure with the light-shielding wall 350 according to the fourth embodiment.

Note that Sections (a) and (b) in FIG. 30 each schematically illustrate cross sections in the alignment direction of the high-sensitivity pixels 300 and the low-sensitivity pixels 301, similarly to FIG. 27 described above, and omit illustrations of portions not deeply related to the description of the fourth embodiment.

In the section (a) of FIG. 30, each of trench light-shielding portions 303a', 303b', and 303c' has the inter-pixel light-shielding portion 351 but does not include the light-shielding wall 350. Here, for example, a case where light in the oblique direction (obliquely incident light) is incident on the high-sensitivity pixel 300 through the color filter CF as indicated by arrow A will be examined. In this case, the obliquely incident light is incident on the adjacent low-sensitivity pixel 301 through the trench light-shielding portion 303a'. Therefore, in the low-sensitivity pixel 301, there might be an occurrence of color mixing due to obliquely incident light incident through the color filter CF provided in the high-sensitivity pixel 300 onto the light incident through the color filter CF provided in the low-sensitivity pixel 301.

In contrast, in Section (b) of FIG. 30, similarly, the obliquely incident light incident on the high-sensitivity pixel 300 in the oblique direction through the color filter CF as indicated by arrow B is suppressed from being incident on the low-sensitivity pixel 301 by the light-shielding wall 350 formed of tungsten or the like, for example. In addition, incidence of obliquely incident light on the high-sensitivity pixel 300 on another high-sensitivity pixel 300 adjacent to the high-sensitivity pixel 300 is also suppressed by the light-shielding wall 350.

Accordingly, the pixel structure according to the fourth embodiment can suppress color mixing due to obliquely incident light. At the same time, in the pixel structure according to the fourth embodiment, there is no decrease in the area (opening area) of the light receiving surface in the high-sensitivity pixel 300 and no decrease in the volume of the first photoelectric conversion element 101, making it possible to suppress deterioration of sensitivity and deterioration of saturation characteristics when a combination of the high-sensitivity pixel 300 and the low-sensitivity pixel 301 is used as a unit pixel, leading to acquisition of a higher-quality image.

(5-2. First Modification)

Next, a first modification of the fourth embodiment will be described. The first modification of the fourth embodiment is, for example, an example in which the light-shielding wall 350 is provided only on the entire circumference of the low-sensitivity pixels 301 and the light-shielding wall 350 is not provided on the side where the high-sensitivity pixels 300 are adjacent to each other, as compared with the pixel structure according to the above-described fourth embodiment.

Figure 31:
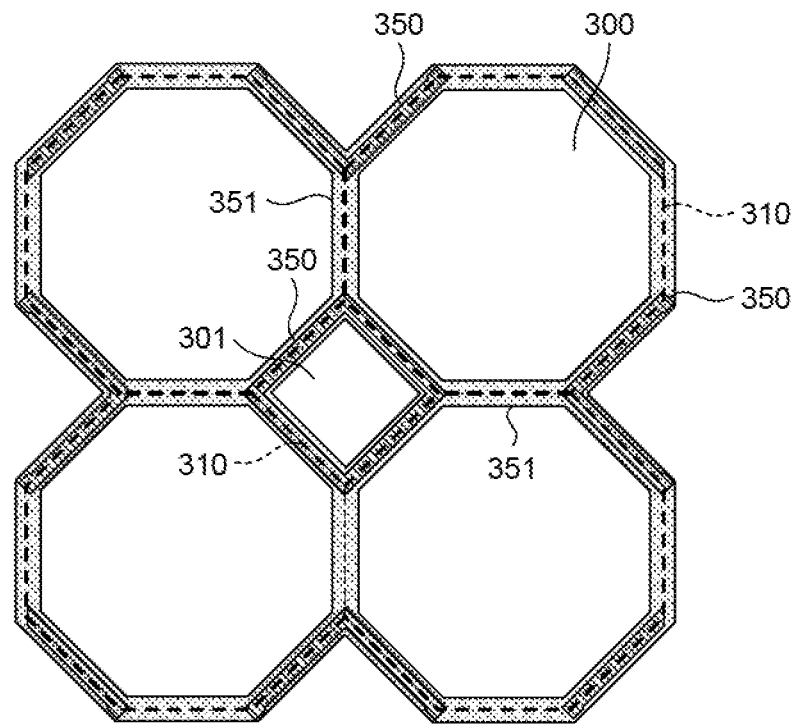
FIG. 31 is a schematic diagram illustrating arrangement of a light-shielding wall according to a first modification of the fourth embodiment.

FIG. 31 is a schematic diagram illustrating arrangement of the light-shielding wall 350 according to the first modification of the fourth embodiment. As illustrated in FIG. 31, in the first modification of the fourth embodiment, the light-shielding wall 350 is provided on the entire circumference of the low-sensitivity pixel 301, that is, on all sides of the low-sensitivity pixel 301. Even in this case, similarly to the above-described fourth embodiment, the light-shielding wall 350 is provided on the entire circumference of the low-sensitivity pixel 301 to be closer to the low-sensitivity pixel 301.

On the other hand, in the high-sensitivity pixel 300, the light-shielding wall 350 is not provided on the side where the high-sensitivity pixels 300 are adjacent to each other. Since the light-shielding wall 350 is provided on the entire circumference of the low-sensitivity pixel 301, the light-shielding wall 350 is to be provided on the side where the high-sensitivity pixel 300 and the low-sensitivity pixel 301 are adjacent to each other. Furthermore, the light-shielding wall 350 provided for the side is arranged to be closer to the low-sensitivity pixel 301.

Note that the inter-pixel light-shielding portion 351 as an optical black region is provided on the entire circumference of each of the high-sensitivity pixel 300 and the low-sensitivity pixel 301, similarly to the above-described fourth embodiment. Furthermore, as described with reference to FIG. 28, the trench light-shielding portion 303 is provided so as not to protrude toward the high-sensitivity pixel 300.

Even with such a structure, it is possible to suppress color mixing due to obliquely incident light from the high-sensitivity pixel 300 to the low-sensitivity pixel 301 described above. Furthermore, since there is no decrease in the area (opening area) of the light receiving surface and no decrease in the volume of the first photoelectric conversion element 101 in the high-sensitivity pixel 300, it is possible to obtain an image with higher quality.

(5-3. Second Modification)

Next, a second modification of the fourth embodiment will be described. The first modification of the fourth embodiment is an example in which the light-shielding wall 350 is connected around the high-sensitivity pixel 300 and the low-sensitivity pixel 301, as compared with the pixel structure according to the above-described fourth embodiment, for example.

Figure 32:
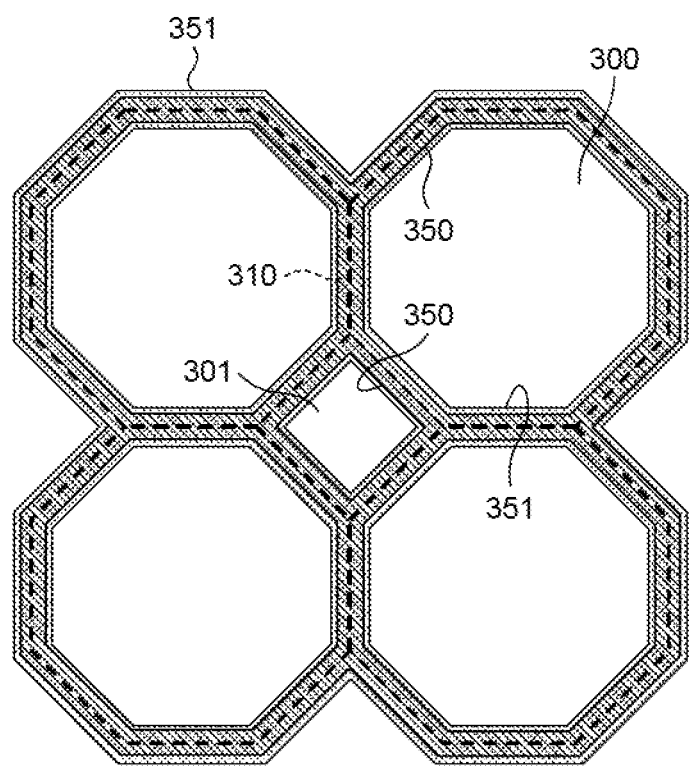
FIG. 32 is a schematic diagram illustrating arrangement of a light-shielding wall according to a second modification of the fourth embodiment.

FIG. 32 is a schematic diagram illustrating arrangement of the light-shielding wall 350 according to the second modification of the fourth embodiment. As illustrated in FIG. 32, in the second modification of the fourth embodiment, the light-shielding wall 350 is provided on the entire circumference of each of the high-sensitivity pixel 300 and the low-sensitivity pixel 301, and the light-shielding wall 350 provided on the entire circumference of the high-sensitivity pixel 300 and the light-shielding wall 350 provided on the entire circumference of the low-sensitivity pixel 301 are connected to each other. Also in this case, the light-shielding wall 350 provided on the entire circumference of the low-sensitivity pixel 301 is arranged to be closer to the low-sensitivity pixel 301.

Note that the inter-pixel light-shielding portion 351 as an optical black region is provided on the entire circumference of each of the high-sensitivity pixel 300 and the low-sensitivity pixel 301, similarly to the above-described fourth embodiment. Furthermore, as described with reference to FIG. 28, the trench light-shielding portion 303 is provided so as not to protrude toward the high-sensitivity pixel 300.

Even with such a structure, it is possible to suppress color mixing due to obliquely incident light from the high-sensitivity pixel 300 to the low-sensitivity pixel 301 described above. In addition, incidence of obliquely incident light on the high-sensitivity pixel 300 on another high-sensitivity pixel 300 adjacent to the high-sensitivity pixel 300 is also suppressed by the light-shielding wall 350. Furthermore, since there is no decrease in the area (opening area) of the light receiving surface and no decrease in the volume of the first photoelectric conversion element 101 in the high-sensitivity pixel 300, it is possible to obtain an image with higher quality.

(5-4. Third Modification)

Next, a third modification of the fourth embodiment will be described. The third modification of the fourth embodiment is, for example, an example in which the inter-pixel light-shielding portion 351 is provided asymmetrically with respect to the boundary 310 of each of the high-sensitivity pixel 300 and the low-sensitivity pixel 301, as compared with the pixel structure according to the above-described fourth embodiment.

Figure 33:
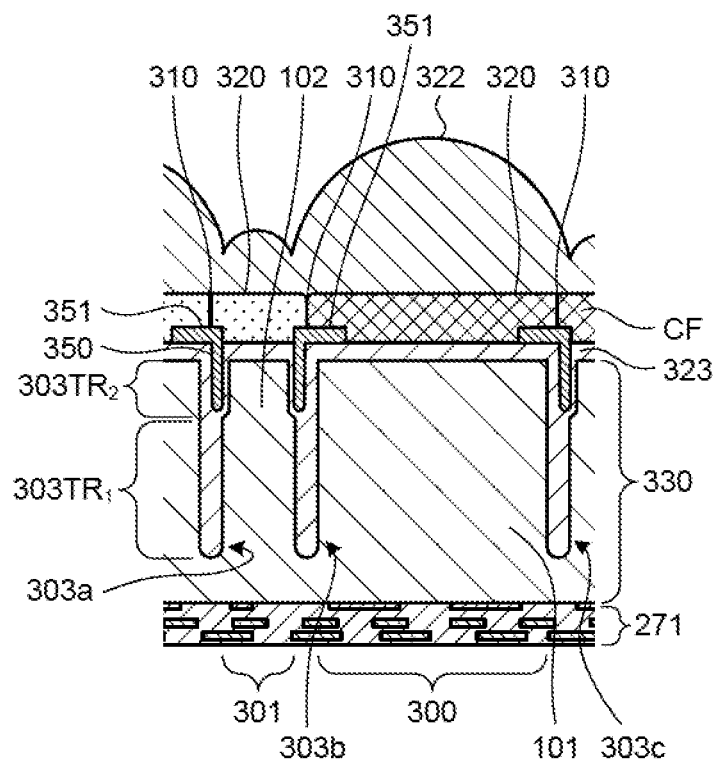
FIG. 33 is a schematic diagram schematically illustrating a cross section of a unit pixel according to a third modification of the fourth embodiment.

FIG. 33 is a schematic diagram schematically illustrating a cross section of a unit pixel according to the third modification of the fourth embodiment. Similarly to the above FIG. 27, FIG. 33 schematically illustrates a cross section in an alignment direction of the high-sensitivity pixels 300 and the low-sensitivity pixels 301, and omits illustrations of portions not deeply related to the description of the third modification of the fourth embodiment.

In the example of FIG. 33, the light-shielding wall 350 is provided closer to the low-sensitivity pixel 301 in each of the second trench light-shielding portions $303TR_2$, similarly to the above-described fourth embodiment and the like. On the other hand, the inter-pixel light-shielding portion 351 is provided asymmetrically with respect to the boundary 310 of each pixel. More specifically, in the example of FIG. 33, for example, the inter-pixel light-shielding portion 351 corresponding to the position of the trench light-shielding portion 303b is provided on the right side with respect to the boundary 310, and in this example, provided to be shifted in position to the side of the high-sensitivity pixel 300. Furthermore, the inter-pixel light-shielding portion 351 corresponding to the position of the trench light-shielding portion 303c is provided on the left side with respect to the boundary 310, in this example, provided to be shifted in position to the side of the high-sensitivity pixel 300.

Figure 34:
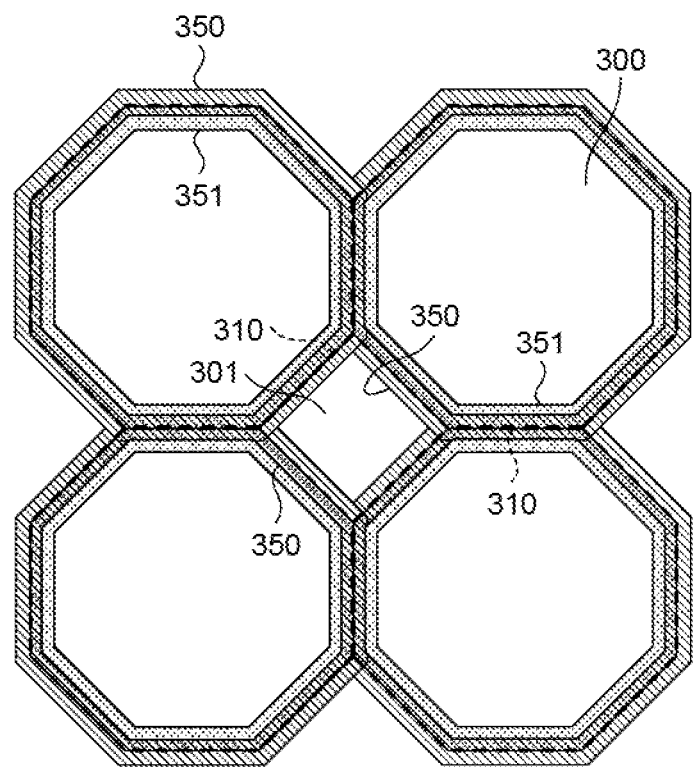
FIG. 34 is a schematic diagram illustrating arrangement of a light-shielding wall according to a second modification of the fourth embodiment.

FIG. 34 is a schematic diagram illustrating the arrangement of the inter-pixel light-shielding portion 351 according to the third modification of the fourth embodiment. In the example of FIG. 34, similarly to the second modification of the fourth embodiment described above, the light-shielding wall 350 is provided to be connected to the entire circumference of each of the high-sensitivity pixel 300 and the low-sensitivity pixel 301. On the other hand, the inter-pixel light-shielding portion 351 as an optical black region is provided so as to protrude toward the inside of the pixel in the high-sensitivity pixel 300. In the low-sensitivity pixel 301, conversely, the inter-pixel light-shielding portion 351 is provided to be shifted toward the outside of the pixel.

Although FIGS. 33 and 34 are exemplary cases where the inter-pixel light-shielding portion 351 is provided to be shifted toward the high-sensitivity pixel 300 at the boundary 310, and the inter-pixel light-shielding portion 351 protrudes toward inside of the high-sensitivity pixel 300, the arrangement is not limited to this example. For example, the inter-pixel light-shielding portion 351 may be provided to be shifted to the low-sensitivity pixel 301 side at the boundary 310, and the inter-pixel light-shielding portion 351 may protrude toward the inside of the low-sensitivity pixel 301.

That is, according to the third modification of the fourth embodiment, the light-shielding wall 350 suppresses incidence of obliquely incident light from the high-sensitivity pixel 300 to the low-sensitivity pixel 301 and suppress incidence of obliquely incident light from the high-sensitivity pixel 300 to another high-sensitivity pixel 300 adjacent to the high-sensitivity pixel 300. Therefore, the layout of the inter-pixel light-shielding portion 351 can be determined by focusing on characteristics such as a sensitivity ratio of pixels without considering color mixing between pixels. Examples of the sensitivity ratio in this case include a sensitivity ratio between the high-sensitivity pixel 300 and the adjacent low-sensitivity pixel 301, and a sensitivity ratio between one high-sensitivity pixel 300 and another high-sensitivity pixel 300 which is adjacent to the high-sensitivity pixel 300 and is provided with the color filter CF of a color different from that for the high-sensitivity pixel 300.

Even with such a structure, it is possible to suppress color mixing due to obliquely incident light from the high-sensitivity pixel 300 to the low-sensitivity pixel 301 described above. Furthermore, since it is also possible to suppress, by the light-shielding wall 350, incidence of obliquely incident light on the high-sensitivity pixel 300 on another high-sensitivity pixel 300 adjacent to the high-sensitivity pixel 300, leading to acquisition of an image with high quality. Furthermore, since incidence of obliquely incident light on the adjacent pixel is suppressed by the light-shielding wall 350, it is possible to improve the degree of freedom in designing the layout and the like of the inter-pixel light-shielding portion 351.

(5-5. Fourth Modification)

Next, a fourth modification of the fourth embodiment will be described. The fourth modification of the fourth embodiment is an example that uses a waveguide as the optical black region instead of the inter-pixel light-shielding portion 351 in the above-described fourth embodiment.

Figure 35:
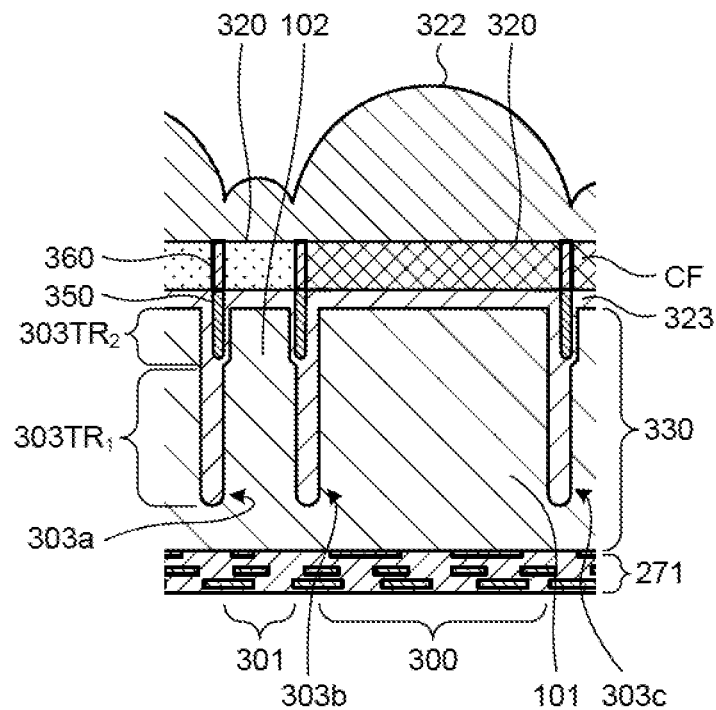
FIG. 35 is a schematic diagram schematically illustrating a cross section of a unit pixel according to a fourth modification of the fourth embodiment.

FIG. 35 is a schematic diagram schematically illustrating a cross section of a unit pixel according to the fourth modification of the fourth embodiment. Similarly to the above FIG. 27, FIG. 35 schematically illustrates a cross section in an alignment direction of the high-sensitivity pixels 300 and the low-sensitivity pixels 301, and omits illustrations of portions not deeply related to the description of the third modification of the fourth embodiment.

In the example of FIG. 35, a waveguide 360 is provided between the color filter CF and another color filter adjacent to the color filter CF instead of the inter-pixel light-shielding portion 351. The waveguide 360 is formed of a material having a refractive index lower than that of the color filter CF (that is, low refractive-index material). Since the waveguide 360 totally reflects light incident from the adjacent color filter CF at a predetermined incident angle or more, the waveguide 360 can be used as an optical black region and can achieve a function equivalent to that of the light-shielding wall 350.

Examples of the applicable low refractive-index material for forming the waveguide 360 include air (Air-gap), SiN, tetraethoxysilane (TEOS), or a resin (Polysiloxane-based resin or silica-based resin).

In this case, color mixing due to obliquely incident light from the high-sensitivity pixel 300 to the low-sensitivity pixel 301 described above can be suppressed by the light-shielding wall 350 and the waveguide 360. Furthermore, incidence of obliquely incident light on one high-sensitivity pixel 300 on another high-sensitivity pixel 300 adjacent to the high-sensitivity pixel 300 is also suppressed by the light-shielding wall 350 and the waveguide 360. This makes it possible to obtain an image with higher quality.

Furthermore, since the waveguide 360 is provided between the color filters CF, it is possible to effectively utilize the opening portions (light receiving surfaces) of the high-sensitivity pixels 300 and the low-sensitivity pixels 301 as compared with the case of using the inter-pixel light-shielding portion 351 formed of tungsten or the like as described above.

(5-6. Fifth Modification)

Next, a fifth modification of the fourth embodiment will be described. The fifth modification of the fourth embodiment is an example that uses the inter-pixel light-shielding portion 351 formed of tungsten or the like combined with the waveguide 360 described in the fourth modification of the fourth embodiment, as a structure of an optical black region that performs light-shielding between pixels.

Figure 36:
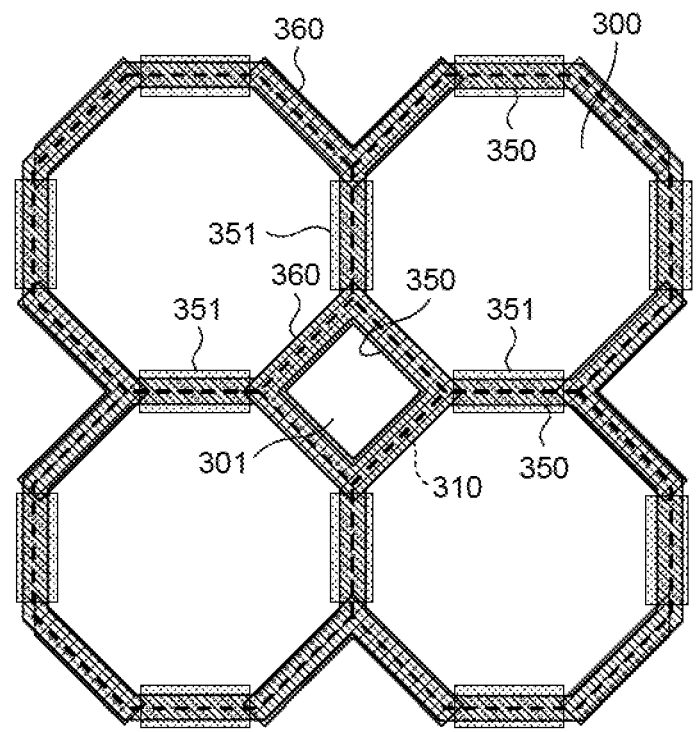
FIG. 36 is a schematic diagram illustrating the arrangement of an inter-pixel light-shielding portion and a waveguide according to a fifth modification of the fourth embodiment.

FIG. 36 is a schematic diagram illustrating the arrangement of the inter-pixel light-shielding portion 351 and the waveguide 360 according to the fifth modification of the fourth embodiment. Note that, in the example of FIG. 36, similarly to the second modification of the fourth embodiment described above, the light-shielding wall 350 is illustrated as being continuous in the entire circumference of each of the high-sensitivity pixel 300 and the low-sensitivity pixel 301.

In the example of FIG. 36, a waveguide 360 as an optical black region is provided for the entire circumference of the low-sensitivity pixel 301, that is, each boundary 310 between the low-sensitivity pixel 301 and the high-sensitivity pixel 300 adjacent to the low-sensitivity pixel 301. Furthermore, the inter-pixel light-shielding portion 351 as an optical black region is provided at each boundary 310 between one high-sensitivity pixel 300 and another high-sensitivity pixel 300 adjacent to the high-sensitivity pixel 300.

The arrangement of the inter-pixel light-shielding portion 351 and the waveguide 360 illustrated in FIG. 36 is an example, and is not limited to this example. For example, it is also possible to reverse the arrangement of the inter-pixel light-shielding portion 351 and the waveguide 360 so as to provide the inter-pixel light-shielding portion 351 on the entire circumference of the low-sensitivity pixel 301 and provide the waveguide 360 between the high-sensitivity pixels 300, or also possible to use other combinations.

Even in such a structure, color mixing due to obliquely incident light from the high-sensitivity pixel 300 to the low-sensitivity pixel 301 described above is suppressed by the waveguide 360 together with the light-shielding wall 350, and a higher-quality image can be obtained.

(5-7. Sixth Modification)

Figure 37:
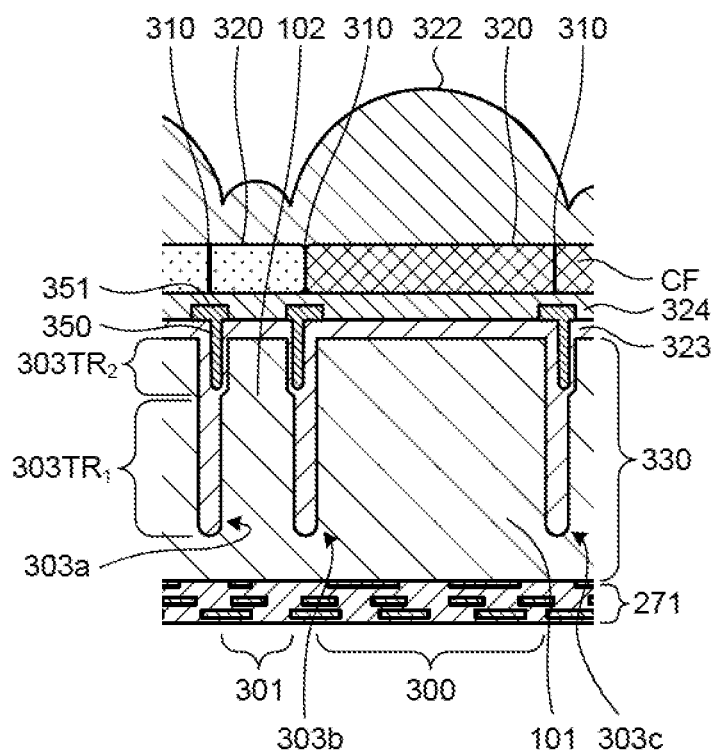
FIG. 37 is a schematic diagram schematically illustrating a cross section of a unit pixel according to a sixth modification of the fourth embodiment.

Next, a sixth modification of the fourth embodiment will be described. FIG. 37 is a schematic diagram schematically illustrating a cross section of a unit pixel according to the sixth modification of the fourth embodiment. Similarly to the above FIG. 27, FIG. 37 schematically illustrates a cross section in an alignment direction of the high-sensitivity pixels 300 and the low-sensitivity pixels 301, and omits illustrations of portions not deeply related to the description of the sixth modification of the fourth embodiment.

In the above-described fourth embodiment, the color filter CF is directly provided on the interlayer insulating film 323. In contrast, in the sixth modification of the fourth embodiment, as illustrated in FIG. 37, there is provided a planarization film 324 on the interlayer insulating film 323, and the color filter CF is provided on the planarization film 324. In the example of FIG. 37, the planarization film 324 is provided to cover the interlayer insulating film 323 and the inter-pixel light-shielding portion 351.

Even with such a structure, it is possible to suppress color mixing due to obliquely incident light from the high-sensitivity pixel 300 to the low-sensitivity pixel 301 described above. Furthermore, since it is also possible to suppress, by the light-shielding wall 350, incidence of obliquely incident light on the high-sensitivity pixel 300 on another high-sensitivity pixel 300 adjacent to the high-sensitivity pixel 300, leading to acquisition of an image with high quality.

(5-8. Other Modifications)

Next, other modifications of the fourth embodiment will be described. In the above description, as a first category, the following two structures have been described for the upper layer structure, for example, the structure of the color filter CF.

(A) Structure in which the color filter CF is directly provided on the interlayer insulating film 323 (fourth embodiment)

(B) Structure in which the color filter CF is provided on the planarization film 324 on the interlayer insulating film 323 (sixth modification of fourth embodiment)

Furthermore, as a second category, the following three patterns have been described for the layout pattern of the light-shielding wall 350.

(a) Pattern in which the light-shielding wall 350 between the high-sensitivity pixels 300 is isolated (fourth embodiment)

(b) Pattern in which the light-shielding wall 350 is provided only on entire circumference of the low-sensitivity pixel 301 (first modification of fourth embodiment)

(c) Pattern in which the light-shielding wall 350 is provided continuously on the entire circumference of each of the high-sensitivity pixel 300 and the low-sensitivity pixel 301 (second modification of fourth embodiment)

In addition, as a third category, the following three structures have been described as the structure of the optical black region.

(A) Optical black region using, as normal, the inter-pixel light-shielding portion 351 formed of tungsten or the like (fourth embodiment)

(B) Optical black region using the waveguide 360 (fourth modification of fourth embodiment)

(C) Optical black region combining the inter-pixel light-shielding portion 351 and the waveguide 360 (fifth modification of fourth embodiment)

Furthermore, as a fourth category, the following two patterns have been described as the layout pattern of the optical black region.

(β) Symmetrical pattern with respect to the boundary 310 between pixels (fourth embodiment)

(β) Asymmetric pattern with respect to the boundary 310 between pixels (third modification of fourth embodiment)

It is possible to arbitrarily select and combine each one from each category, that is, one from the two structures of the first category, one from the three patterns of the second category, one from the three patterns of the third category, and one from the two patterns of the fourth category. That is, the total number of patterns of the modifications by the combination is (two structures of the first category)×(three patterns of the second category)×(three patterns of the third category)×(two patterns of the fourth category)=36 patterns.

In any of these 36 patterns, it is possible to obtain an effect of suppressing at least color mixing due to obliquely incident light from the high-sensitivity pixels 300 to the low-sensitivity pixels 301 without degrading the sensitivity and saturation characteristics of the high-sensitivity pixels 300.

6. Fifth Embodiment (6-1. Application Example of Technology of Present Disclosure)

Figure 38:
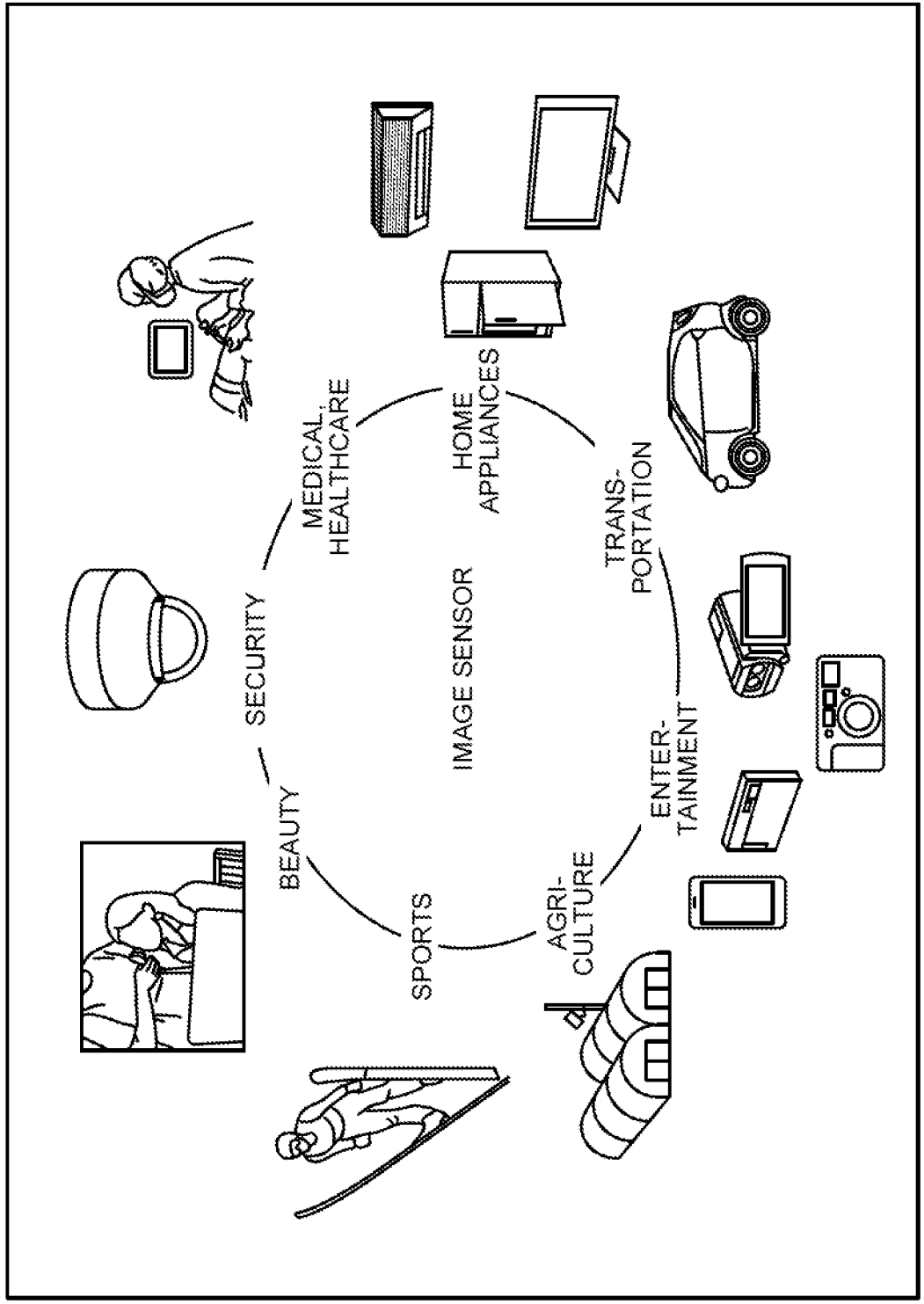
FIG. 38 is a diagram illustrating a usage example of an imaging device to which the technology of the present disclosure is applied.

Next, as a fifth embodiment, application examples of the imaging element (CMOS image sensor 10) according to the first embodiment, the second embodiment, the third embodiment, and the fourth embodiment, and modifications of the individual embodiments according to the present disclosure will be described. FIG. 38 is a diagram illustrating a usage example, which is an example of using the imaging element according to the first embodiment, the second embodiment, the third embodiment, the fourth embodiment, and modifications of the individual embodiments described above.

The imaging element according to the first embodiment, the second embodiment, the third embodiment, the fourth embodiment, and the modifications of the individual embodiments described above can be used, for example, in various cases of sensing light such as visible light, infrared light, ultraviolet light, and X-rays as follows.

A device that captures images used for viewing for entertainment, such as digital cameras and mobile devices with a camera function.

A device for transportation, such as an in-vehicle sensor that images a front, back, surroundings, interior, or the like, of a vehicle in order to ensure safe driving including automatic stop or the like, and to recognize driver's states, a surveillance camera to monitor traveling vehicles and roads, and a range-finding sensor to perform measurement of a distance between vehicles, or the like.

A device for household appliances including a TV, a refrigerator, an air conditioner, or the like to image user's gesture and perform operation of the device according to the gesture.

A device used for medical treatment and healthcare, such as endoscopes and devices that perform angiography by receiving infrared light.

A device used for security, such as surveillance cameras for crime prevention and cameras for personal authentication.

A device used for beauty, such as a skin measuring device that images the skin and a microscope that images the scalp.

A device used for sports, such as action cameras and wearable cameras for sports applications.

A device used for agriculture, such as cameras for monitoring the conditions of fields and crops.

(6-2. Application Example to Endoscopic Surgery System)

The technology according to the present disclosure (the present technology) is applicable to various products. For example, the techniques according to the present disclosure may be applied to endoscopic surgery systems.

Figure 39:
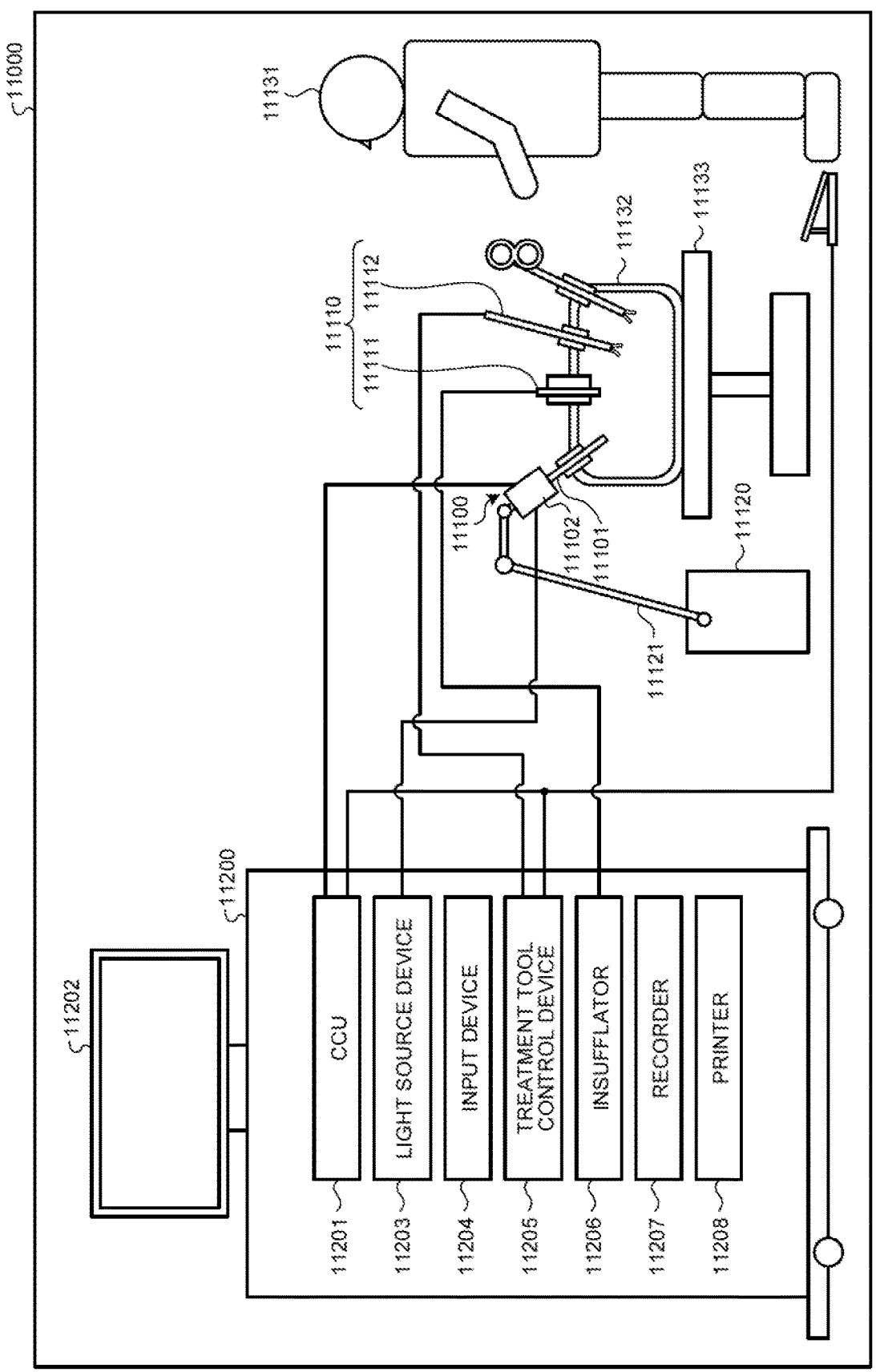
FIG. 39 is a diagram illustrating an example of a schematic configuration of an endoscopic surgery system.

FIG. 39 is a diagram illustrating an example of a schematic configuration of an endoscopic surgery system to which the technology (the present technology) according to the present disclosure is applicable.

FIG. 39 illustrates a scene in which a surgeon (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 equipped with various devices for endoscopic surgery.

The endoscope 11100 includes: a lens barrel 11101 in which a region of a predetermined length from a distal end is to be inserted into the body cavity of the patient 11132; and a camera head 11102 connected to a proximal end of the lens barrel 11101. The example in the FIG. illustrates the endoscope 11100 as a rigid endoscope having the lens barrel 11101 of a rigid type. However, the endoscope 11100 can be a flexible endoscope having a flexible lens barrel.

The distal end of the lens barrel 11101 has an opening to which an objective lens is fitted. The endoscope 11100 is connected to a light source device 11203. The light generated by the light source device 11203 is guided to the distal end of the lens barrel by a light guide extending inside the lens barrel 11101, and the guided light will be emitted toward an observation target in the body cavity of the patient 11132 through the objective lens. The endoscope 11100 may be a forward viewing endoscope, a forward-oblique viewing endoscope, or a side-viewing endoscope.

An optical system and an imaging element are provided inside the camera head 11102. Reflected light (observation light) from the observation target is focused on the imaging element by the optical system. The observation light is photoelectrically converted by the imaging element so as to generate an electric signal corresponding to the observation light, that is, an image signal corresponding to the observation image. The image signal is transmitted as RAW data to a camera control unit (CCU) 11201.

The CCU 11201 is formed with a central processing unit (CPU), a graphics processing unit (GPU), or the like, and integrally controls operations of the endoscope 11100 and a display device 11202. Furthermore, the CCU 11201 receives an image signal from the camera head 11102, and performs various types of image processing on the image signal for displaying an image based on the image signal, such as developing processing (demosaicing).

Under the control of the CCU 11201, the display device 11202 displays an image based on the image signal that has undergone image processing by the CCU 11201.

The light source device 11203 includes a light source such as a light emitting diode (LED), for example, and supplies the irradiation light for imaging the surgical site or the like to the endoscope 11100.

An input device 11204 is an input interface to the endoscopic surgery system 11000. The user can input various types of information and input instructions to the endoscopic surgery system 11000 via the input device 11204.

For example, the user inputs an instruction and the like to change the imaging conditions (type of irradiation light, magnification, focal length, and the like) by the endoscope 11100.

A treatment tool control device 11205 controls the drive of the energy treatment tool 11112 for ablation or dissection of tissue, sealing of blood vessels, or the like. In order to inflate the body cavity of the patient 11132 to ensure a view field for the endoscope 11100 and to ensure a working space of the surgeon, an insufflator 11206 pumps gas into the body cavity through the insufflation tube 11111. A recorder 11207 is a device capable of recording various types of information associated with the surgery. A printer 11208 is a device capable of printing various types of information associated with surgery in various forms such as text, images, and graphs.

The light source device 11203 that supplies the endoscope 11100 with irradiation light when imaging a surgical site can be constituted with, for example, an LED, a laser light source, or a white light source with a combination of these. In a case where the white light source is constituted with the combination of the RGB laser light sources, it is possible to control the output intensity and the output timing of individual colors (individual wavelengths) with high accuracy. Accordingly, it is possible to perform white balance adjustment of the captured image on the light source device 11203. Furthermore, in this case, by emitting the laser light from each of the RGB laser light sources to an observation target on the time-division basis and by controlling the drive of the imaging element of the camera head 11102 in synchronization with the light emission timing, it is also possible to capture the image corresponding to each of RGB colors on the time division basis. According to this method, a color image can be obtained without providing a color filter on the imaging element.

Furthermore, the drive of the light source device 11203 may be controlled so as to change the intensity of the output light at predetermined time intervals. With the control of the drive of the imaging element of the camera head 11102 in synchronization with the timing of the change of the intensity of the light so as to obtain images on the time division basis and combine the images, it is possible to generate an image with high dynamic range without so called blackout shadows or blown out highlights (overexposure).

Furthermore, the light source device 11203 may be configured to be able to supply light in a predetermined wavelength band corresponding to special light observation. The special light observation is used to perform narrowband light observation (narrow band imaging). The narrowband light observation uses the wavelength dependency of the light absorption in the body tissue and emits light in a narrower band compared with the irradiation light (that is, white light) at normal observation, thereby imaging a predetermined tissue such as a blood vessel of the mucosal surface layer with high contrast. Alternatively, the special light observation may include fluorescence observation to obtain an image by fluorescence generated by emission of excitation light. Fluorescence observation can be performed to observe fluorescence emitted from a body tissue to which excitation light is applied (autofluorescence observation), can be performed with topical administration of reagent such as indocyanine green (ICG) to the body tissue, and together with this, excitation light corresponding to the fluorescence wavelength of the reagent is emitted to the body tissue to obtain a fluorescent image, or the like. The light source device 11203 can be configured to be able to supply narrow band light and/or excitation light corresponding to such special light observation.

Figure 40:
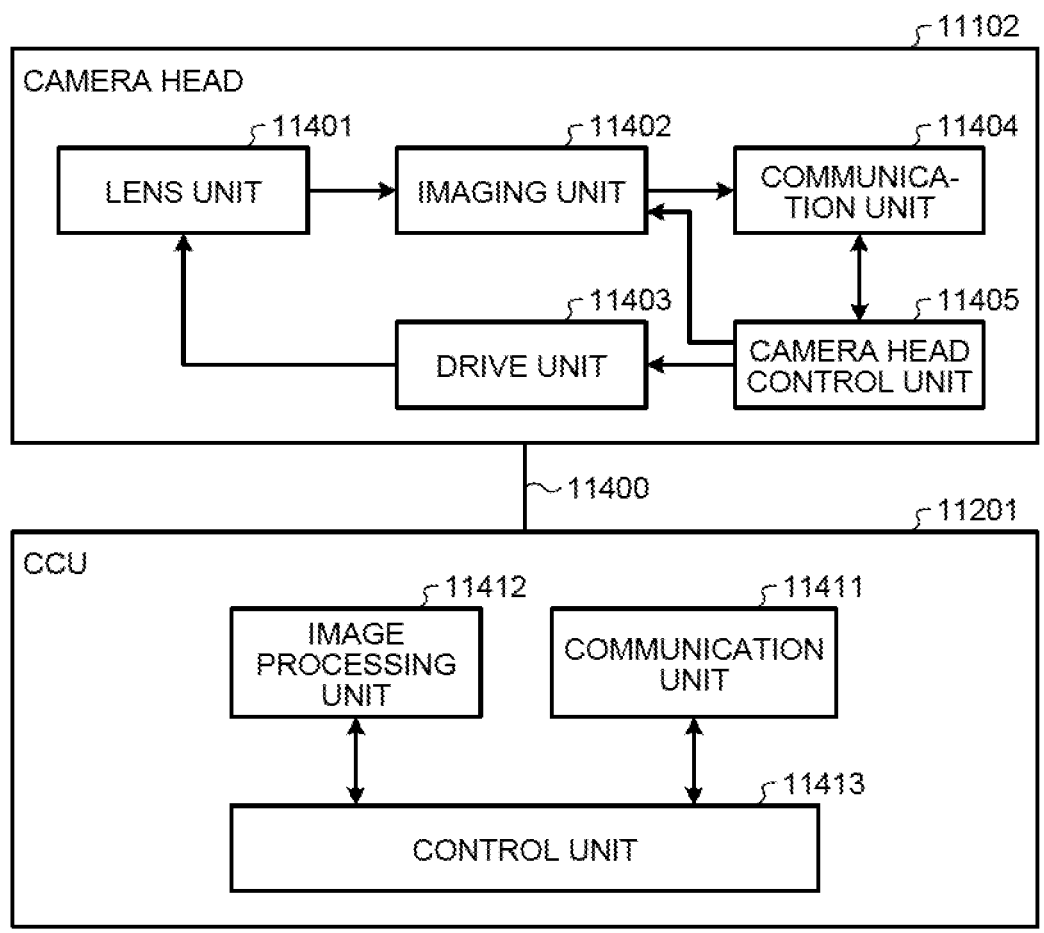
FIG. 40 is a block diagram illustrating an example of a functional configuration of a camera head and a CCU.

FIG. 40 is a block diagram illustrating an example of the functional configuration of the camera head 11102 and the CCU 11201 illustrated in FIG. 39.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected to each other by a transmission cable 11400.

The lens unit 11401 is an optical system provided at a connection portion with the lens barrel 11101. The observation light captured from the distal end of the lens barrel 11101 is guided to the camera head 11102 so as to be incident on the lens unit 11401. The lens unit 11401 is formed by a combination of a plurality of lenses including a zoom lens and a focus lens.

The imaging unit 11402 is constituted with an imaging element. The number of imaging elements forming the imaging unit 11402 may be one (single-plate type) or in plurality (multi-plate type). When the imaging unit 11402 is a multi-plate type, for example, each of imaging elements may generate an image signal corresponding to one color of RGB, and a color image may be obtained by combining these individual color image signals. Alternatively, the imaging unit 11402 may include a pair of imaging elements for acquiring image signals individually for the right eye and the left eye corresponding to three-dimensional (3D) display. The 3D display enables the surgeon 11131 to grasp the depth of the living tissue more accurately in the surgical site. When the imaging unit 11402 is a multi-plate type, a plurality of the lens units 11401 may be provided corresponding to the imaging elements.

Furthermore, the imaging unit 11402 does not necessarily have to be provided on the camera head 11102. For example, the imaging unit 11402 may be provided inside the lens barrel 11101 immediately behind the objective lens.

The drive unit 11403 includes an actuator, and moves the zoom lens and the focus lens of the lens unit 11401 by a predetermined distance along the optical axis under the control of the camera head control unit 11405. With this operation, the magnification and focal point of the image captured by the imaging unit 11402 can be appropriately adjusted.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling the drive of the camera head 11102 from the CCU 11201 and supplies the control signal to the camera head control unit 11405. The control signal includes information associated with imaging conditions, such as information designating a frame rate of a captured image, information designating an exposure value at the time of imaging, and/or information designating the magnification and focal point of the captured image.

Note that the imaging conditions such as the frame rate, the exposure value, the magnification, and the focal point may be appropriately designated by the user, or may be automatically set by the control unit 11413 of the CCU 11201 based on the acquired image signal. In the latter case, an auto exposure (AE) function, an auto focus (AF) function, and an auto white balance (AWB) function are to be installed in the endoscope 11100.

The camera head control unit 11405 controls the drive of the camera head 11102 based on the control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the drive of the camera head 11102 to the camera head 11102. The image signal and the control signal can be transmitted by electric communication, optical communication, or the like.

The image processing unit 11412 performs various types of image processing on the image signal which is the RAW data transmitted from the camera head 11102.

The control unit 11413 performs various controls related to the imaging of the surgical site or the like by the endoscope 11100 and related to the display of the captured image obtained by the imaging of the surgical site or the like. For example, the control unit 11413 generates a control signal for controlling the drive of the camera head 11102.

Furthermore, the control unit 11413 controls the display device 11202 to display the captured image including an image of a surgical site or the like based on the image signal that has undergone image processing by the image processing unit 11412. At this time, the control unit 11413 may recognize various objects in the captured image by using various image recognition techniques. For example, the control unit 11413 detects the shape, color, or the like of an edge of an object included in the captured image, making it possible to recognize a surgical tool such as forceps, a specific living body site, bleeding, a mist at the time of using the energy treatment tool 11112, or the like. When displaying the captured image on the display device 11202, the control unit 11413 may superimpose and display various types of surgical operation support information on the image of the surgical site by using the recognition result. By displaying the surgical operation support information in a superimposed manner so as to be presented to the surgeon 11131, it is possible to reduce the burden on the surgeon 11131 and enable the surgeon 11131 to proceed with the operation with higher reliability.

The transmission cable 11400 that connects the camera head 11102 and the CCU 11201 is an electric signal cable that supports electric signal communication, an optical fiber that supports optical communication, or a composite cable thereof.

Here, while an illustrated example in which wired communication is performed using the transmission cable 11400, the communication between the camera head 11102 and the CCU 11201 may be performed wirelessly.

An example of the endoscopic surgery system to which the technology according to the present disclosure can be applied has been described above. The technique according to the present disclosure can be applied to, for example, the endoscope 11100 and the imaging unit 11402 of the camera head 11102 among the configurations described above. Specifically, the above-described imaging element can be applied to the imaging unit 10112. The imaging element according to the present disclosure can suppress crosstalk from the high-sensitivity pixel 300 to the low-sensitivity pixel 301, making it possible to capture an image with higher quality. This enables the surgeon 11131 to proceed with the surgery more reliably, for example.

Although the endoscopic surgery system has been described here as an example, the technique according to the present disclosure may be applied to, for example, a microscopic surgery system or the like.

(6-3. Application Example to Moving Objects)

The technology according to the present disclosure may be further applied to devices mounted on various moving objects such as automobiles, electric vehicles, hybrid electric vehicles, motorcycles, bicycles, personal mobility, airplanes, drones, ships, and robots.

Figure 41:
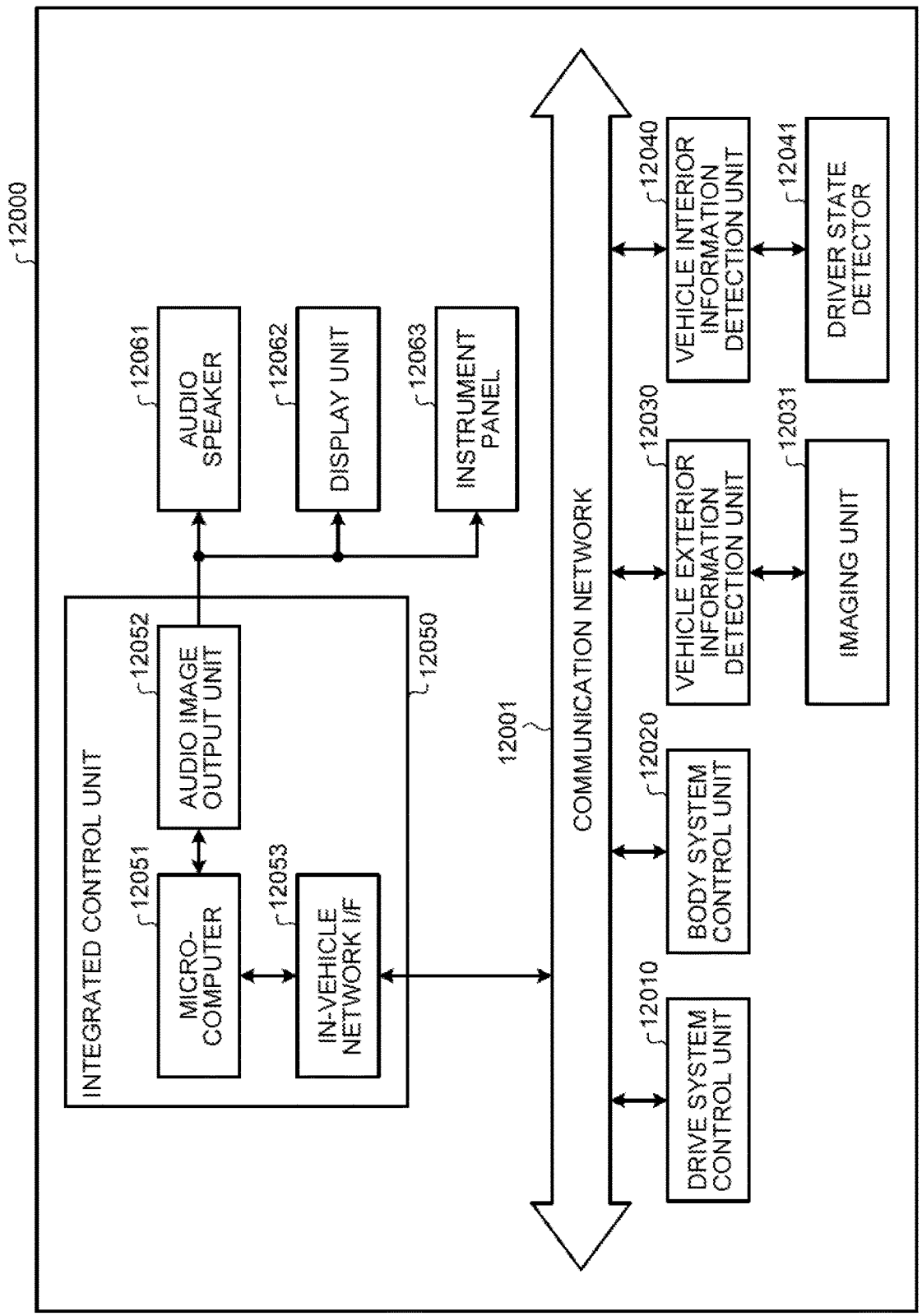
FIG. 41 is a block diagram illustrating an example of a schematic configuration of a vehicle control system.

FIG. 41 is a block diagram illustrating a schematic configuration example of a vehicle control system, which is an example of a moving body control system to which the technology according to the present disclosure is applicable.

A vehicle control system 12000 includes a plurality of electronic control units connected via a communication network 12001. In the example illustrated in FIG. 41, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls the operation of the device related to the drive system of the vehicle in accordance with various programs. For example, the drive system control unit 12010 functions as a control device of a driving force generation device that generates a driving force of a vehicle such as an internal combustion engine or a driving motor, a driving force transmission mechanism that transmits a driving force to the wheels, a steering mechanism that adjusts steering angle of the vehicle, a braking device that generates a braking force of the vehicle, or the like.

The body system control unit 12020 controls the operation of various devices mounted on the vehicle body in accordance with various programs. For example, the body system control unit 12020 functions as a control device for a keyless entry system, a smart key system, a power window device, or various lamps such as a head lamp, a back lamp, a brake lamp, a turn signal lamp, or a fog lamp. In this case, the body system control unit 12020 can receive input of radio waves transmitted from a portable device that substitutes for the key or signals from various switches. The body system control unit 12020 receives the input of these radio waves or signals and controls the door lock device, the power window device, the lamp, or the like, of the vehicle.

The vehicle exterior information detection unit 12030 detects information outside the vehicle equipped with the vehicle control system 12000. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform an object detection process or a distance detection process of people, vehicles, obstacles, signs, or characters on the road surface based on the received image. The vehicle exterior information detection unit 12030 performs image processing on the received image, for example, and performs an object detection process and a distance detection process based on the result of the image processing.

The imaging unit 12031 is an optical sensor that receives light and outputs an electric signal corresponding to the amount of received light. The imaging unit 12031 can output the electric signal as an image and also as distance measurement information. Furthermore, the light received by the imaging unit 12031 may be visible light or invisible light such as infrared rays.

The vehicle interior information detection unit 12040 detects vehicle interior information. The vehicle interior information detection unit 12040 is connected to a driver state detector 12041 that detects the state of the driver, for example. The driver state detector 12041 may include a camera that images the driver, for example. The vehicle interior information detection unit 12040 may calculate the degree of fatigue or degree of concentration of the driver or may determine whether the driver is dozing off based on the detection information input from the driver state detector 12041.

The microcomputer 12051 can calculate a control target value of the driving force generation device, the steering mechanism, or the braking device based on vehicle external/ internal information obtained by the vehicle exterior information detection unit 12030 or the vehicle interior information detection unit 12040, and can output a control command to the drive system control unit 12010. For example, the microcomputer 12051 can perform cooperative control for the purpose of achieving a function of an advanced driver assistance system (ADAS) including collision avoidance or impact mitigation of vehicles, follow-up running based on an inter-vehicle distance, cruise control, vehicle collision warning, vehicle lane departure warning, or the like.

Furthermore, it is allowable that the microcomputer 12051 controls the driving force generation device, the steering mechanism, the braking device, or the like, based on the information regarding the surroundings of the vehicle obtained by the vehicle exterior information detection unit 12030 or the vehicle interior information detection unit 12040, thereby performing cooperative control for the purpose of autonomous driving or the like, in which the vehicle performs autonomous traveling without depending on the operation of the driver.

Furthermore, the microcomputer 12051 can output a control command to the body system control unit 12020 based on the vehicle exterior information acquired by the vehicle exterior information detection unit 12030. For example, the microcomputer 12051 can control the head lamp in accordance with the position of the preceding vehicle or the oncoming vehicle sensed by the vehicle exterior information detection unit 12030, and thereby can perform cooperative control aiming at antiglare such as switching the high beam to low beam.

The audio image output unit 12052 transmits an output signal in the form of at least one of audio or image to an output device capable of visually or audibly notifying the occupant of the vehicle or the outside of the vehicle of information. In the example of FIG. 29, an audio speaker 12061, a display unit 12062, and an instrument panel 12063 are illustrated as exemplary output devices. The display unit 12062 may include, for example, at least one of an onboard display and a head-up display.

Figure 42:
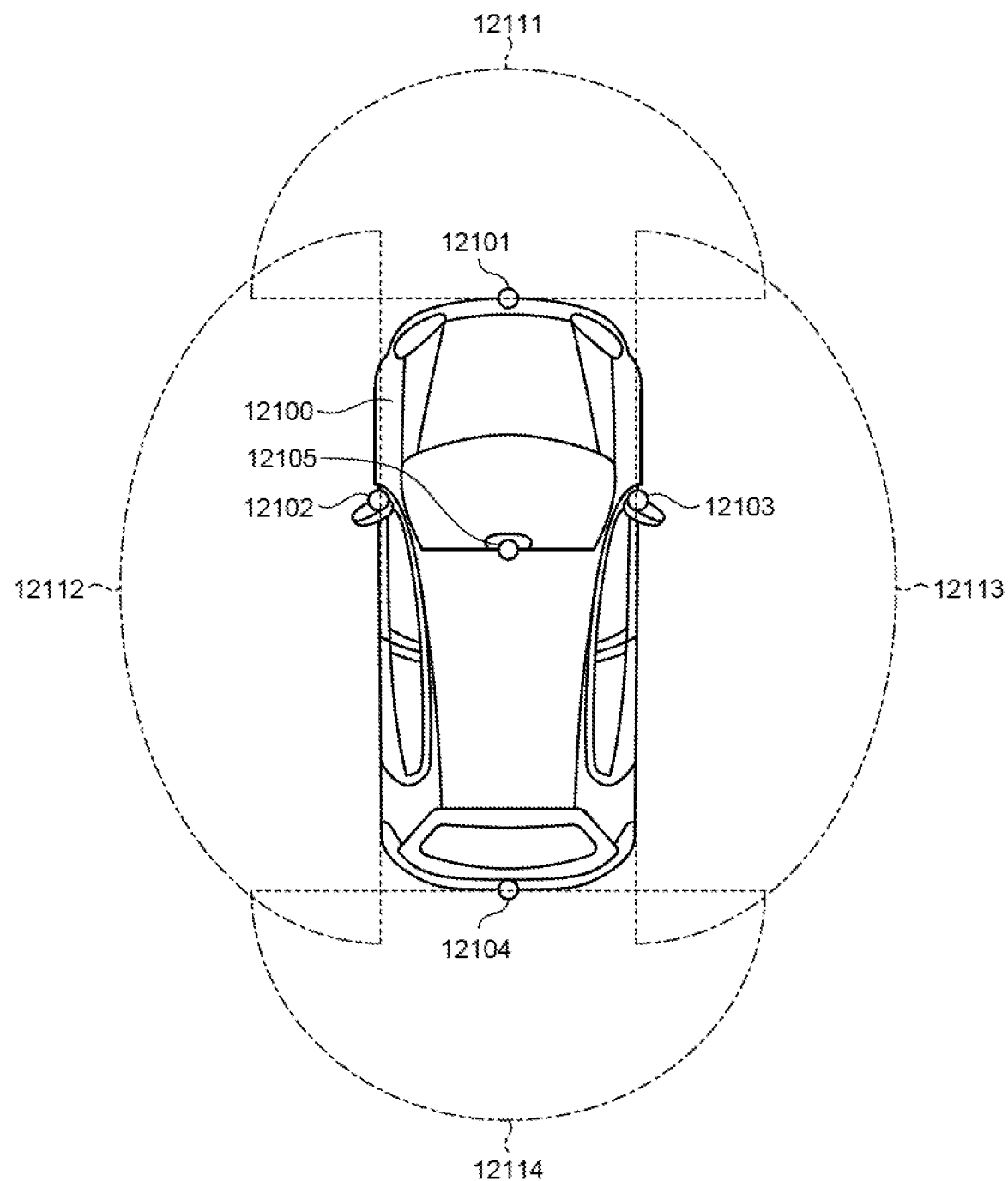
FIG. 42 is a diagram illustrating an example of installation positions of a vehicle exterior information detection unit and an imaging unit.

FIG. 42 is a diagram illustrating an example of an installation position of the imaging unit 12031. In FIG. 30, a vehicle 12100 has imaging units 12101, 12102, 12103, 12104 and 12105 as imaging units 12031.

For example, the imaging units 12101, 12102, 12103, 12104, and 12105 are installed at positions on a vehicle 12100, including a nose, a side mirror, a rear bumper, a back door, an upper portion of the windshield in a vehicle interior, or the like. The imaging unit 12101 provided on the front nose and the imaging unit 12105 provided on the upper portion of the windshield in the vehicle interior mainly acquire an image in front of the vehicle 12100. The imaging units 12102 and 12103 provided in the side mirrors mainly acquire images of the side of the vehicle 12100. The imaging unit 12104 provided on the rear bumper or the back door mainly acquires an image behind the vehicle 12100. The images in front acquired by the imaging units 12101 and 12105 are mainly used for detecting a preceding vehicle or a pedestrian, an obstacle, a traffic light, a traffic sign, a lane, or the like.

Note that FIG. 30 illustrates an example of the imaging range of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, by superimposing pieces of image data captured by the imaging units 12101 to 12104, it is possible to obtain a bird's-eye view image of the vehicle 12100 as viewed from above.

At least one of the imaging units 12101 to 12104 may have a function of acquiring distance information. For example, at least one of the imaging units 12101 to 12104 may be a stereo camera including a plurality of imaging elements, or an imaging element having pixels for phase difference detection.

For example, the microcomputer 12051 can calculate a distance to each of three-dimensional objects in the imaging ranges 12111 to 12114 and a temporal change (relative speed with respect to the vehicle 12100) of the distance based on the distance information obtained from the imaging units 12101 to 12104, and thereby can extract a three-dimensional object traveling at a predetermined speed (for example, 0 km/h or more) in substantially the same direction as the vehicle 12100 being the closest three-dimensional object on the traveling path of the vehicle 12100, as a preceding vehicle. Furthermore, the microcomputer 12051 can set an inter-vehicle distance to be ensured to the preceding vehicle in advance, and can perform automatic brake control (including follow-up stop control), automatic acceleration control (including follow-up start control), or the like. In this manner, it is possible to perform cooperative control for the purpose of autonomous driving or the like, in which the vehicle autonomously travels without depending on the operation of the driver.

For example, based on the distance information obtained from the imaging units 12101 to 12104, the microcomputer 12051 can extract three-dimensional object data regarding the three-dimensional object with classification into three-dimensional objects, such as a two-wheeled vehicle, a regular vehicle, a large vehicle, a pedestrian, and other three-dimensional objects such as a utility pole, and can use the data for automatic avoidance of obstacles. For example, the microcomputer 12051 distinguishes obstacles around the vehicle 12100 into obstacles having high visibility to the driver of the vehicle 12100 and obstacles having low visibility to the driver. Subsequently, the microcomputer 12051 determines a collision risk indicating the risk of collision with each of obstacles. When the collision risk is a set value or more and there is a possibility of collision, the microcomputer 12051 can output an alarm to the driver via the audio speaker 12061 and the display unit 12062, and can perform forced deceleration and avoidance steering via the drive system control unit 12010, thereby achieving driving assistance for collision avoidance.

At least one of the imaging units 12101 to 12104 may be an infrared camera that detects infrared rays. For example, the microcomputer 12051 can recognize a pedestrian by determining whether a pedestrian is present in the captured images of the imaging units 12101 to 12104. Such pedestrian recognition is performed, for example, by a procedure of extracting feature points in a captured image of the imaging units 12101 to 12104 as an infrared camera, and by a procedure of performing pattern matching processing on a series of feature points indicating the contour of the object to discriminate whether it is a pedestrian. When the microcomputer 12051 determines that a pedestrian is present in the captured images of the imaging units 12101 to 12104 and recognizes a pedestrian, the audio image output unit 12052 controls the display unit 12062 to perform superimposing display of a rectangular contour line for emphasis to the recognized pedestrian. Furthermore, the audio image output unit 12052 may cause the display unit 12062 to display an icon indicating a pedestrian or the like at a desired position.

Hereinabove, an example of the vehicle control system to which the technology according to the present disclosure is applicable has been described. The technology according to the present disclosure is applicable to the imaging unit 12031, for example, among the configurations described above.

Specifically, the above-described imaging element can be applied to the imaging unit 12031. The imaging element according to the present disclosure can suppress crosstalk from the high-sensitivity pixel 300 to the low-sensitivity pixel 301, making it possible to capture an image with higher quality. This makes it possible to realize more accurate pedestrian recognition and vehicle control.

The effects described in the present specification are merely examples, and thus, there may be other effects, not limited to the exemplified effects.

Note that the present technology can also have the following configurations.

(1) An imaging element comprising:
    a unit pixel including
        a first pixel having a first photoelectric conversion element and
        a second pixel having a second photoelectric conversion element and arranged adjacent to the first pixel; and
        an accumulation portion that accumulates a charge generated by the second photoelectric conversion element and converts the accumulated charge into a voltage,
    wherein the accumulation portion is disposed at a boundary between the unit pixel and the another unit pixel adjacent to the unit pixel.

(2) The imaging element according to the above (1),
    wherein the accumulation portion is disposed at a boundary where the first pixel and the another first pixel are provided adjacent to each other.

(3) The imaging element according to the above (1) or (2),
    further comprising a trench light-shielding portion provided at the boundary,
    wherein the trench light-shielding portion is provided at least at the boundary where the accumulation portion is disposed.

(4) The imaging element according to any one of the above (1) to (3), wherein the accumulation portion is disposed at the boundary in a direction of a long side of a pixel array in which the unit pixels are arranged in a matrix array.

(5) The imaging element according to any one of the above (1) to (4),
wherein the first pixel is a pixel having higher sensitivity compared to the second pixel.

(6) The imaging element according to the above (5),
wherein an area of a light receiving surface of the first pixel is larger than an area of a light receiving surface of the second pixel, and
the sensitivity is sensitivity defined according to a size of an area of a light receiving surface of each of the first pixel and the second pixel.

(7) An imaging element driving method, the method being a method of driving an imaging element, the imaging element including:
a unit pixel including a first pixel having a first photoelectric conversion element and including a second pixel having a second photoelectric conversion element, the second pixel being arranged adjacent to the first pixel; and
an accumulation portion that accumulates the charge generated by the second photoelectric conversion element and converts the accumulated charge into a voltage, the accumulation portion being disposed at a boundary between the unit pixel and the another unit pixel adjacent to the unit pixel,
the method being a method of driving the imaging element to perform processes comprising:
accumulating a first charge generated by the first photoelectric conversion element in the accumulation portion;
outputting a signal based on the first charge accumulated in the accumulation portion to a signal line;
initializing the accumulation portion after the signal based on the first charge has been output to the signal line;
accumulating a second charge generated by the second photoelectric conversion element in the initialized accumulation portion; and
outputting a signal based on the second charge accumulated in the accumulation portion to the signal line.

(8) An electronic device comprising:
an imaging element including a unit pixel including a first pixel having a first photoelectric conversion element and including a second pixel having a second photoelectric conversion element, the second pixel being arranged adjacent to the first pixel, and
an accumulation portion that accumulates the charge generated by the second photoelectric conversion element and converts the accumulated charge into a voltage, the accumulation portion being disposed at a boundary between the unit pixel and the another unit pixel adjacent to the unit pixel;
a signal processing unit that executes signal processing on a pixel signal based on the charge accumulated in the accumulation portion of the imaging element and generates image data by the signal processing; and
a storage unit that stores the image data generated by the signal processing unit.

(9) An imaging element comprising:
a pixel array including a plurality of pixels; and
a light-shielding portion provided between each of the plurality of pixels included in the pixel array,
wherein the light-shielding portion is formed to have a width of a portion narrowest between two pixels arranged adjacent to each other among the plurality of pixels such that the width is defined according to a difference in sensitivity between the two pixels.

(10) The imaging element according to the above (9),
wherein the plurality of pixels is arranged such that a unit pixel is arranged in a matrix array, the unit pixel including a first pixel and a second pixel, the second pixel having lower sensitivity compared to the first pixel and arranged adjacent to the first pixel, and
the light-shielding portion is formed to have a width of a narrowest portion between the first pixel and the second pixel such that the width is wider than a width between the first pixels and wider than a width between the second pixels.

(11) The imaging element according to the above (9) or (10),
wherein the light-shielding portion has a width of a portion between two adjacent pixels, the width being defined such that a width of a narrowest portion on a side of a pixel having higher sensitivity among the two pixels is wider than a width of a narrowest portion on a side of a pixel having lower sensitivity among the two pixels, with a boundary between the two pixels as a base point.

(12) The imaging element according to any one of the above (9) to (11),
wherein the sensitivity is sensitivity defined according to an area of a light receiving surface of each of the plurality of pixels.

(13) An electronic device comprising:
an imaging element including a plurality of pixels arranged adjacent to each other and including a light-shielding portion provided between each of the plurality of pixels,
the light-shielding portion being formed to have a width of a narrowest portion between two pixels arranged adjacent to each other among the plurality of pixels such that the width is defined according to a difference in sensitivity between the two pixels;
a signal processing unit that executes signal processing on a pixel signal read from the imaging element and generates image data by the signal processing; and
a storage unit that stores the image data generated by the signal processing unit.

(14) An imaging element comprising:
a pixel array including a plurality of pixels; and
a trench light-shielding portion provided around each of the plurality of pixels included in the pixel array,
wherein the trench light-shielding portion is provided without a gap around a first pixel among the plurality of pixels, and the trench light-shielding portion is provided around a second pixel adjacent to the first pixel such that the trench light-shielding portion provided around the second pixel is spaced apart from the trench light-shielding portion provided around the first pixel.

(15) The imaging element according to the above (14),
wherein a trench light-shielding portion is formed in a boundary between the first pixel and the second pixel,
the trench light-shielding portion to be formed being thicker than the trench light-shielding portion provided at a boundary between the first pixels.

(16) The imaging element according to the above (14) or (15),
wherein the second pixel is higher in sensitivity than the first pixel.
(17) The imaging element according to the above (16),
wherein the sensitivity is sensitivity defined according to an area of a light receiving surface of each of the plurality of pixels.
(18) The imaging element according to the above (16) or (17),
wherein the sensitivity is a sensitivity defined according to a wavelength component of light transmitted through a color filter provided for each of the plurality of pixels.
(19) The imaging element according to the above (16) or (17),
wherein the trench light-shielding portion provided between adjacent pixels among the plurality of pixels has
a width defined according to a difference in sensitivity between the adjacent pixels.
(20) An electronic device comprising:
an imaging element including a plurality of pixels arranged adjacent to each other, and including a trench light-shielding portion provided around each of the plurality of pixels,
the trench light-shielding portion being provided without a gap around a first pixel among the plurality of pixels, the trench light-shielding portion being provided around a second pixel adjacent to the first pixel such that the trench light-shielding portion provided around the second pixel is spaced apart from the trench light-shielding portion provided around the first pixel;
a signal processing unit that executes signal processing on a pixel signal read from the imaging element and generates image data by the signal processing; and
a storage unit that stores the image data generated by the signal processing unit.
(21) An imaging element comprising:
a first pixel;
a second pixel arranged adjacent to the first pixel;
a trench light-shielding portion provided around each of the first pixel and the second pixel; and
a light-shielding wall embedded in a depth direction of a trench at least at a first boundary between the first pixel and the second pixel of the trench light-shielding portion,
wherein the light-shielding wall is formed to be embedded in the first boundary at a position closer to a direction of the second pixel.
(22) The imaging element according to the above (21),
wherein the first pixel is a pixel having higher sensitivity compared to the second pixel.
(23) The imaging element according to the above (22),
wherein an area of a light receiving surface of the first pixel is larger than an area of a light receiving surface of the second pixel, and
the sensitivity is sensitivity defined according to a size of an area of a light receiving surface of each of the first pixel and the second pixel.
(24) The imaging element according to any one of the above (21) to (23),
wherein the trench light-shielding portion is formed such that a thickness of a first portion in which the light-shielding wall is embedded is thicker than a thickness of a second portion in which the light-shielding wall is not embedded and that the first portion protrudes less, onto the first pixel side, as compared with the second portion.
(25) The imaging element according to the above (22),
wherein the light-shielding wall includes overlaps over a position of the second portion, the position being at an extension of a second pixel-side outer edge of the second portion.
(26) The imaging element according to any one of the above (21) to (25),
wherein the light-shielding wall does not protrude to the first pixel side at the first boundary and does not protrude from the trench light-shielding portion.
(27) The imaging element according to any one of the above (21) to (26),
wherein the light-shielding wall is provided on an entire circumference of the second pixel.
(28) The imaging element according to the above (27),
wherein the light-shielding wall is further provided on a second boundary between the first pixel and the another first pixel adjacent to the first pixel, the light-shielding wall being provided with a space from the another light-shielding wall.
(29) The imaging element according to the above (27),
wherein the light-shielding wall is further provided on an entire circumference of the first pixel.
(30) The imaging element according to any one of the above (21) to (29),
further comprising an inter-pixel light-shielding portion provided around a light receiving surface of each of the first pixel and the second pixel.
(31) The imaging element according to the above (30),
wherein the inter-pixel light-shielding portion is provided symmetrically with respect to a pixel boundary related to at least one of the first pixel and the second pixel.
(32) The imaging element according to the above (30),
wherein the inter-pixel light-shielding portion is provided asymmetrically with respect to a pixel boundary related to at least one of the first pixel and the second pixel.
(33) The imaging element according to any one of the above (21) to (29),
further comprising a waveguide provided between an optical filter provided on a light receiving surface of each of the first pixel and the second pixel and the another optical filter.
(34) The imaging element according to the above (33),
further comprising an inter-pixel light-shielding portion provided at least in a part of a circumference of a light receiving surface of each of the first pixel and the second pixel,
wherein the inter-pixel light-shielding portion and the waveguide are provided in combination in at least a part of a circumference of each of the first pixel and the second pixel.
(35) The imaging element according to the above (34),
wherein the waveguide is provided around the second pixel, and
the inter-pixel light-shielding portion is provided at a boundary where the first pixels are adjacent to each other.
(36) An electronic device comprising:
an imaging element;
the imaging element including
a first pixel,
a second pixel disposed adjacent to the first pixel, a trench light-shielding portion provided around each of the first pixel and the second pixel, and a light-shielding wall embedded in at least a first boundary between the first pixel and the second pixel of the trench light-shielding portion in a depth direction of a trench, the light-shielding wall being formed to be embedded in the first boundary at a position closer to a direction of the second pixel;

a signal processing unit that executes signal processing on a pixel signal read from the imaging element and generates image data by the signal processing; and a storage unit that stores the image data generated by the signal processing unit.

REFERENCE SIGNS LIST

10 CMOS IMAGE SENSOR
11 PIXEL ARRAY UNIT
181, 181-1, 181-2, 181-3, 181-4, 181-5, 181-6, 181-7, 351 INTER-PIXEL LIGHT-SHIELDING PORTION
300, 300a, 300b, 300c, 300d, $300R_1$, $300R_2$, $300G_1$, $300G_2$, $300B_1$, $300B_2$ HIGH-SENSITIVITY PIXEL
301, 301a, 301b, 301c, 301d, $301R_1$, $301G_1$, $301G_3$, $301B_1$ LOW-SENSITIVITY PIXEL
302, 302a, 302b, 302c, 302d ACCUMULATION PORTION
303, 303a, 303b, 303c, 303bg, $303sml$, $303sml_1$, $303sml_2$, $303sml_3$, $303sml_{14}$ TRENCH LIGHT-SHIELDING PORTION
$303TR_1$ FIRST TRENCH LIGHT-SHIELDING PORTION
$303TR_2$ SECOND TRENCH LIGHT-SHIELDING PORTION
310, 311, 312, 3020, 3021 BOUNDARY
321 INTER-PIXEL LIGHT-SHIELDING FILM
350 LIGHT-SHIELDING WALL
360 WAVEGUIDE
361, 362 OPENING
3000, 3001, 3002, 3003 PIXEL

What is claimed is:

1. A light detecting device, comprising:
a first photoelectric conversion region disposed in a substrate;
a second photoelectric conversion region disposed in the substrate, wherein in a first cross-sectional view the second photoelectric conversion region is adjacent to the first photoelectric conversion region;
a third photoelectric conversion region disposed in the substrate, wherein the third photoelectric conversion region is adjacent to the first photoelectric conversion region in the first cross-sectional view;
a first trench disposed between the first photoelectric conversion region and the second photoelectric conversion region in the first cross-sectional view;
a second trench disposed between the first photoelectric conversion region and the third photoelectric conversion region in the first cross-sectional view;
a first light-blocking film disposed over the first trench in the first cross-sectional view; and
a second light-blocking film disposed over the second trench in the first cross-sectional view;
wherein an area of the first photoelectric conversion region is greater than an area of the second photoelectric conversion region in the first cross-sectional view,
wherein an area of the first photoelectric conversion region is greater than an area of the third photoelectric conversion region in the first cross-sectional view,
wherein a center portion of the first light-blocking film is disposed between a center portion of the first photoelectric conversion region and a center portion of the first trench in the first cross-sectional view, and
wherein a center portion of the second light-blocking film is disposed between the center portion of the first photoelectric conversion region and a center portion of the second trench in the first cross-sectional view.

2. The light detecting device of claim 1, further comprising:
a fourth photoelectric conversion region disposed in the substrate, wherein the first photoelectric conversion region is adjacent to the fourth photoelectric conversion region in a second cross-sectional view, and wherein the second photoelectric conversion region is adjacent to the fourth photoelectric conversion region in a third cross-sectional view;
a third trench disposed between the first photoelectric conversion region and the fourth photoelectric conversion region in the second cross-sectional view; and
a third light-blocking film disposed over the third trench in the second cross-sectional view,
wherein a center portion of the third light-blocking film is disposed over a center portion of the third trench in the second cross-sectional view.

3. The light detecting device of claim 2, further comprising:
a fourth trench disposed between the second photoelectric conversion region and the fourth photoelectric conversion region in the third cross-sectional view; and
a fourth light-blocking film disposed over the fourth trench in the third cross-sectional view,
wherein an area of the fourth photoelectric conversion region is greater than an area of the second photoelectric conversion region in the third cross-sectional view, and
wherein a center portion of the fourth light-blocking film is disposed between a center portion of the fourth photoelectric conversion region and a center portion of the fourth trench in the third cross-sectional view.

4. The light detecting device of claim 1, wherein an area of a light receiving surface of the first photoelectric conversion region is larger than an area of a light receiving surface of the second photoelectric conversion region.

5. The light detecting device of claim 4, wherein an area of a light receiving surface of the first photoelectric conversion region is larger than an area of a light receiving surface of the third photoelectric conversion region.

6. The light detecting device of claim 5, wherein a sensitivity of the first photoelectric conversion region is higher than a sensitivity of the second photoelectric conversion region, and wherein a sensitivity of the first photoelectric conversion region is higher than a sensitivity of the third photoelectric conversion region.

7. The light detecting device of claim 1, wherein no portion of the first light-blocking films extends over any portion of the second photoelectric conversion region.

8. The light detecting device of claim 1, wherein the first and second light-blocking films are formed from at least one of tungsten, titanium, titanium nitride, silicon oxide, and resin.

9. The light detecting device of claim 8, wherein the first and second trenches are trench light shielding portions formed by embedding a material in grooves.

10. The light detecting device of claim 9, wherein the material embedded in the grooves includes at least one of silicon oxide, tungsten, aluminum, titanium, titanium nitride, a magnesium-titanium alloy, a magnesium-nickel alloy, and tantalum oxide.

11. A light detecting device, comprising:
a first photoelectric conversion region disposed in a substrate;
a second photoelectric conversion region disposed in the substrate, wherein the second photoelectric conversion region is adjacent to the first photoelectric conversion region in a first cross-sectional view taken along a first line;
a third photoelectric conversion region disposed in the substrate, wherein the third photoelectric conversion region is adjacent to the first photoelectric conversion region in the first cross-sectional view;
a first light-blocking film disposed along a boundary between the first photoelectric conversion region and the second photoelectric conversion region in the first cross-sectional view; and
a second light-blocking film disposed along a boundary between the first photoelectric conversion region and the third photoelectric conversion region in the first cross-sectional view;
wherein the first, second, and third photoelectric conversion regions are disposed along the first line;
wherein a first portion of the first light-blocking film extends over a portion of the first photoelectric conversion region in the first cross-sectional view and has a first width,
wherein the first width is measured along the first line from a point corresponding to the boundary between the first photoelectric conversion region and the second photoelectric conversion region to an edge of an opening formed over the first photoelectric conversion region;
wherein a second portion of the first light-blocking film extends over a portion of the second photoelectric conversion region in the first cross-sectional view and has a second width,
wherein the second width is measured along the first line from the point corresponding to the boundary between the first photoelectric conversion region and the second photoelectric conversion region to an edge of an opening formed over the second photoelectric conversion region, and
wherein the first width is greater than the second width.

12. The light detecting device of claim 11, wherein a first portion of the second light-blocking film extends over a portion of the first photoelectric conversion region in the first cross-sectional view and has a third width,
wherein the third width is measured along the first line from a point corresponding to the boundary between the first photoelectric conversion region and the third photoelectric conversion region to an edge of an opening formed over the first photoelectric conversion region;
wherein a second portion of the second light-blocking film extends over a portion of the third photoelectric conversion region in the first cross-sectional view and has a fourth width,
wherein the fourth width is measured along the first line from the point corresponding to the boundary between the first photoelectric conversion region and the third photoelectric conversion region to an edge of an opening formed over the third photoelectric conversion region, and
wherein the third width is greater than the fourth width.

13. The light detecting device of claim 12, further comprising:
a fourth photoelectric conversion region disposed in the substrate, wherein the first photoelectric conversion region is adjacent to the fourth photoelectric conversion region in a second cross-sectional view taken along a second line, and wherein the second photoelectric conversion region is adjacent to the fourth photoelectric conversion region in a third cross-sectional view taken along a third line; and
a third light-blocking film disposed along a boundary between the first photoelectric conversion region and the fourth photoelectric conversion region in the second cross-sectional view, wherein a center line of the third light-blocking film is disposed over the boundary between the first photoelectric conversion region and the fourth photoelectric conversion region in the second cross-sectional view.

14. The light detecting device of claim 13, further comprising:
a fourth light-blocking film disposed along a boundary between the second photoelectric conversion region and the fourth photoelectric conversion region in the third cross-sectional view,
wherein a first portion of the fourth light-blocking film extends over a portion of the fourth photoelectric conversion portion in the third cross-sectional view and has a third width,
wherein the third width is measured along the third line from a point corresponding to the boundary between the second photoelectric conversion region and the fourth photoelectric conversion region to an edge of an opening formed over the fourth photoelectric conversion region;
wherein a second portion of the fourth light-blocking film extends over a portion of the second photoelectric conversion region in the third cross-sectional view and has a fourth width,
wherein the fourth width is measured along the third line from the point corresponding to the boundary between the second photoelectric conversion region and the fourth photoelectric conversion region to an edge of an opening formed over the second photoelectric conversion region, and
wherein the third width is greater than the fourth width.

15. The light detecting device of claim 11, wherein an area of a light receiving surface of the first photoelectric conversion region is larger than an area of a light receiving surface of the second photoelectric conversion region.

16. The light detecting device of claim 15, wherein an area of a light receiving surface of the first photoelectric conversion region is larger than an area of a light receiving surface of the third photoelectric conversion region.

17. The light detecting device of claim 16, wherein a sensitivity of the first photoelectric conversion region is higher than a sensitivity of the second photoelectric conversion region, and wherein a sensitivity of the first photoelectric conversion region is higher than a sensitivity of the third photoelectric conversion region.

18. The light detecting device of claim 14, wherein an area of a light receiving surface of the first photoelectric conversion region is larger than an area of a light receiving surface of the second photoelectric conversion region, wherein the area of a light receiving surface of the first photoelectric conversion region is larger than an area of a light receiving surface of the third photoelectric conversion region, and wherein the area of a light receiving surface of the first photoelectric conversion region is equal to an area of a light receiving surface of the fourth photoelectric conversion region.

19. The light detecting device of claim 14, wherein the first width is equal to the third width, and wherein the second width is equal to the fourth width.

20. The light detecting device of claim 11, wherein the first and second light-blocking films are formed from at least one of tungsten, titanium, titanium nitride, silicon oxide, and resin.

\* \* \* \* \*